United States Patent
Giboney

(10) Patent No.: US 8,952,678 B2
(45) Date of Patent: Feb. 10, 2015

(54) GAP-MODE WAVEGUIDE

(76) Inventor: Kirk S. Giboney, Santa Rosa, CA (US)

( * ) Notice: Subject to any disclaimer, the term of this patent is extended or adjusted under 35 U.S.C. 154(b) by 466 days.

(21) Appl. No.: 13/301,391

(22) Filed: Nov. 21, 2011

(65) Prior Publication Data

US 2012/0243823 A1 Sep. 27, 2012

Related U.S. Application Data

(60) Provisional application No. 61/466,343, filed on Mar. 22, 2011.

(51) Int. Cl.
*G01R 1/24* (2006.01)
*H01P 3/123* (2006.01)
*H01P 1/04* (2006.01)
*H01P 1/02* (2006.01)
*H01P 1/165* (2006.01)
*H01P 5/02* (2006.01)
*H01P 1/162* (2006.01)

(52) U.S. Cl.
CPC .............. *H01P 1/162* (2013.01); *H01P 1/042* (2013.01); *H01P 1/02* (2013.01); *H01P 1/165* (2013.01); *H01P 5/024* (2013.01); *G01R 1/24* (2013.01); *H01P 3/123* (2013.01)
USPC .............. 324/95; 333/21 A; 333/34; 333/248; 333/249; 333/251; 333/254

(58) Field of Classification Search
CPC ......... H01P 1/123; H01P 3/123; H01P 1/042; H01P 1/02; H01P 1/165; H01P 5/024; G01R 1/24
USPC ...... 333/22 R, 81 B, 157, 208, 239, 248, 251, 333/211, 249, 254, 255, 21 A, 34; 324/95
See application file for complete search history.

(56) References Cited

U.S. PATENT DOCUMENTS 2,774,945 A  12/1956  Miller
2,849,696 A   8/1958  Miller
(Continued)

OTHER PUBLICATIONS

Montgomery, "On the Complete Eigenvalue Solution of Ridged Waveguide," IEEE Transactions on Microwave Theory and Techniques, vol. MTT-19, No. 6, pp. 547-555, Jun. 1971.
(Continued)

*Primary Examiner* — Benny Lee
*Assistant Examiner* — Jorge Salazar, Jr.

(57) ABSTRACT

In a gap-mode waveguide embodiment, an interior gap in a tubular waveguide principally condenses a dominant gap mode near the interior gap, and an absorber dissipates electromagnetic energy away from the gap mode. In this manner, the gap mode may dissipate relatively little power in the absorber compared to other modes and propagate with lesser attenuation than all other modes. A gap mode launched into a gap-mode waveguide may provide for low-loss, low-dispersion propagation of signals over a bandwidth including a multimode range of the waveguide. Gap-mode waveguide embodiments of various forms may be used to build guided-wave circuits covering broad bandwidths extending to terahertz frequencies.

35 Claims, 27 Drawing Sheets

(56) References Cited

U.S. PATENT DOCUMENTS

| | | | |
|---|---|---|---|
| 2,981,906 A | | 4/1961 | Turner |
| 3,016,503 A | | 1/1962 | Pierce |
| 3,543,199 A | | 11/1970 | Quine |
| 3,546,635 A | * | 12/1970 | Quine et al. ............... 333/21 R |
| 3,732,511 A | | 5/1973 | Den |
| 3,835,423 A | | 9/1974 | Parisi |
| 4,060,778 A | * | 11/1977 | Hefni et al. ................. 333/211 |
| 4,270,106 A | | 5/1981 | Woermbke |
| 4,344,053 A | | 8/1982 | Anderson |
| 4,978,934 A | | 12/1990 | Saad |
| 4,992,762 A | | 2/1991 | Godshalk |
| 5,030,935 A | | 7/1991 | Williams |
| 5,225,796 A | | 7/1993 | Williams |
| 6,797,401 B2 | | 9/2004 | Herron |
| 6,870,449 B2 | | 3/2005 | Kitamori |
| 7,136,008 B2 | | 11/2006 | Aisenbrey |
| 7,218,266 B2 | | 5/2007 | Fujieda |
| 7,283,019 B2 | | 10/2007 | Castiglione |
| 7,342,470 B2 | * | 3/2008 | Bassali ........................ 333/219 |
| 7,531,803 B2 | | 5/2009 | Mittleman |
| 2004/0020674 A1 | | 2/2004 | McFadden |
| 2007/0052575 A1 | | 3/2007 | Nakagomi |
| 2011/0114856 A1 | | 5/2011 | Cooke |

OTHER PUBLICATIONS

Chen, et al., "Modal Characteristics of Quadruple-Ridged Circular and Square Waveguides," IEEE Transactions on Microwave Theory and Techniques, vol. MTT-22, No. 8, pp. 801-804, Aug. 1974.

Baharlou, Patent Cooperation Treaty International Preliminary Report on Patentability, International Application No. PCT/US2012/025204, International Bureau of WIPO, Sep. 24, 2013.

Kosugi, et al., "MM-Wave Long-Range Wireless Systems," IEEE Microwave Magazine, vol. 10, No. 2, pp. 68-76, Apr. 2009. See Fig. 8, p. 73 and second paragraph on p. 74, which refers to Fig. 8.

Helszajn, Ridge Waveguides and Passive Microwave Components. London: The Institution of Electrical Engineers, 2000. See Chapter 1; Fig. 5.8, p. 72; Fig. 7.1, p. 84; Fig. 7.10, p. 96; Fig. 9.15, p. 128.

Mendis, et al., "THz Interconnect With Low-Loss and Low-Group Velocity Dispersion," IEEE Microwave and Wireless Components Letters, vol. 11, No. 11, pp. 444-446 Nov. 2001.

Lee, Principles of Terahertz Science and Technology. New York, NY: Springer, 2009. See Section 5.4.

Ridler, et al., "IEEE P1785: A New Standard for Waveguide Above 110 GHz," Microwave Journal, vol. 54, No. 3, pp. 20-, Mar. 2011 supplement. See "Waveguide Interfaces," section, and Figs. 1 & 2.

Giboney, et al., Inventorship Statement, Dec. 21, 2011.

\* cited by examiner

GAP-MODE WAVEGUIDE

CROSS-REFERENCES TO RELATED APPLICATIONS

This application claims the benefit of U.S. Provisional Patent Application Ser. No. 61/466,343, filed 2011 Mar. 22, by the present inventor.

DESCRIPTION

Background Art

The background art discussed in this section includes information disclosed under 37 CFR §1.97 and §1.98.

Existing and proposed terahertz waveguide solutions are inadequate for many possible applications. Dominant mode loss of metallic tubular and multiconductor waveguides becomes very large as dimensions are scaled for single-mode operation at terahertz frequencies. Dielectric waveguides of practical size do not support a low-loss, low-dispersion mode over broad bandwidths in the terahertz frequency range. While some prior art multimode and mode-selective waveguides have offered promise of improvements in some aspects, they have failed to deliver a satisfactory combination of attributes for many practical applications.

SUMMARY OF INVENTION

Technical Problem

What is needed is a waveguide type that operates within the frequency range from 1 GHz to 10 THz, and provides for a combination of several or more of the following:
a) operational bandwidth greater than one octave;
b) low-loss signal propagation;
c) low-dispersion signal propagation;
d) low-loss, low-dispersion turns or bends, twists, and tapers;
e) compact size in relation to its lowest operating frequency;
f) designability for field patterns, including those affording efficient coupling to other common waveguide types;
g) characteristic impedance that is relatively constant with frequency and of a value that facilitates broadband, low-loss connections with microwave and millimeter-wave devices;
h) an ability to transform or transmute the fields with distance;
i) coupled-mode devices such as directional couplers;
j) interchangeability with other types of waveguides;
k) low-loss and convenient interface, enabling readily assembled waveguide circuits;
l) high electromagnetic shielding effectiveness;
m) interaction of electromagnetic waves with materials or devices in the waveguide;
n) access to the electromagnetic field region of the waveguide;
o) high breakdown field;
p) high thermal conductivity for heat dissipation;
q) mechanical support;
r) reasonable fabrication costs; and
s) performance and high reliability over a large range of environmental conditions, including temperature, humidity, pressure, mechanical stress, shock, and vibration.

Solution to Problem

In a gap-mode waveguide embodiment, an "interior gap" in a tubular waveguide principally condenses a dominant mode, called a "gap mode," near the interior gap. An absorber located away from the gap mode has a surface that faces the interior region. The absorber attenuates other modes more than the gap mode. In this manner, the gap mode may dissipate relatively little power in the absorber compared to other modes and propagate with lesser attenuation than all other modes.

Intermodal distortion effects such as intermodal dispersion may be reduced, and the gap mode launched into the gap-mode waveguide may provide for low-loss, low-dispersion propagation of signals over a bandwidth including a multimode range of the waveguide. Gap-mode waveguide embodiments of various forms may be used to build guided-wave circuits covering broad bandwidths extending to terahertz frequencies.

The interior gap of an embodiment is formed between proximate portions of the interior border, or walls, of the tubular waveguide, and may be considered to be a narrowing of the interior region of the tubular waveguide. An absorber may form a part of the waveguide or it may be a separate structure. In particular embodiments, the absorber may be formed by an electromagnetic absorbing wall of the tubular waveguide. Embodiments may also employ separate or discrete absorber structures or combinations of absorber types for the absorber.

The size and shape of the interior region, including the size, shape, and positioning of the interior gap, and the configuration of the absorber, determine the multimodal propagation characteristics, including the operational bandwidth. A lower frequency limit of the operational bandwidth may be determined relative to the cutoff frequency of the gap mode.

Other modes may also propagate over a portion of the operational bandwidth but have greater attenuation than the gap mode. Above a certain frequency, one or more of the other modes may become more tightly concentrated away from the absorber as frequency increases. Consequently, at sufficiently high frequencies, the attenuations of certain other modes may decrease with increasing frequency. An upper characteristic frequency of the operational bandwidth occurs at the frequency where the attenuation of the lowest loss of the other modes becomes less than the attenuation of the gap mode.

The gap mode is more strongly guided transverse to the interior gap, in the direction of the gap-mode principal electric-field polarization, than it is in the orthogonal cross-sectional direction. This characteristic informs embodiments of gap-mode waveguide, including a bend, providing for a change of gap-mode propagation direction; a twist, providing for a rotation of gap-mode polarization; a taper, providing for a change in size, shape, or propagation characteristics; or an aperture, providing for low-loss access to the waveguide interior region. For example, a bend embodiment in the gap-mode electric-field plane may have significantly lower gap-mode loss than a bend embodiment in the orthogonal plane.

Embodiments of gap-mode waveguide may support multiple gap modes. For example, a gap-mode waveguide embodiment having two interior gaps may support two gap modes. Each of the two gap modes may propagate with lesser attenuation than the other modes over an operational bandwidth.

Advantageous Effects of Invention

One or more embodiments of gap-mode waveguide operate within the frequency range from 1 GHz to 10 THz, and afford several or more of the following advantageous attributes:

a) Operational bandwidth may be greater than one octave.
b) Gap-mode attenuation at terahertz frequencies may be lower than corresponding losses of single-mode tubular metallic and single-mode multiconductor waveguides.
c) A terahertz-bandwidth waveform launched in a gap mode may propagate with relatively low dispersion, affording good-fidelity terahertz-bandwidth waveform transmission.
d) Gap-mode waveguide bends, twists, and tapers may have relatively low gap-mode loss and dispersion.
e) Gap-mode waveguide transverse dimensions may be small in relation to the wavelength corresponding to the lower frequency limit of the operational bandwidth, allowing compact circuit assemblies.
f) A gap mode may be designed to have a uniform electric field in a region, which may allow good linear dynamic range and may be well-suited to some types of nonlinear operations or interactions with anisotropic materials. Alternatively, a gap mode may be designed to have a concentrated field in a region, which may afford high intensity or coupling to small regions. A gap mode may be designed to have other characteristics, such as a radial-section field pattern intended for coupling to structures having radial geometry. Gap-mode electromagnetic fields may be designed to resemble modes of other waveguide types such as microstrip, parallel-plate, and coplanar, which may facilitate coupling between gap-mode waveguide and other waveguides and devices.
g) Effective characteristic impedance may be designed within a range of values, including those of microwave and millimeter-wave waveguides and devices, and may be relatively constant over the operational bandwidth.
h) Gap-mode waveguide and the associated modal fields may be transformed or transmuted with distance, providing for changes in propagation characteristics as may be useful for circuit functions, modal filtering, or coupling.
i) Multiple interior gaps may support multiple gap modes that may form the basis for directional couplers and other coupled-mode devices.
j) A gap-mode waveguide or a gap-mode waveguide circuit may be designed to replace one or more other types of waveguides or circuits in an application.
k) Gap-mode waveguide joints may be readily assembled and provide robust connections with relatively low loss, facilitating expedient assembly of various circuits.
l) A gap-mode waveguide may effectively confine modal fields, preventing them from interacting or causing interference outside the waveguide. Conversely, the gap-mode waveguide may shield the interior region from waves of exterior sources.
m) A gap-mode waveguide may provide for interaction of the fields with materials or devices inside the waveguide, altering the modal propagation characteristics. Gap-mode measurements may have relatively high dynamic range by confining a measurement sample inside the waveguide.
n) Apertures may provide access to the interior region of a gap-mode waveguide without unacceptable effect on the gap-mode wave propagation characteristics.
o) A relatively high breakdown field, high velocity, and low loss may be enabled by evacuating a gap-mode waveguide.
p) Relatively high power handling may be provided by using thermally conductive materials in the construction of a gap-mode waveguide.
q) A gap-mode waveguide may provide a mechanically stiff structure or a flexible structure that may be easily bent by a user in one or more planes, depending on construction materials and wall design.
r) A gap-mode waveguide may be economically fabricated by a combination of common materials and process steps.
s) A gap-mode waveguide may be constructed that is robust and performs with relatively high reliability over a large range of environmental conditions, including temperature, humidity, pressure, mechanical stress, shock, and vibration.

The foregoing has summarized solution to problem and advantageous effects. The following descriptions, drawings, and claims will further illuminate the solution and one or more advantageous effects of one or more aspects.

BRIEF DESCRIPTION OF DRAWINGS

The present teachings may be more readily understood from the following detailed description with reference to the accompanying drawings. The drawing figures may not be drawn to scale, and small features of non-essential functional consequence, such as some corner radii, for example, may not be depicted. Electric-field line plots are approximate and depict the electric fields qualitatively, only. Wherever practical, like reference numerals refer to like features.

DESCRIPTION OF EMBODIMENTS

Embodiments are described with reference to the drawings in the following examples, by which the invention may be better understood. The terms left, right, up, down, upper, lower, upward, downward, vertical, horizontal, above, below, width, height, and similar terms in reference to the embodiment drawings are intended to convey to the reader locations, directions, or dimensions on the drawings and do not imply any preferred orientation of the structures represented.
Prior-Art Ridge Waveguide Example (FIGS. 1-2B)

Figure 1:
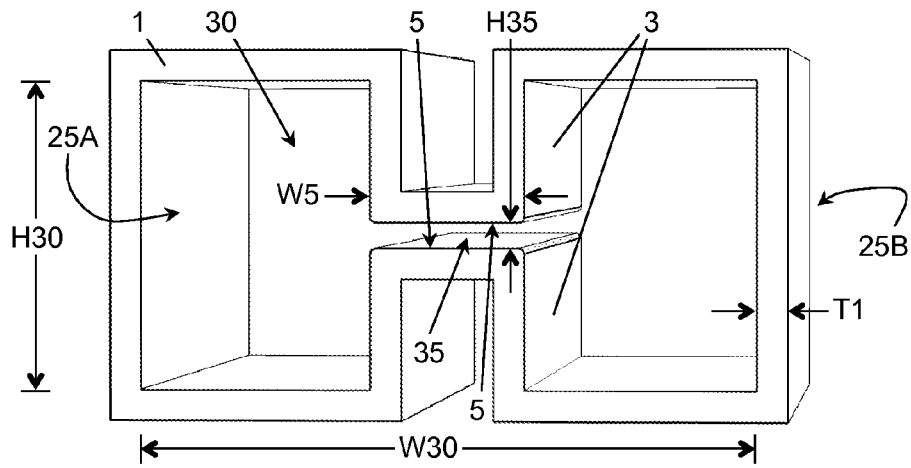
FIG. 1 is a perspective view of a prior-art metallic ridge waveguide.

An embodiment of prior-art metallic ridge waveguide, simply called "ridge waveguide" in this specification and the attendant claims, is illustrated in FIG. 1. (The term "metallic" distinguishes the type of ridge waveguide discussed herein from prior-art dielectric ridge waveguide.) In this specification and the attendant claims, ridge waveguide is a type of conductive tubular electromagnetic waveguide.

Referring to FIG. 1, a conductor wall 1 forms the perimeter or boundary of the prior-art ridge waveguide, demarcating an interior region 30. Portions of the conductor wall 1 extend inward into the interior region 30, forming ridges 3. Where the ridges 3 face each other, an interior gap 35 in the interior region 30 is formed between conductor wall proximate interior surface portions 5. The conductor wall proximate interior surface portions 5 are approximately flat, parallel, equal in width, and aligned. The corners of the conductor wall 1 that are convex in the interior region 30 have non-essential radii to reduce concentrations of the proximate electric field and power. Ports, 25A and 25B, bound the ends of the waveguide. The conductor wall 1 is composed of aluminum metal, having conductivity of approximately $4 \times 10^7$ Siemens/meter (S/m), and is sufficiently thick to accommodate at least one skin depth at the lowest operational frequency. The interior region 30, including the interior gap 35, is vacuum.

The interior region width and height, W30 and H30, are 6 mm and 3 mm. The interior gap height H35 is 0.25 mm, and the interior gap 35 is centered horizontally within the interior region 30. The conductor wall gap-facing width W5 is 1.5 mm, including the 0.05-mm corner radii. The conductor wall thickness T1 is about 0.3 mm. The length of the waveguide in the propagation direction is 1 m. The ports, 25A and 25B, are substantially planar and orthogonal to the propagation direction. As described, the waveguide supports a single-mode range from 10 GHz to 50 GHz, and the dominant mode has an effective characteristic impedance that is reasonably close to 50 ohms, real, above 20 GHz.

Prior-art ridge waveguide is typically used in its single-mode range, where only the dominant mode(s) propagates. The interior gap 35 provides for dominant mode characteristics that have found commercial utility, including: an effective characteristic impedance that may be designed in a range commonly used in microwave circuits; lower cutoff frequency compared to comparable size rectangular waveguide;

and a uniform, parallel-plate-like field pattern that facilitates interfacing with common transmission lines and components. The dominant mode maintains these characteristics far into the multimode range, but they may not be fully exploited due to multimode degradations including distortion from intermodal coupling and intermodal dispersion.

Figure 2A:
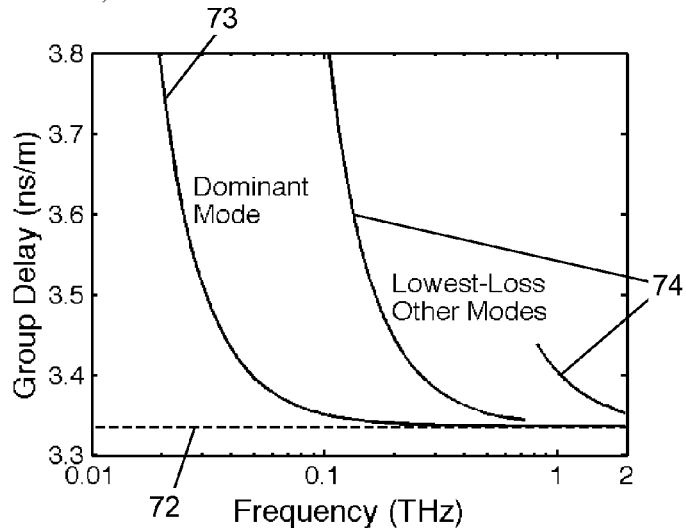
FIG. 2A is a plot of dominant-mode and lowest-loss other modes group delays versus frequency for a prior-art metallic ridge waveguide.
Figure 2B:
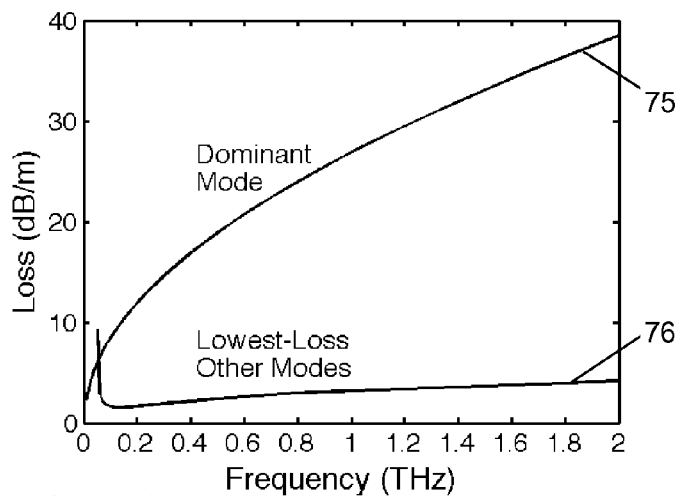
FIG. 2B is a plot of dominant-mode and lowest-loss other modes losses versus frequency for a prior-art metallic ridge waveguide.

Referring to FIGS. 2A and 2B, the group delay and attenuation or loss of the dominant mode and the lowest-loss other modes (LLO modes) of the present example prior-art ridge waveguide are plotted. As used in this specification and the attendant claims, the term "lowest-loss other modes" is defined as a non-dominant mode or a composite of non-dominant modes as a function of frequency having the least loss or attenuation of all non-dominant modes at each frequency. FIG. 2A shows that a dominant-mode group delay trace 73 decreases to near a speed of light limit trace 72 over a broad frequency range extending to 2 THz. In the frequency range where the dominant-mode group delay trace 73 has a relatively small group delay, lowest-loss other modes group delay traces 74 have relatively large group delays.

FIG. 2B shows a dominant-mode loss trace 75 that has attenuation less than 39 dB/m up to 2 THz. However, a lowest-loss other modes loss trace 76 shows attenuation less than 10 dB/m up to 2 THz, and about 4 dB/m at 2 THz. Significantly, the lowest-loss other modes loss trace 76 shows attenuation much less than that of the dominant-mode loss trace 75 except near the LLO-modes lowest cutoff frequency just above 50 GHz, where the LLO-mode is not substantially propagating.

Power in the described prior-art ridge waveguide may couple between the dominant mode and LLO modes and create significant intermodal dispersion. Imperfections, bends, or other perturbations of the prior-art ridge waveguide may tend to couple modes. Power in a propagating LLO mode may be attenuated less, effectively growing with propagation distance in relation to power in the dominant mode. Thus, a small power coupling may produce a large intermodal dispersion effect in prior-art ridge waveguide operated in a multimode range. Avoidance of this effect is a primary motivation for the common practice of using waveguides in their single-mode range.

The foregoing discussion of prior art is intended to illuminate some limitations that embodiments of the present invention overcome. It is respectfully submitted that the prior art described herein or in the public record does not disclose, teach, suggest, show, or otherwise render obvious, either singly or when considered in combination, the invention described and claimed herein.

Gap-Mode Waveguide Embodiment Examples

According to aspects of the present invention, a gap mode propagates with lesser attenuation than do all other propagating modes substantially above the multimode cutoff. As used in this specification and the attendant claims, "multimode cutoff frequency" is defined as the lowest cutoff frequency of all non-dominant modes. As used in this specification and the attendant claims, a "multimode frequency range" is defined as a frequency range wholly above the multimode cutoff frequency.

A gap-mode waveguide is a type of conductive tubular electromagnetic waveguide. As used in this specification and the attendant claims, a "conductive tubular electromagnetic waveguide" is defined as having a wall or set of walls, an interior region within the wall or walls, and an exterior, the wall or walls being of sufficient conductivity and thickness for the purpose of guiding electromagnetic wave modes primarily within the interior region by the wall or walls. Conductive tubular electromagnetic waveguides include waveguide types such as ridge waveguide and common rectangular and circular hollow metallic waveguides.

As used in this specification and the attendant claims, an "interior gap" is defined as a gap between proximate interior surface portions of at least one conductor wall along the propagation direction and in the interior region of a conductive tubular electromagnetic waveguide for the purpose of condensing at least one gap mode. As used in this specification and the attendant claims, a "gap mode" is defined as a dominant mode that at least one interior gap of a conductive tubular electromagnetic waveguide condenses. As used in this specification and the attendant claims, an absorber is defined as an electromagnetic dissipator distributed in the propagation direction of a conductive tubular electromagnetic waveguide, having an absorber surface adjacent the interior region, for the purpose of selectively attenuating modes.

Embodiments of the invention are described in detail in the following examples. The detailed explanations are sufficient to enable one of ordinary skill in the art to design, configure, fabricate, and use the invention in its various forms, both explicit and implicit. A gap-mode waveguide embodiment according to the invention, described in EXAMPLE 8, provides a reasonable comparison to the prior-art ridge waveguide embodiment in the PRIOR-ART RIDGE WAVEGUIDE EXAMPLE, above.

EXAMPLE 1

FIGS. 3-9C

Figure 3:
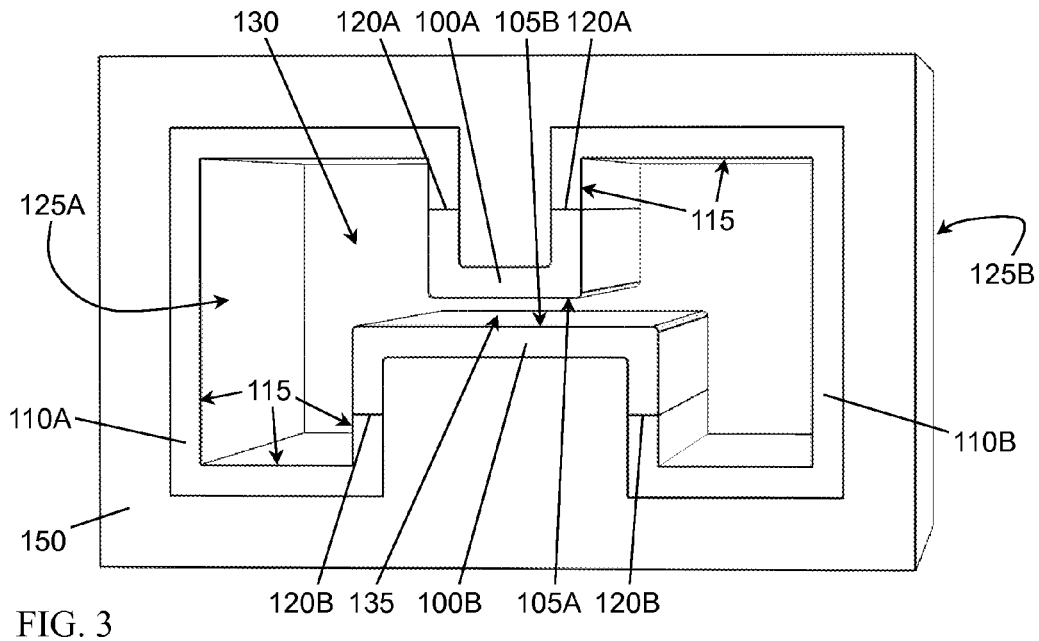
FIG. 3 is a perspective view of a gap-mode waveguide embodiment having a microstrip-like gap mode according to EXAMPLE 1.
Figure 4A:
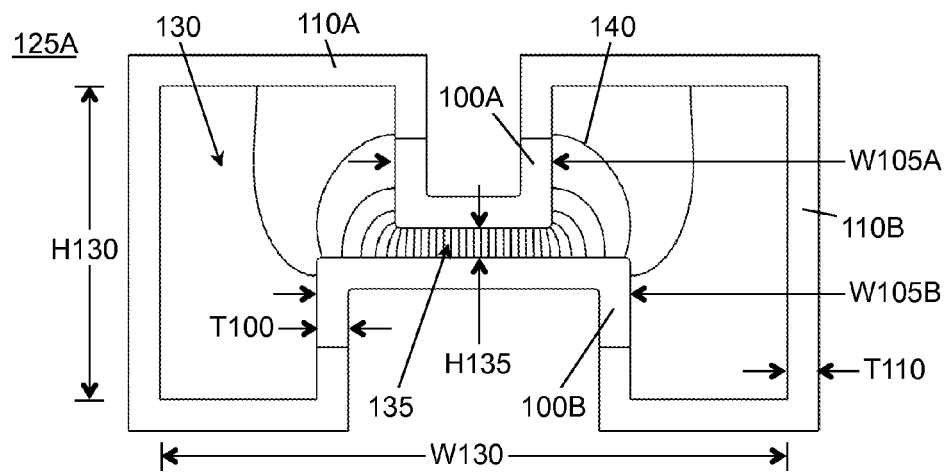
FIG. 4A is an end view of a gap-mode waveguide embodiment having a microstrip-like gap mode according to EXAMPLE 1, omitting the structural frame and showing gap-mode electric-field lines in the interior region.

A gap-mode waveguide embodiment having a microstrip-like gap mode is illustrated by perspective view in FIG. 3 and by an elevation or end view in FIG. 4A. Two conductor walls, 100A and 100B, and two absorber walls, 110A and 110B, form the sides of the tubular waveguide. An interior gap 135 in the interior region 130 is formed between conductor walls proximate interior surface portions, 105A and 105B. The absorber walls, 110A and 110B, include absorber walls interior surfaces 115 that are adjacent the interior region 130. Ports, 125A and 125B, bound the ends of the waveguide. The conductor walls proximate interior surface portions, 105A and 105B, have generally parallel interior surfaces bordering the interior gap 135 as necessary for the propagation characteristics to remain within specified tolerances. The upper conductor wall gap-facing width W105A is narrower than the lower conductor wall gap-facing width W105B. The corners of the conductor walls, 100A and 100B, that are convex in the interior region 130 have non-essential radii to reduce concentrations of the proximate electric field and power. The conductor walls thickness T100 and the absorber walls thickness T110 are preferably at least one skin depth at the multimode cutoff. An optional exterior mechanical support structure or structural frame 150 may provide additional mechanical support.

The conductor walls, 100A and 100B, have conductivity greater than the absorber walls, 110A and 110B, and preferably greater than $10^7$ S/m, so that gap-mode loss is relatively low. The conductivity may vary in practice due to limitations presented by conditions, such as temperature, or specifications, such as material strength, toughness, or inertness. Limiting the root-mean-square interior surface roughness, preferably to less than the skin depth at the operating bandwidth upper frequency, controls associated excess loss. Alternatively, the conductivity of the conductor walls, 100A and 100B, may be less than $10^7$ S/m in situations where greater loss may be tolerated, but generally not less than about $10^6$ S/m.

A conductor material that is transparent in a range of infrared, visible, and ultraviolet light may be useful where optoelectronic functions are employed. A conductor's conductivity may be electrically controlled, for example by field effect employing a gate. A conductor's conductivity may be optically controlled, for example by optically generating charge carriers.

Many suitable conductors are well-known in the art, including metals, alloys, semiconductors, doped semiconductors, superconductors, and organic conductors, or combinations thereof. The conductor walls, 100A and 100B, may be of multiple materials that may include nonconductors. Anisotropic conductors, including organic conductors, graphene, carbon nanotubes, and quantum-effect structures, may have specified conductivity in the direction of wave propagation. Anisotropic conductors may also be fabricated by structuring conductors and nonconductors, by alternate layer stacking, for example.

The absorber walls, 110A and 110B, serve as the absorber and may be of any material that dissipates electromagnetic energy over the bandwidth of interest. Such materials include resistors, lossy dielectrics, lossy magnetics, and metamaterials. Absorption over a broad bandwidth may be afforded by the use of resistor material.

Absorber walls, 110A and 110B, fabricated from resistor material or as resistors may be called resistor walls and may have conductivity in the range of $10^2$ to $10^5$ S/m, preferably about $10^4$ S/m. The conductivity of resistor walls should be less than about $10^{-2}$ times the conductivity of the conductor walls, 100A and 100B, in order to provide substantial mode discrimination.

Material properties may vary in space and time or among samples due to limitations presented by conditions, such as temperature, or other specifications, such as material strength, toughness, or inertness. Interior surface roughness may also contribute to the overall attenuation afforded. Material properties may be varied by design. For example, the resistivity of an absorber layer may be varied normal to its surface to alter the absorption characteristics versus angle of incidence. Alternatively, the absorption of an absorber may be spatially varied to provide greater or lesser attenuation of specific modes.

Commercially available absorber materials include iron-filled polymers and carbon-filled polymers, polymers including silicones, resins, plastics, and foams. Many suitable resistor materials are well-known in the art, including metals, metal alloys, amorphous carbon, carbon foam, semiconductors, doped semiconductors, organic conductors, and composite materials having conductive particles embedded in a relatively non-conductive matrix. Examples of composite materials that may be used as resistor material include ceramic-metal composites, also called cermets, and polymer matrix composites, such as carbon- or metal-filled polymers. Multiple particle types of differing conductivity may be combined in the ceramic, polymer, or other low conductivity matrix to produce the specified overall material conductivity.

An electromagnetic absorber material that is transparent in a range of infrared, visible, and ultraviolet light may be useful where optoelectronic functions are employed. Many semiconductors are transparent over a portion of the visible or infrared portion of the spectrum and may be doped to sufficient conductivity for use as absorber walls, 110A and 110B, or, in some cases, conductor walls, 100A and 100B. Such semiconductors include silicon, diamond, zinc sulfide, zinc selenide, indium phosphide, gallium arsenide, gallium nitride, and indium oxide. For example, indium tin oxide is commonly used as a transparent resistor or conductor material.

The conductivity of an absorber may be electrically controlled, for example by field effect employing a gate. An absorber may be optically controlled by optically modulating a material property such as complex permittivity, complex permeability, or conductivity. For example, conductivity or permittivity may be modulated by optically mediated generation, separation, or transport of charge carriers.

The absorber walls, 110A and 110B, may be anisotropic resistors that may have specified conductivity in the direction of wave propagation, including organic resistors, graphite, graphene, carbon nanotubes, and quantum-effect structures. Suitable anisotropic resistors may also be fabricated by structuring conductors or resistors and non-conductors, by alternate layer stacking, for example.

The conductor walls, 100A and 100B, and the absorber walls, 110A and 110B, may be separately formed and subsequently integrated into the waveguide structure or they may be formed on surfaces bordering the interior region 130. A conductor or absorber may be formed on a surface by depositing or coating from plasma, gas, vapor, liquid, or solid sources. For example, a conductor or absorber layer may be formed by coating a surface with liquid polymer matrix composite and then curing to a solid. In another example, conductor or absorber particles may be electrostatically deposited. In yet another example, a conductor or absorber layer may be formed by decomposition of a metal-organic gas, such as a hydrocarbon, onto a surface. Other conductor or absorber forming methods include vacuum vapor deposition, sputtering, and plasma decomposition.

Considerations for material characteristics of the conductor walls, 100A and 100B, and the absorber walls, 110A and 110B, include electrical conductivity, reactivity with materials that may be in contact, resistance to abrasion or wear, strength, elasticity, toughness, thermal expansion, corrosion resistance, moisture absorption, electric field breakdown, melting temperature, machinability, formability, and thermal conductivity. Parameters such as temperature affect these material characteristics. Availability and cost are also considerations.

The interior region 130 or portions thereof may be composed of any material or composition. The interior region 130 may contain vacuum, air, or any material or phase of matter, gas, liquid, solid, or plasma, that supports wave propagation over the distance of interest. The interior region 130 may contain a material that does not appreciably support wave propagation, as in a short or load, which reflect or absorb waves. Various purposes include supporting low-loss, low-dispersion electromagnetic wave propagation, altering, including amplification, of the electromagnetic wave propagation, measurement of the material properties, and exposure of the material to a guided electromagnetic wave. Low-loss and low-dispersion wave propagation may be achieved with vacuum in the interior region 130, but satisfactory performance may be achieved with dry nitrogen, air, or other gas, depending on application. Gain may be afforded by the use of materials such as appropriately excited ammonia gas.

Uniform or mixed or structured combinations of materials, including conductors, resistors, semiconductors, insulators, gain media, or structured materials, such as photonic bandgap or metamaterials, may be inserted into the interior region 130 to produce guided-wave circuit components that perform any of various circuit or circuit element functions, such as performed by capacitors, resistors, inductors, diodes, transistors, semiconductors devices, spectral filters, mode filters, attenuators, short circuits, or amplifiers. For example, a conductor or resistor material may be inserted into the interior region 130 to cause a reflection or attenuation of a guided wave. Such a circuit may function as a calibration standard for an instrument such as a spectrometer or network analyzer, for example.

Dielectric or resistor materials inserted into the interior region 130 may act similarly to shunt capacitors or resistors. Combinations of gap-mode waveguide sections containing different materials may be combined to assemble circuits that perform functions, including attenuating, amplifying, filtering, transforming, delaying, multiplying, mixing or other functions commonly performed by circuits.

Material or component response to a guided wave may be measured by inserting the material or component into the interior region 130 and performing transmission and reflection network measurements. Other responses to the guided wave, such as changes in temperature or energy conversion may be monitored in-situ. Transient or sustained changes in material or component properties due to exposure to the guided wave may be further evaluated by applying other tests, such as microscopy, spectroscopy, or radiation, chemical, mechanical, structural, or other analysis.

The conductor walls, 100A and 100B, and absorber walls, 110A and 110B, may or may not be thick enough to provide the prescribed mechanical properties such as resistance to bending or crushing. In an embodiment, the structural frame 150 may provide the prescribed mechanical properties and enable a lower overall waveguide cost. The structural frame 150 may be of any material having the prescribed mechanical properties. In an embodiment, the structural frame 150 may also have high thermal conductivity to dissipate heat. High thermal conductivity may be enabled through the use of high thermal conductivity materials and high thermal conductivity structures, such as heat pipes or fluid cooling channels. In an embodiment, the structural frame 150 may provide high electrical conductivity, affording higher waveguide conductivity and additional electromagnetic shielding. Considerations for material characteristics of the structural frame 150 include electrical conductivity, reactivity with materials that may be in contact, resistance to abrasion or wear, strength, elasticity, toughness, thermal expansion, corrosion resistance, moisture absorption, electric field breakdown, melting temperature, machinability, formability, and thermal conductivity. Parameters such as temperature affect these material characteristics. Availability and cost are also considerations.

The structural frame 150 may be formed in one or more pieces by machining, stamping, bending, extruding, casting, molding, additive manufacturing, ablating, etching, or any forming method or combination thereof known in the art that is suitable for the materials and structures employed. If fabricated in more than one piece, the structural frame 150 may then be assembled and fixed to form a tube by fastening, clamping, gluing, brazing, welding, thermal bonding, ultrasonic bonding, thermosonic bonding, diffusion bonding, or any assembly and fixing method or combination thereof known in the art that is suitable for the materials employed. The interior surfaces of the tube may be textured as prescribed by polishing, sanding, abrading, knurling or any surface finishing method or combination thereof known in the art that is suitable for the materials employed.

The conductor walls, 100A and 100B, and the absorber walls, 110A and 110B, may be formed individually or in any combination, with or without the structural frame 150, by machining, stamping, bending, extruding, casting, molding, insert molding, liquid coating, vapor depositing, electro-depositing, or any forming method or combination thereof known in the art that is suitable for the materials and structures employed. The interior surfaces of the conductor walls, 100A and 100B, and the absorber walls, 110A and 110B, may be textured as prescribed by polishing, laser processing, sanding, abrading, knurling or any surface finishing method or combination thereof known in the art that is suitable for the materials employed. If separate component parts result from prior fabrication steps, the component parts including the structural frame 150, conductor walls, 100A and 100B, and absorber walls, 110A and 110B, or combinations thereof may then be assembled and fixed to form the waveguide tube by fastening, clamping, gluing, brazing, welding, thermal bonding, ultrasonic bonding, thermosonic bonding, diffusion bonding, or any assembly and fixing method or combination thereof known in the art that is suitable for the materials employed.

The ends of a gap-mode waveguide section defining the ports should be prepared so that portions facilitating low perturbation of a gap mode fit closely when mated or joined with another gap-mode waveguide section or another component having an appropriately designed interface. Portions that need not fit closely may be determined according to principles described in the present example, below, and in EXAMPLE 17. The conductor walls proximate interior surface portions, 105A and 105B, preferably fit closely for good transmission of the gap mode across a joint. In an embodiment, ports, 125A and 125B, of a gap-mode waveguide are substantially planar and orthogonal to the propagation direction.

Gap-mode waveguide may be mated or joined to form combined paths defining circuits or portions thereof. Any method may be used that maintains a gap-mode waveguide section in alignment such that reflections and scattering are below a prescribed limit and specified transmission efficiency is achieved. A flange employing alignment dowel pins and holes, a ring-centered flange, or a plug-and-socket style interface, the uses of which in precision alignment and joining of circular, rectangular, and metallic ridge waveguides are well-known in the art, may be used to align and mate or join a gap-mode waveguide. Generally, the engaging reference features, such as alignment dowel pins and holes, may be pre-aligned to the conductor walls proximate interior surface portions, 105A and 105B. A flange may be aligned and through-mounted or socket-mounted and it may employ a gasket. A joint may be secured by the use of fasteners, such as bolts, collars, or by methods such as clamping, fusion, adhesion, brazing, soldering, or welding, or by other methods known to secure members.

Rectangular metallic waveguide interfaces address similar alignment and fixing needs as those of gap-mode waveguide. Methods of interfacing rectangular waveguides, such as those included in the Institute of Electrical and Electronics Engineers (IEEE) P1785 Standard for Rectangular Metallic Waveguides and Their Interfaces for Frequencies of 110 GHz and Above, currently under development, may be applied to or adapted for interfacing gap-mode waveguides. Means employed in fiber optic connectors, may in part or in whole be adapted for use in alignment and mating or joining of gap-mode waveguide.

Model calculations may provide suitable guidance in many of the various aspects of design. The waveguide modal fields and wave propagation characteristics, such as modal complex propagation constants and gap-mode complex effective characteristic impedance, may be calculated by solving the fundamental electromagnetic equations, or Maxwell's equations, for the waveguide structure and materials. The modal fields and wave propagation characteristics of all propagating modes may be readily calculated with the assistance of commercially available software.

Gap-mode waveguide may be designed and design tolerances may be established based on calculated propagation characteristics and model design variations. The boundary conditions are substantially defined by an interior layer of the conductor walls, 100A and 100B, and the absorber walls, 110A and 110B, extending a few skin depths in each, or by the wall thickness, whichever is lesser. Conductor walls, 100A and 100B, or absorber walls, 110A and 110B, of thickness greater than a few skin depths are considered electromagnetically thick. To the extent that the thickness of a portion of the conductor walls, 100A and 100B, or the absorber walls, 110A and 110B, is less than a few skin depths, the properties of the outside materials adjacent the portion increasingly affect the waveguide electromagnetic wave propagation characteristics.

Figure 4B:
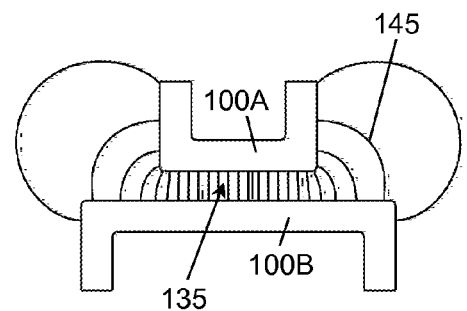
FIG. 4B is an end view of the two-conductor waveguide formed by only the conductor walls of the gap-mode waveguide embodiment having a microstrip-like gap mode according to EXAMPLE 1, showing TEM-mode electric-field lines.

FIG. 4A shows an end view at a port 125A of a gap-mode waveguide embodiment according to the present example, omitting the structural frame 150, together with gap-mode electric field lines 140. FIG. 4B shows an end view of the two-conductor waveguide formed by only the conductor walls, 100A and 100B, of the gap-mode waveguide in a uniform dielectric, together with isolated conductor walls TEM-mode electric field lines 145. The gap-mode electric field resembles the isolated conductor walls TEM-mode electric field more closely than does the electric field of any other mode of the gap-mode waveguide embodiment according to the present example. The gap mode roughly resembles the dominant mode of a microstrip waveguide, so it is termed a microstrip-like gap mode.

In cases where a gap-mode waveguide embodiment has two or more distinct conductor walls, as in the present example, the gap mode may have an electric field pattern that resembles that of a TEM mode of a two-conductor waveguide formed by only the conductor walls of the gap-mode waveguide and the interior medium. Such a resemblance may be quantified by calculating the overlap integral of a gap-mode waveguide mode and the TEM mode. A gap mode resembles its corresponding TEM mode and may be described according to the resemblance.

The relationship between the gap-mode electric field lines 140 and the configuration of the absorber walls, 110A and 110B, versus the conductor walls, 100A and 100B, affords insight into the interactions of the waveguide modes with the waveguide, and informs design of the modal propagation characteristics. The interior gap 135 principally condenses the gap mode, which is represented by the gap-mode electric field lines 140. Most of the energy of the gap mode is in or near the interior gap 135, and the conductor walls, 100A and 100B, largely guide the gap mode with relatively low loss. The upper conductor gap-facing width W105A and the interior gap height H135 may be greater than the shortest wavelength of the operational bandwidth, affording low-loss propagation of the gap mode.

Other propagating modes may not be as effectively condensed by the interior gap 135 as is the gap mode. In a gap-mode waveguide embodiment at some frequency in a multimode range, greater fractions of the energies of all other propagating modes may not be in or near the interior gap 135 as compared to the gap mode. In such case, the other propagating modes are guided more by the absorber walls, 110A and 110B, and suffer greater loss than the gap mode.

A preliminary design may proceed with the conductivity of all walls equal to that of the conductor walls, 100A and 100B, for the purpose of establishing preliminary waveguide shape, dimensions, and gap-mode propagation characteristics. The absorber walls, 110A and 110B, may then be initially configured. An initial arrangement may position the absorber walls, 110A and 110B, in regions away from the approximate gap-mode fields. Optimization may include iterations of refinements, which may be automated.

The configuration of the absorber walls, 110A and 110B, principally determines the attenuations of the modes. In this case, the configuration of the absorber walls, 110A and 110B, may be conveniently described by the absorber walls materials, the absorber walls thickness T110, the waveguide interior region 130 shape, and the locations of the conductor-absorber wall junctures, 120A and 120B, relative to the interior gap 135. When the conductor-absorber wall junctures, 120A and 120B, are very far from the interior gap 135, such that the extents of the absorber walls, 110A and 110B, are vanishingly small, the waveguide would be essentially composed only of conductor walls, 100A and 100B, like a conventional metallic tubular waveguide. The gap-mode attenuation would be low, but the LLO modes attenuation would generally be much lower over a broad bandwidth, similar to that described for the PRIOR-ART RIDGE WAVEGUIDE EXAMPLE.

As the conductor-absorber wall junctures, 120A and 120B, are moved closer to the interior gap 135 and the extents of the absorber walls, 110A and 110B, increase, the attenuation of the LLO modes may increase faster than does the attenuation of the gap mode. Continuing the expansion of the absorber walls, 110A and 110B, the attenuation of all propagating other modes may exceed the gap-mode attenuation, depending also on the materials and the waveguide interior region 130 shape. When the absorber walls, 110A and 110B, are configured in such a way that the gap mode propagates with lesser attenuation than do all other propagating modes substantially above the multimode cutoff, a gap-mode waveguide embodiment is realized.

The mode-discrimination ratio is a dimensionless quantity defined as the LLO-modes loss divided by the gap-mode loss, where the losses are expressed as attenuation constants in units of dB/m or nepers/m, for example. The mode-discrimination ratio gives a measure of the mode selectivity, by loss, of the waveguide. For example, a mode-discrimination ratio of two indicates that the attenuation constant of the LLO modes is twice the attenuation constant of the gap mode. It is generally preferable to transmit a gap-mode on a gap-mode waveguide embodiment at frequencies where the mode-discrimination ratio is greater than one. However, a gap-mode waveguide may offer significant advantages and be preferable over other waveguide types even at frequencies where the mode-discrimination ratio is less than one.

The gap-mode waveguide may be optimized for mode-discrimination ratio by adjusting the conductor-absorber wall junctures, 120A and 120B, locations relative to the interior gap 135. This may be accomplished as part of design calculations as described above. Continuing the progression of the configuration from where the mode-discrimination ratio just exceeds one may result in further increase in mode-discrimination ratio. A similar process may be employed to optimize for other characteristics or parameters. For example, the mode-discrimination ratio may be optimized versus conductivity of the absorber walls, 110A and 110B.

Beyond some configuration, as the conductor-absorber wall junctures, 120A and 120B, continue to approach the interior gap 135, the mode-discrimination ratio decreases. When the conductor-absorber wall junctures, 120A and 120B, are in the interior gap 135 and the extents of the conductor walls, 100A and 100B, are vanishingly small, the waveguide would be essentially composed only of absorber walls, 110A and 110B, resulting in high loss for all modes and a mode-discrimination ratio of less than one.

Thus, according to the above description, with reference to FIGS. 3 and 4A, a dominant mode may be propagated in a multimode range in a conductive tubular electromagnetic waveguide with lesser attenuation than all other propagating modes by condensing the gap mode by the interior gap 135, where the interior gap 135 is between the conductor walls proximate interior surface portions, 105A and 105B; and by dissipating electromagnetic energy in the absorber walls, 110A and 110B, away from the gap mode, as may be characterized by the gap-mode electric field lines 140. Stated differently, a dominant mode may be propagated in a lossy conductive tubular electromagnetic waveguide in which loss is caused by the absorber walls, 110A and 110B, by condensing a gap mode by the interior gap 135, where the interior gap 135 is between the conductor walls proximate interior surface portions, 105A and 105B. The gap mode is condensed in such a way that the gap mode, as may be characterized by the gap-mode electric field lines 140, is mostly away from the absorber walls, 110A and 110B, and the gap mode propagates with lesser attenuation than do all other propagating modes in a multimode range.

A frequency above the gap-mode cutoff frequency may be transmitted as a gap mode through the gap-mode waveguide. For example, the gap mode represented by the gap-mode electric field lines 140 in FIG. 4A may be launched by applying a similar electric field to an input port 125A at a frequency above the gap-mode cutoff frequency. The extent to which the launch electric field matches the electric field of the gap mode, quantified by an overlap integral, determines the efficiency of the launch, as is well-known in the art. A microstrip geometry transmitter or source device positioned at the input port 125A may afford a satisfactory electric field match with the gap-mode electric field and commensurately efficient launch.

A frequency may be received or detected from the gap-mode waveguide by a reverse process. For example, a detector or receiver device having a receiving electric field similar to the gap-mode electric field and capable of receiving an electromagnetic signal in a range above the cutoff frequency of the gap-mode waveguide may be positioned at an output port 125B.

The transmitting or receiving device may have microstrip geometry or other geometry that produces the prescribed match. Alternatively, a mode converter may be positioned between a port and a transmitter or receiver device to convert between the gap mode of a gap-mode waveguide and a mode compatible with the transmitter or receiver device.

Gap-mode waveguide transmitter or source devices may be any of several known in the art, including resistors, blackbodies, diodes, including IMPATT, Gunn, and multiplier diodes, Josephson junctions, transistors, travelling-wave tubes, klystrons, magnetrons, gyrotrons, backward-wave oscillators, free-electron lasers, synchrotrons, quantum-cascade lasers, masers, and photomixers, including photodetectors and photoconductors.

Gap-mode waveguide receiver or detector devices may be any of several known in the art, including resistors, thermistors, pyroelectric devices, bolometers, Golay cells, diodes, tunnelling diodes, Josephson junctions, semiconductor-insulator-semiconductor junctions, transistors, travelling-wave tubes, mixers, and electro-optic modulators or photoconductors with modulated light sources.

Many other guided-wave circuit components including interconnect, junctions, waveguide switches (rotary), resistors, capacitors, inductors, attenuators, short circuits, tapers, resonators, spectral filters, mode filters, splitters, combiners, multiplexers, couplers, transformers, matching circuits, rectifiers, amplifiers, oscillators, multipliers, pulse generators, isolators, circulators, transducers, sensors, controllers, actuators, and test cells may be implemented in gap-mode waveguide. Devices and components may be configured and implemented similarly to those in other types of tubular waveguides or comparable transmission lines, such as microstrip or parallel-plate. Some devices may be multiple or distributed, possibly arranged in arrays or patterns to produce specific field characteristics. Gap-mode waveguide straight, bend, twist, or taper sections, or variations or guided-wave circuit components derived therefrom may be connected in various ways to form myriad circuits.

Figure 5A:
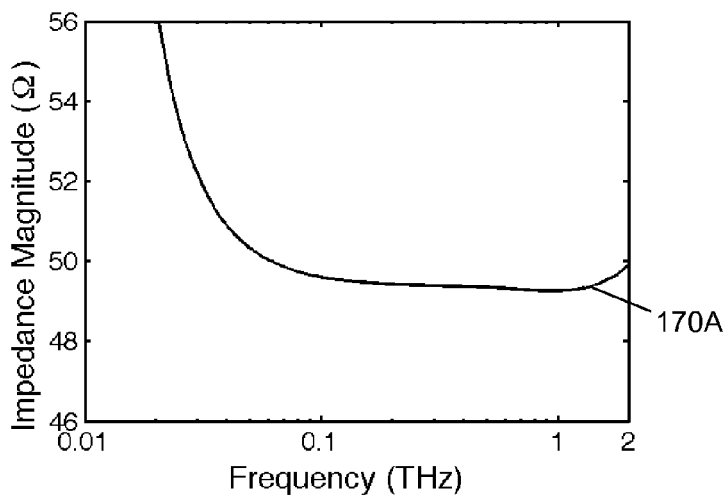
FIG. 5A is a plot of calculated gap-mode effective characteristic impedance versus frequency of a gap-mode waveguide embodiment according to EXAMPLE 1.
Figure 5B:
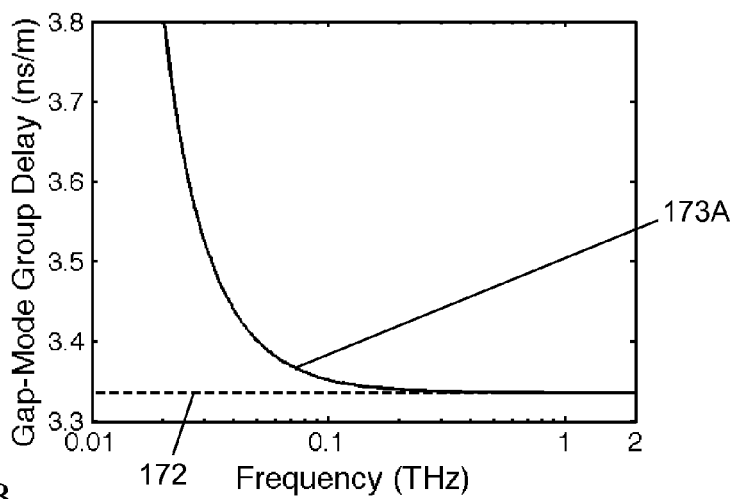
FIG. 5B is a plot of calculated gap-mode group delay versus frequency of a gap-mode waveguide embodiment according to EXAMPLE 1.
Figure 5C:
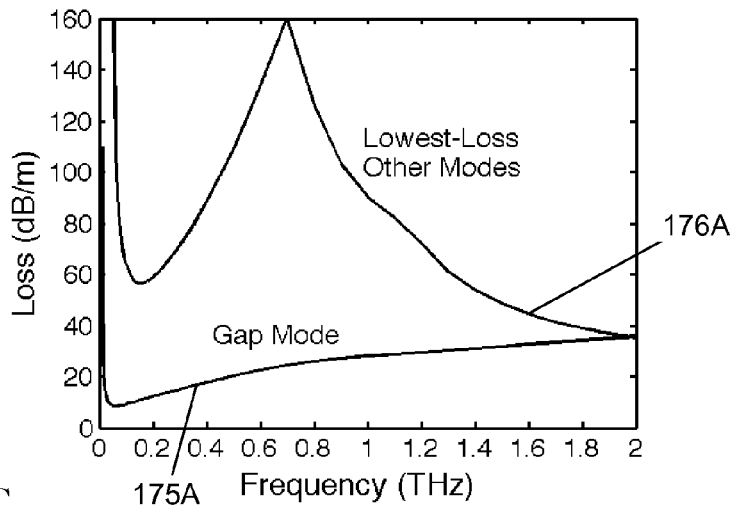
FIG. 5C is a plot of calculated gap-mode and lowest-loss other modes losses versus frequency of a gap-mode waveguide embodiment according to EXAMPLE 1.

FIGS. 5A-5C show plots of calculated wave propagation characteristics of an embodiment of a gap-mode waveguide similar to that shown in FIG. 3 and FIG. 4A, herein called the baseline EXAMPLE 1 embodiment. This embodiment is designed for relatively high mode discrimination ratio over a broad bandwidth. The structural frame 150 exterior dimensions are 5 mm high by 8 mm wide. The interior region width and height, W130 and H130, are 6 mm and 3 mm. The interior gap height H135 is 0.28 mm, and the interior gap 135 is centered vertically and horizontally within the interior region 130. The upper conductor wall gap-facing width W105A is 1.5 mm, including the two 0.05-mm corner radii, and the lower conductor wall gap-facing width W105B is 3.0 mm, including the two 0.05-mm corner radii. The conductor walls thickness T100 and the absorber walls thickness T110 are each about 0.3 mm. The upper conductor-absorber wall junctures 120A are 0.5 mm down from the upper absorber walls interior surfaces 115. The lower conductor-absorber wall junctures 120B are 0.5 mm up from the lower absorber walls interior surfaces 115. The length of the waveguide in the propagation direction is 1 m. Ports, 125A and 125B, are substantially planar and orthogonal to the propagation direction.

The baseline EXAMPLE 1 embodiment structural frame 150 material is aluminum. The conductor walls, 100A and 100B, are aluminum and have conductivity of approximately $4 \times 10^7$ S/m. The absorber walls, 110A and 110B, are resistor coatings of polymer matrix composite containing carbon and silver particles in concentrations to make a conductivity of about $10^4$ S/m. The interior region 130, which includes the interior gap 135, is vacuum.

The baseline EXAMPLE 1 embodiment has a single-mode range of about 10 GHz to about 45 GHz, where only the gap mode propagates. Thus, the multimode cutoff is about 45 GHz. The skin depth at 10 GHz is about 0.8 µm in conductor walls, 100A and 100B, and about 50 µm in the absorber walls, 110A and 110B. The skin depth at 45 GHz, the upper frequency limit of the waveguide single-mode range, is about 0.4 µm in conductor walls, 100A and 100B, and about 24 µm in the absorber walls, 110A and 110B. The conductor walls, 100A and 100B, and absorber walls, 110A and 110B, are all electromagnetically thick above 10 GHz.

The gap-mode effective characteristic impedance is defined for the present example as the line integral of the electric field across the interior gap 135, approximately at its center, from the upper conductor wall proximate interior surface portion 105A to the lower conductor wall proximate interior surface portion 105B, divided by the current in the upper conductor wall 100A in the propagation direction. A gap-mode effective characteristic impedance magnitude trace 170A of the baseline EXAMPLE 1 embodiment is plotted versus frequency in FIG. 5A. The imaginary part is two orders of magnitude smaller than the real part, and the gap-mode effective characteristic impedance is relatively constant and reasonably close to 50 ohms real impedance from 21 GHz to 2 THz, having a reflection coefficient of less than −25 dB.

A gap-mode group delay trace 173A is plotted together with a dashed line speed of light limit trace 172 versus frequency in FIG. 5B. Group delay dispersion is less than 4 ps over the range from 200 GHz to 2 THz. The dispersion is sufficiently low to allow good-fidelity terahertz-bandwidth pulse transmission over meter-scale distances.

A gap-mode loss trace 175A and a lowest-loss other modes (LLO modes) loss trace 176A for the baseline EXAMPLE 1 embodiment are plotted together versus frequency in FIG. 5C. The gap-mode loss is less than 36 dB/m over the frequency range from 13 GHz to 2 THz, which is acceptable for meter-scale transmission distances in many applications. The gap-mode loss is less than the loss of any other mode over a mode-selective frequency range from about 45 GHz to about 2 THz. Equivalently, the mode-discrimination ratio is greater than one from about 45 GHz to about 2 THz.

Figure 6:
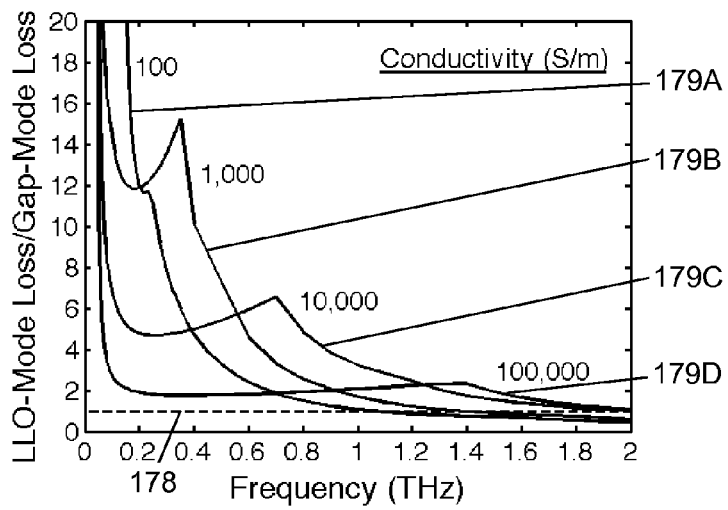
FIG. 6 is a plot of calculated mode-discrimination ratios versus frequency for four differing absorber wall conductivities of a gap-mode waveguide embodiment according to EXAMPLE 1.
Figure 7:
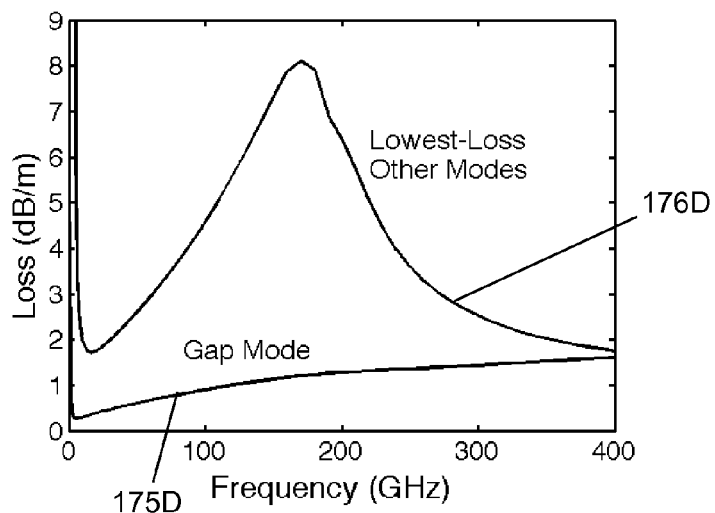
FIG. 7 is a plot of calculated gap-mode and lowest-loss other modes losses versus frequency of a variation of the gap-mode waveguide embodiment according to EXAMPLE 1 where transverse dimensions are scaled by a factor of ten.
Figure 8:
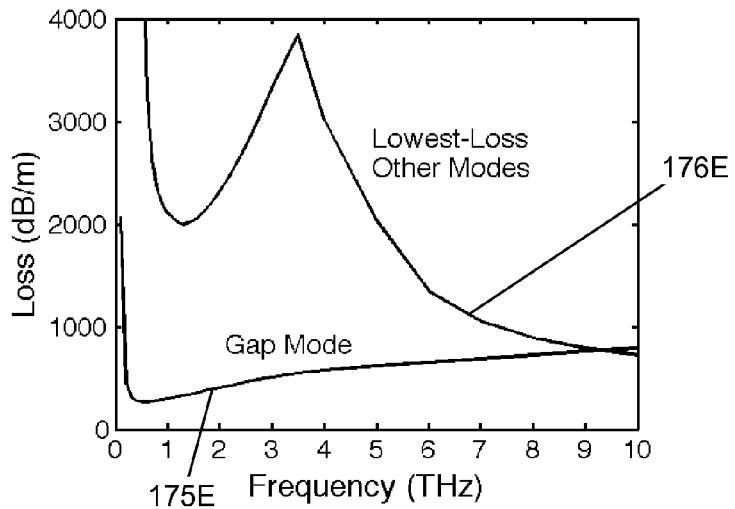
FIG. 8 is a plot of calculated gap-mode and lowest-loss other modes losses versus frequency of a variation of the gap-mode waveguide embodiment according to EXAMPLE 1 where transverse dimensions are scaled by a factor of one-tenth.

FIGS. 6-8 show calculated results for parameter variations of the EXAMPLE 1 embodiment. The plot of calculated mode-discrimination ratios versus frequency in FIG. 6 has four traces for the absorber walls, 110A and 110B, being resistors of various conductivities: a 100 S/m absorber conductivity mode-discrimination ratio trace 179A, a 1,000 S/m absorber conductivity mode-discrimination ratio trace 179B, a 10,000 S/m absorber conductivity mode-discrimination ratio trace 179C, and a 100,000 S/m absorber conductivity mode-discrimination ratio trace 179D. A dashed line mode-discrimination ratio of one trace 178 marks the threshold below which there is no loss-based selection for the gap mode. Gap-mode effective characteristic impedances and gap-mode group delays for absorber wall conductivities of 100, 1,000, and 100,000 S/m do not differ greatly from the gap-mode effective characteristic impedance magnitude trace 170A and gap-mode group delay trace 173A for conductivity of 10,000 S/m, plotted in FIGS. 5A and 5B.

FIGS. 7 and 8 show plots of calculated wave propagation characteristics as a function of a transverse size-scaling factor, whereby the EXAMPLE 1 embodiment waveguide dimensions transverse to the propagation direction are scaled. A transverse scaling factor of ten gap-mode loss trace 175D and a transverse scaling factor of ten lowest-loss other modes loss trace 176D are plotted versus frequency in FIG. 7 for a waveguide scaled larger by a factor of ten. The gap-mode loss is less than 1.7 dB/m, which is good for multi-meter-scale transmission distances in many applications, and less than the loss of any other mode over a mode-selective frequency range from 1.2 GHz to 400 GHz. The gap-mode effective characteristic impedance is relatively constant and reasonably close to 50 ohms real impedance from 2.2 GHz to 400 GHz, having a reflection coefficient of less than −25 dB. Increasing the transverse scaling factor further will scale the losses depicted in FIG. 7 to still lesser losses and lower frequencies, maintaining comparable mode discrimination ratio scaled down in frequency.

A transverse scaling factor of one-tenth gap-mode loss trace 175E and a transverse scaling factor of one-tenth lowest-loss other modes loss trace 176E are plotted versus frequency in FIG. 8 for a waveguide scaled smaller by a factor of one-tenth. The gap-mode loss is less than 8 dB/cm, which is good for multi-centimeter-scale transmission distances in many applications, and less than the loss of any other mode over a mode-selective frequency range from 140 GHz to 9 THz. The gap-mode effective characteristic impedance is relatively constant and reasonably close to 50 ohms real impedance from 200 GHz to 9 THz, having a reflection coefficient of less than −25 dB.

Figure 9A:
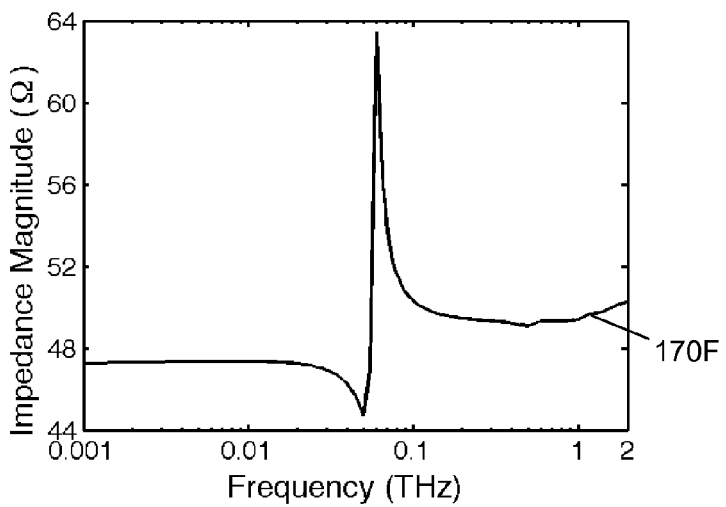
FIG. 9A is a plot of calculated gap-mode effective characteristic impedance versus frequency for anisotropic absorber conductivity of a gap-mode waveguide embodiment according to EXAMPLE 1.
Figure 9B:
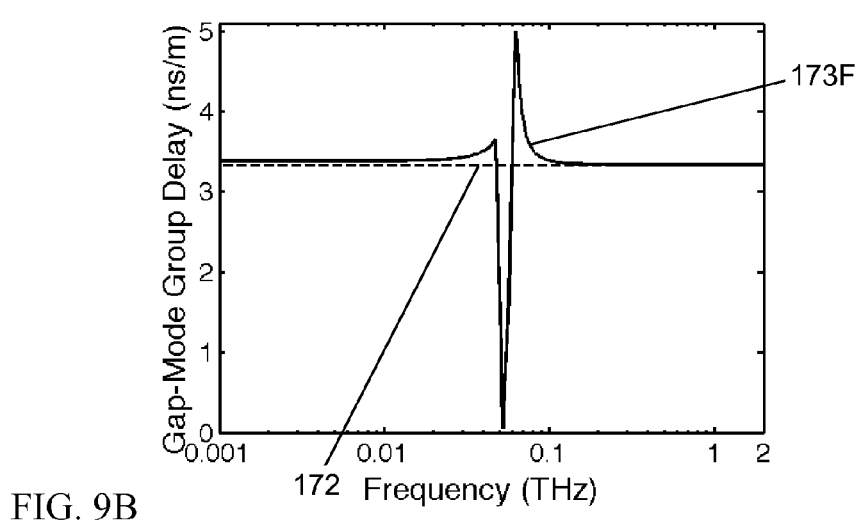
FIG. 9B is a plot of calculated gap-mode group delay versus frequency for anisotropic absorber conductivity of a gap-mode waveguide embodiment according to EXAMPLE 1.
Figure 9C:
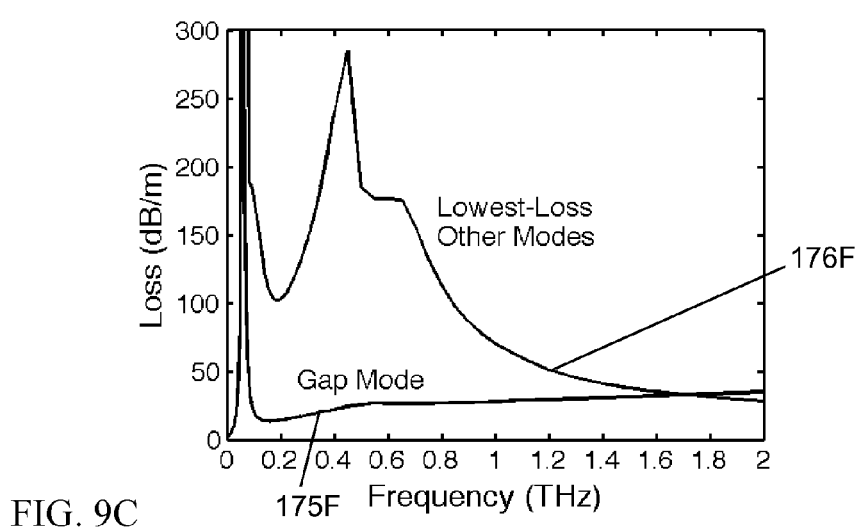
FIG. 9C is a plot of calculated gap-mode and lowest-loss other modes losses versus frequency for anisotropic absorber conductivity of a gap-mode waveguide embodiment according to EXAMPLE 1.

FIGS. 9A, 9B, and 9C show plots of calculated wave propagation characteristics for a variation of the EXAMPLE 1 embodiment in which the absorber walls, 110A and 110B, are anisotropic resistor walls. Anisotropic absorbers may include materials of various electromagnetic characteristics, including inherently isotropic materials, arranged on sufficiently small scales such that the absorption varies according to relative direction of the current path at the frequencies of interest.

One configuration blocks DC current flow between two conductor walls while acting as an absorber to waves propagating on the waveguide. One way of accomplishing this is with a structure having layers of a resistor material alternately stacked with layers of an insulator material, yielding moderate conductivity in directions parallel to the planes of the layers and low conductivity perpendicular to the planes. The resistor material may have conductivity in the range of $10^2$ to $10^5$ S/m, preferably about $10^4$ S/m. The insulator material may have conductivity low enough that the perpendicular DC current is below a prescribed limit.

In the variation of the EXAMPLE 1 embodiment with model calculated results plotted in FIGS. 9A, 9B, and 9C, the absorber walls, 110A and 110B, are composed of anisotropic resistors, formed by alternating 0.05-mm-thick layers of resistor and insulator. The conductivity of the resistor layers is 10,000 S/m. The insulator layers have zero conductivity and relative dielectric constant of 2.6. The normal vectors to the planes of the layers are parallel to the absorber walls interior surfaces 115 and orthogonal to the propagation direction. The absorber walls, 110A and 110B, are thus conductive in the propagation direction and nonconductive around the perimeter of the waveguide perpendicular to the propagation direction. The structural frame 150 is omitted.

At DC or zero frequency, current does not flow between the conductor walls, 100A and 100B, through the absorber walls, 110A and 110B, when the absorber walls, 110A and 110B, are anisotropic resistors. The EXAMPLE 1 embodiment in which the absorber walls, 110A and 110B, are anisotropic resistors supports a gap mode at frequencies down to DC. Similar effects may alternatively be achieved by variations of the EXAMPLE 1 embodiment in which: portions of the absorber walls, 110A and 110B, are anisotropic resistors; the conductor walls, 100A and 100B, or portions thereof, are anisotropic conductors; or portions of the tubular waveguide walls include insulators, effectively incorporating capacitors.

The anisotropic resistors, anisotropic conductors, or insulator portions introduce a capacitive reactance, which may interact with other reactive characteristics of the waveguide embodiment to produce a resonance. Despite a possible resonance, a gap-mode waveguide embodiment having a low-frequency or DC response may be useful for propagating signals having a low-frequency or DC component; propagating control signals; transmitting power; or supporting a low-frequency or DC offset between the conductor walls, 100A and 100B, which, for example, may simplify connection of devices operating with a DC bias. In addition, the resonance may be exploited as a filter.

An anisotropic absorber gap-mode effective characteristic impedance magnitude trace 170F plotted versus frequency in FIG. 9A shows reasonably constant impedance except for a frequency range of approximately 40-80 GHz, where a pattern suggests a resonance. Resonance is further suggested by anomalous dispersion in the 40-80 GHz range of an anisotropic absorber gap-mode group delay trace 173F, plotted versus frequency in FIG. 9B. Outside the 40-80 GHz range, the anisotropic absorber gap-mode group delay trace 173F shows low dispersion. An anisotropic absorber gap-mode loss trace 175F, plotted versus frequency in FIG. 9C, shows a large loss peak between 55 and 60 GHz, but from 80 GHz to 1.7 THz, it shows relatively low loss and lesser attenuation than represented by an anisotropic absorber lowest-loss other modes loss trace 176F. These model results suggest that the EXAMPLE 1 embodiment in which the absorber walls, 110A and 110B, are anisotropic resistors may be suitable for applications where a DC response is useful and the gap-mode response performance in the 40-80 GHz range may be tolerated or where the resonance is desired as a filter.

EXAMPLE 2

FIGS. 10-11B

Figure 10:
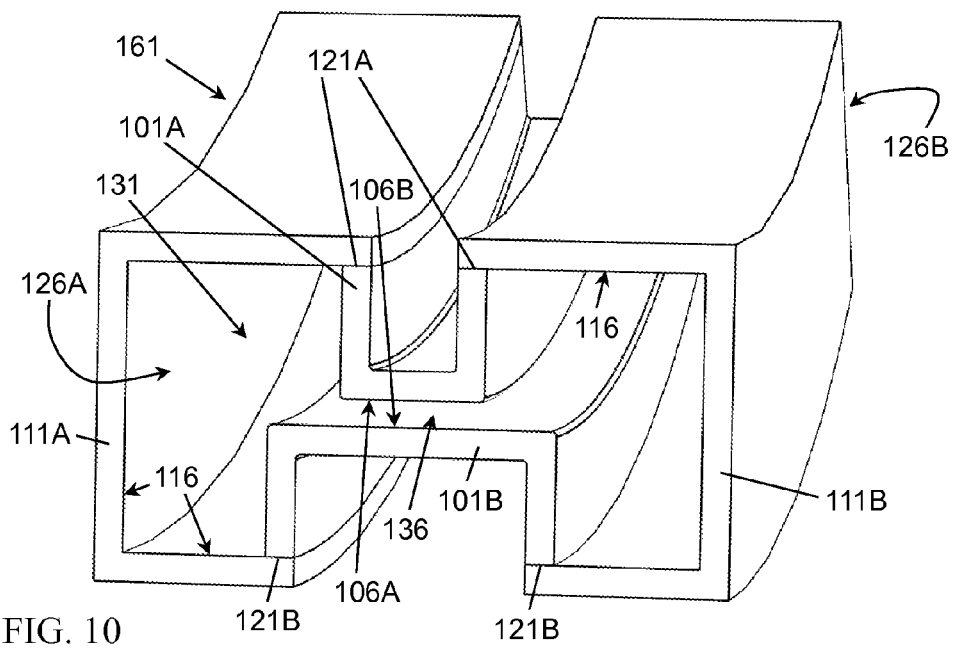
FIG. 10 is a perspective view of a gap-mode waveguide embodiment having an electric-field-plane bend according to EXAMPLE 2.

This example provides for a change in propagation direction by bending or curving of a gap-mode waveguide, as illustrated in FIG. 10. A gap-mode electric-field-plane or E-plane bend 161 provides for a relatively low-loss change of the gap-mode propagation direction. As used in this specification and the attendant claims, the gap-mode electric-field plane is defined by the principal electric-field polarization and the propagation direction at a specified location, such as at a port or beginning of a bend, as in the present example. As used in this specification and the attendant claims, the principal electric-field polarization is defined as the polarization that best characterizes the overall gap-mode electric field. The principal electric-field polarization is generally the gap-mode electric field polarization at the center of the interior gap for gap-mode cross-sections having bilateral symmetry, as in the present example, or substantial bilateral symmetry.

Referring to FIG. 10, two conductor walls, 101A and 101B, and two absorber walls, 111A and 111B, form the sides of the curved tubular waveguide. An interior gap 136 in the interior region 131 is formed between conductor walls proximate interior surface portions, 106A and 106B. The waveguide cross-section is substantially constant throughout the bend. Ports, 126A and 126B, bound the ends of the curved waveguide. The E-plane bend 161 follows a specified curve in the gap-mode electric-field plane. The curve may be any curve that provides the prescribed change in propagation direction and satisfies other design goals. A curve having tapered curvature transitions to a uniform curvature may have especially low mode conversion.

The structure, materials, construction, and operation described in EXAMPLE 1 may be applied to a gap-mode waveguide bend. In addition, bendable or formable gap-mode waveguide may be produced by fabricating structural elements from low-yield materials, such as formable metal alloys like brass or beryllium alloys, or plastics. Other techniques providing formable structures, such as overlapping sliding elements, may be employed for portions of the waveguide structure.

The transverse dimensions and materials of the EXAMPLE 2 embodiment 90-degree gap-mode waveguide bend are the same as those of the baseline EXAMPLE 1 embodiment except that the upper conductor-absorber wall junctures 121A are 0 mm down from the upper absorber walls interior surfaces 116 and the lower conductor-absorber wall junctures 121B are 0 mm up from the lower absorber walls interior surfaces 116. The E-plane bend 161 forms a 90-degree angle between the propagation directions at the ports, 126A and 126B, and follows a circular, uniform, and upward-directed curve with a radius of about 10 mm, as measured at the center of the interior gap 136. Ports, 126A and 126B, are substantially planar and orthogonal to the propagation directions at their respective ends.

Figure 11A:
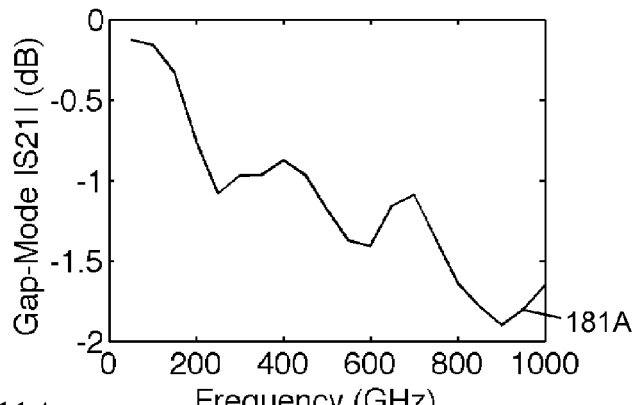
FIG. 11A is a plot of calculated gap-mode S21 (transmission S-parameter) magnitude of a gap-mode waveguide embodiment according to EXAMPLE 2.
Figure 11B:
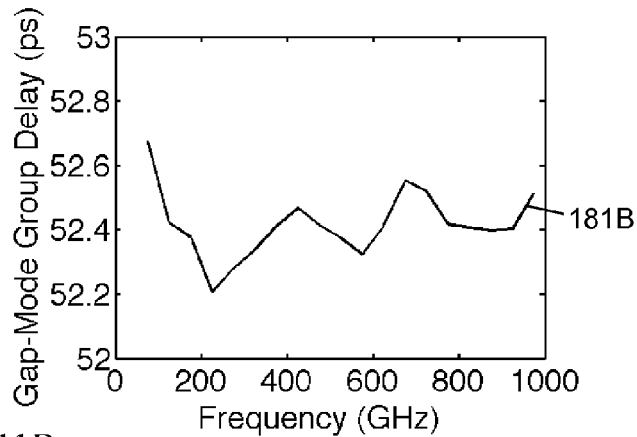
FIG. 11B is a plot of calculated gap-mode transmission group delay of a gap-mode waveguide embodiment according to EXAMPLE 2.

FIGS. 11A and 11B show plots of a calculated gap-mode S21 magnitude trace 181A (transmission S-parameter) and a calculated gap-mode transmission group delay trace 181B of the EXAMPLE 2 embodiment 90-degree gap-mode waveguide bend. The gap-mode S21 magnitude trace 181A plotted in FIG. 11A shows gap-mode loss of less than 2 dB over the frequency range from 50 GHz to 1 THz. The gap-mode transmission group delay trace 181B plotted in FIG. 11B shows gap-mode group delay dispersion of less than 0.5 ps over the same frequency range. The frequency range of the plots does not represent limitations of the performance of the embodiment but rather limitations of accessible computational resources. The cyclical fluctuations evident in both plots are believed to be due to mode-coupling effects. Calculations indicate that this embodiment would support good-fidelity terahertz-bandwidth pulse transmission. Modes other than the gap mode may experience excess loss greater than that of the gap mode due to the bending of the waveguide, affording an enhancement of the mode discrimination.

EXAMPLE 3

FIGS. 12-13B

Figure 12:
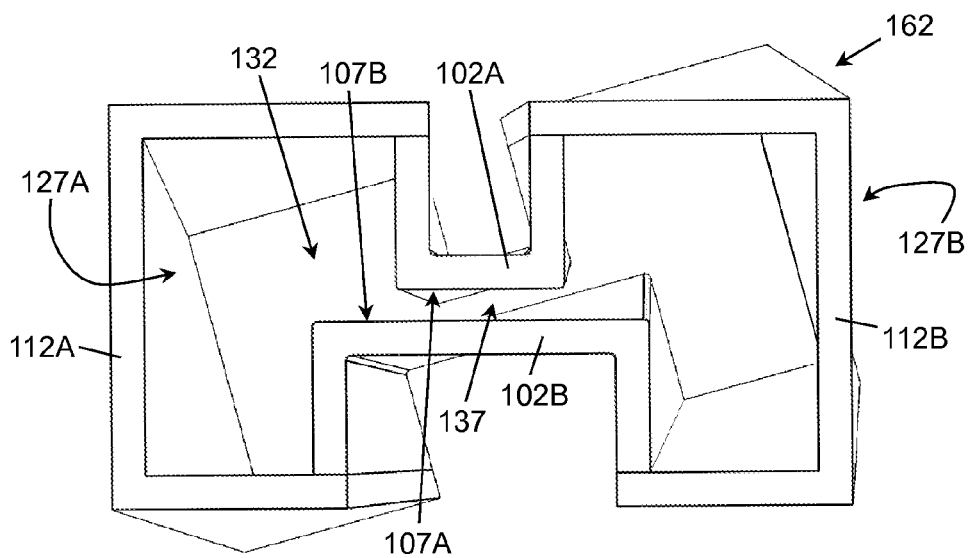
FIG. 12 is a perspective view of a gap-mode waveguide embodiment having a twist according to EXAMPLE 3.

This example describes a gap-mode waveguide embodiment having a twist, as illustrated in FIG. 12. A gap-mode waveguide twist 162 reorients the gap-mode electric field or E-field or principal electric-field polarization. A waveguide twist is a progressive rotation over distance of the waveguide cross-section about a twist axis parallel to the propagation direction. In an embodiment, non-axial points on a helical waveguide twist cross-section trace out helixes through the waveguide twist, and the waveguide cross-section is substantially constant through the twist. In another embodiment, one or more non-axial points on a non-helical waveguide twist cross-section do not trace out helixes through the waveguide twist, and the waveguide cross-section is not constant through the twist. The waveguide twist follows a specified twist rate versus propagation distance curve. The twist rate versus distance curve may be any curve that provides the prescribed change in principal electric-field polarization and satisfies other design goals.

Referring to FIG. 12, two conductor walls, 102A and 102B, and two absorber walls, 112A and 112B, form the sides of a twisted tubular waveguide. An interior gap 137 in the interior region 132 is formed between conductor walls proximate interior surface portions, 107A and 107B. Ports, 127A and 127B, bound the ends of the twisted waveguide and differ in rotation about the twist axis by the twist angle. The twist 162 is a straight-line twist, wherein the conductor walls, 102A and 102B, and absorber walls, 112A and 112B, interior surfaces are described by the loci of straight lines connecting the conductor walls, 102A and 102B, and absorber walls, 112A and 112B, interior boundary points at port 127A with corresponding points at port 127B. The waveguide cross-section is not constant through a straight-line twist, but in fact tapers. The gap mode transmutes through the twist 162.

The structure, materials, construction, and operation described in EXAMPLE 1 may be applied to a gap-mode waveguide twist. In addition, twistable or formable gap-mode waveguide may be produced by fabricating structural elements from low-yield materials, such as formable metal alloys like brass or beryllium alloys, or plastics. Other techniques providing formable structures, such as overlapping sliding elements, may be employed for portions of the waveguide structure.

The transverse dimensions at the ports, 127A and 127B, and materials of the EXAMPLE 3 embodiment 90-degree gap-mode waveguide twist are the same as those of the EXAMPLE 2 embodiment. The twist 162 is a straight-line twist that forms an approximate 90-degree angle between the ports, 127A and 127B, which are substantially planar and orthogonal to the propagation direction. The twist rate is 3 degrees/mm and uniform, and the overall length is 30 mm.

Figure 13A:
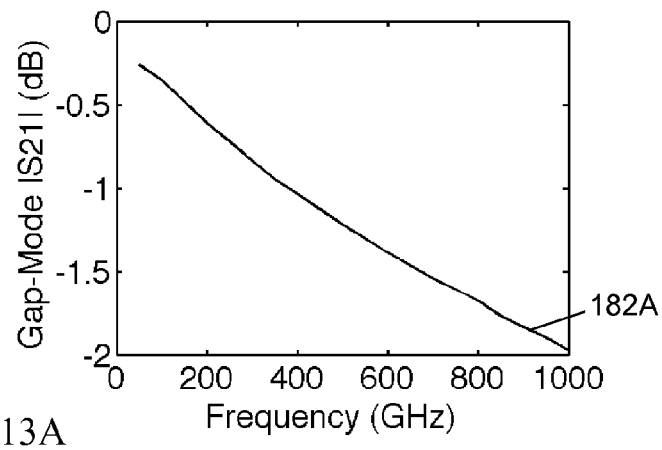
FIG. 13A is a plot of calculated gap-mode S21 (transmission S-parameter) magnitude of a gap-mode waveguide embodiment according to EXAMPLE 3.
Figure 13B:
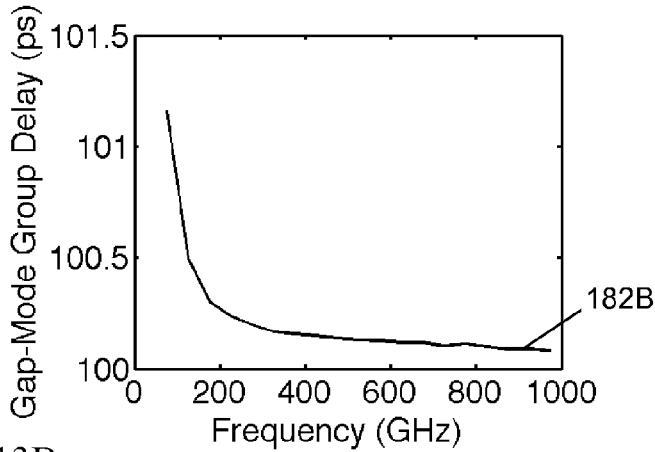
FIG. 13B is a plot of calculated gap-mode transmission group delay of a gap-mode waveguide embodiment according to EXAMPLE 3.

FIGS. 13A and 13B show plots of a calculated gap-mode S21 magnitude trace 182A and a calculated gap-mode transmission group delay trace 182B of the EXAMPLE 3 embodiment 90-degree gap-mode waveguide twist. The gap-mode S21 magnitude trace 182A plotted in FIG. 13A shows gap-mode loss of less than 2 dB over the frequency range from 50 GHz to 1 THz. The gap-mode transmission group delay trace 182B plotted in FIG. 13B shows gap-mode group delay dispersion of about 1 ps over the same frequency range. The frequency range of the plots does not represent limitations of the performance of the embodiment but rather limitations of accessible computational resources. Calculations indicate that this embodiment would support good-fidelity terahertz-bandwidth pulse transmission.

A gap-mode waveguide twist followed by a gap-mode waveguide E-plane bend provides for a relatively low-loss change of the propagation direction that is not constrained to a plane. Following with another twist provides additionally for reorientation of principal electric-field polarization.

EXAMPLE 4

FIGS. 14-15B

Figure 14:
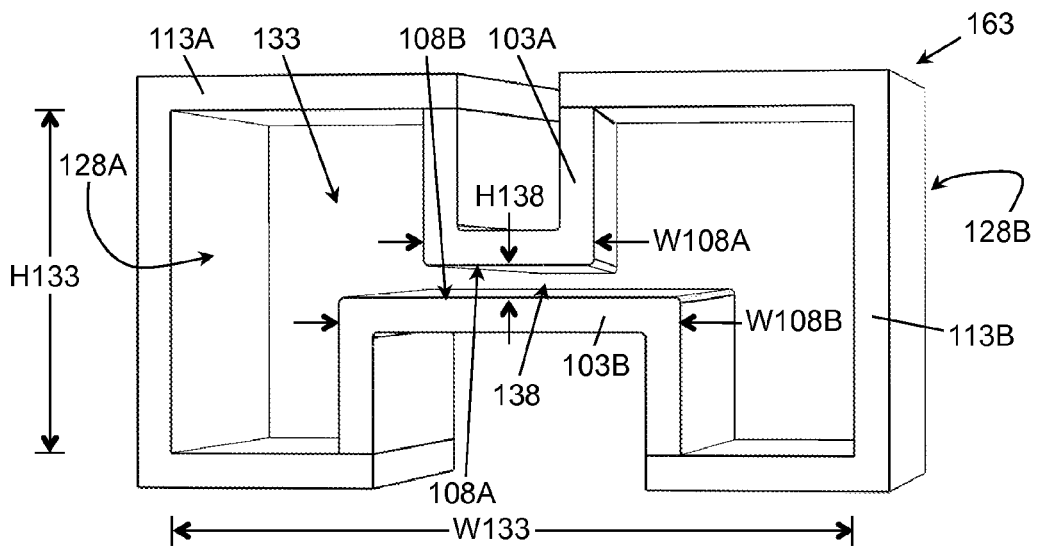
FIG. 14 is a perspective view of a gap-mode waveguide embodiment having a constant-impedance linear taper according to EXAMPLE 4.

This example describes a gap-mode waveguide embodiment having a constant-impedance 2:1 linear taper 163, illustrated in FIG. 14. Such a taper may be used in transitions between different waveguides and components. Tapering to a small gap-mode size may be useful in applications such as near-field scanning A taper is a means of transmuting a gap mode in the propagation direction.

A gap-mode waveguide may be tapered in various ways. Scaling of the entire waveguide cross-section with distance causes some of the waveguide properties, such as gap-mode cutoff frequency to change with distance. The gap-mode cutoff frequency may be maintained nearly constant with distance, as in the present example, by maintaining the overall interior dimensions, the interior region width and height, W133 and H133, and by scaling only dimensions primarily defining the interior gap, the upper conductor gap-facing width W108A and tapered interior gap height H138.

The constant-impedance 2:1 linear taper 163 according to the present example embodiment transmutes the gap mode without significantly changing the gap-mode effective characteristic impedance or cutoff frequency over distance. The upper conductor gap-facing width W108A and tapered interior gap height H138 each follow specified curves versus propagation distance. The curves may be any curves that together substantially maintain constant gap-mode effective characteristic impedance, provide the prescribed gap mode size, and satisfy other design goals.

The structure, materials, construction, and operation described in EXAMPLE 1 may be applied to the present example embodiment. Referring to FIG. 14, two conductor walls, 103A and 103B, and two absorber walls, 113A and 113B, form the sides of a tubular waveguide. An interior gap 138 in the interior region 133 is formed between conductor walls proximate interior surface portions, 108A and 108B. Ports, 128A and 128B, bound the ends of the waveguide. The upper conductor gap-facing width W108A and tapered interior gap height H138 both decrease linearly with propagation distance from port 128A to port 128B. The tapered interior gap 138 is centered vertically and horizontally within the interior region 133.

The transverse dimensions at port 128A and materials of the present example are the same as those of the EXAMPLE 2 embodiment. The interior region width and height, W133 and H133, are 6 mm and 3 mm and the lower conductor gap-facing width W108B is 3.0 mm, including the two 0.05-mm corner radii, over the entire length of the waveguide. The upper conductor gap-facing width W108A is 1.5 mm, including the two 0.05-mm corner radii, at port 128A and 0.75 mm at port 128B. The tapered interior gap height H138 is 0.28 mm at port 128A and 0.16 mm at port 128B. Ports, 128A and 128B, are substantially planar and orthogonal to the propagation directions at their respective ends. The overall waveguide length in the propagation direction is 4 mm.

Figure 15A:
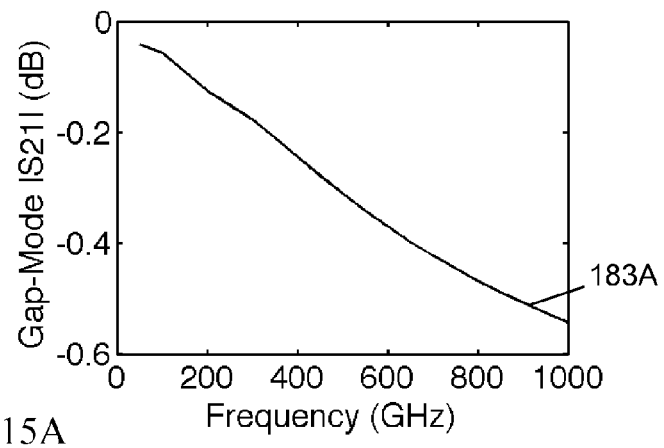
FIG. 15A is a plot of calculated gap-mode S21 (transmission S-parameter) magnitude of a gap-mode waveguide embodiment according to EXAMPLE 4.
Figure 15B:
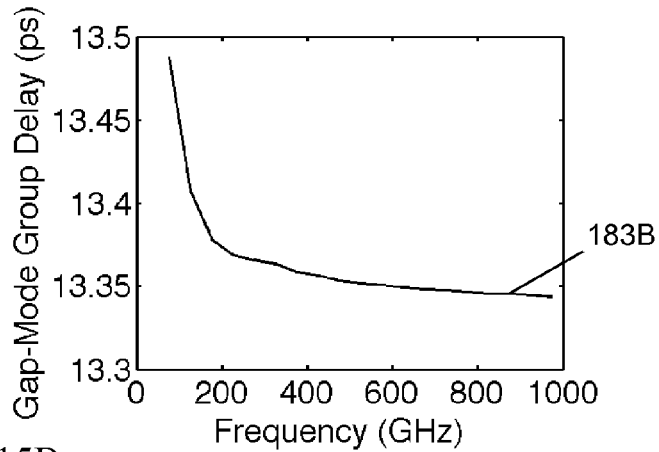
FIG. 15B is a plot of calculated gap-mode transmission group delay of a gap-mode waveguide embodiment according to EXAMPLE 4.

FIGS. 15A and 15B show plots of a calculated gap-mode S21 magnitude trace 183A and a calculated gap-mode transmission group delay trace 183B of the present example. The gap-mode S21 magnitude trace 183A plotted in FIG. 15A shows gap-mode loss of less than 0.6 dB over the frequency range from 50 GHz to 1 THz. The gap-mode transmission group delay trace 183B plotted in FIG. 15B shows gap-mode group delay dispersion of less than 0.2 ps over the same frequency range. The frequency range of the plots does not represent limitations of the performance of the embodiment but rather limitations of accessible computational resources. Calculations indicate that this embodiment would support good-fidelity terahertz-bandwidth pulse transmission.

EXAMPLE 5

FIGS. 16-17B

Figure 16:
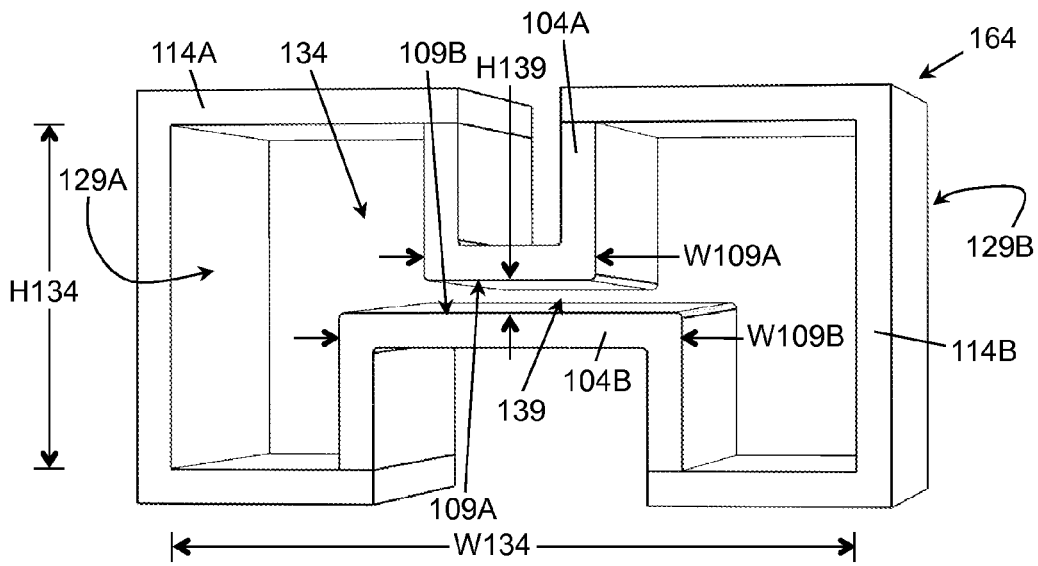
FIG. 16 is a perspective view of a gap-mode waveguide embodiment having a constant-width impedance taper according to EXAMPLE 5.

This example describes a gap-mode waveguide embodiment having a constant-width 2:1 impedance taper 164, illustrated in FIG. 16, as may be used to transform impedance or connect between different waveguides and components. A constant-width impedance taper changes the effective characteristic impedance of the gap mode without significantly changing its width, by only changing the height of the interior gap over distance. The interior gap height follows a specified curve versus propagation distance. The curve may be any curve that substantially provides the prescribed gap-mode effective characteristic impedance versus distance without undue loss, scattering, or reflections. Included are curves that provide linear, exponential, and so-called Klopfenstein impedance tapers. This and the previous example are special cases of innumerable possible tapers and combinations thereof gap-mode waveguide embodiments.

The structure, materials, construction, and operation described in EXAMPLE 1 may be applied to the present example embodiment. Referring to FIG. 16, the constant-width 2:1 impedance taper 164 according to the present example embodiment transmutes the gap mode without significantly changing the gap-mode width or cutoff frequency over distance. Two conductor walls, 104A and 104B, and two absorber walls, 114A and 114B, form the sides of a tubular waveguide. An interior gap 139 in the interior region 134 is formed between conductor walls proximate interior surface portions, 109A and 109B. Ports, 129A and 129B, bound the ends of the waveguide. The tapered interior gap height H139 decreases linearly with propagation distance from port 129A to port 129B. The tapered interior gap 139 is centered vertically and horizontally within the interior region 134.

The transverse dimensions at port 129A and materials of the present example embodiment are the same as those of the EXAMPLE 2 embodiment. The interior region width and height, W134 and H134, are 6 mm and 3 mm, the upper conductor wall gap-facing width W109A is 1.5 mm, and the lower conductor wall gap-facing width W109B is 3.0 mm, including the 0.05-mm corner radii, over the entire length of the waveguide. The tapered interior gap height H139 is 0.28 mm at port 129A and 0.13 mm at port 129B, corresponding to gap-mode effective characteristic impedances of about 50 ohms and about 26 ohms, respectively. Ports, 129A and 129B, are substantially planar and orthogonal to the propagation directions at their respective ends. The overall waveguide length in the propagation direction is 4 mm.

Figure 17A:
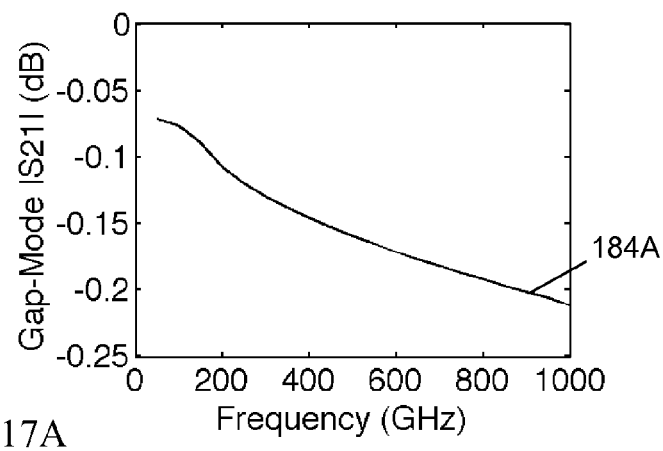
FIG. 17A is a plot of calculated gap-mode S21 (transmission S-parameter) magnitude of a gap-mode waveguide embodiment according to EXAMPLE 5.
Figure 17B:
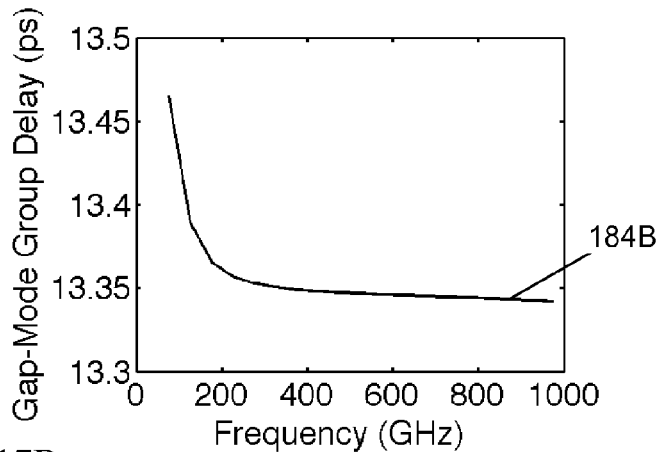
FIG. 17B is a plot of calculated gap-mode transmission group delay of a gap-mode waveguide embodiment according to EXAMPLE 5.

FIGS. 17A and 17B show plots of a calculated gap-mode S21 magnitude trace 184A normalized to port impedances and a calculated gap-mode transmission group delay trace 184B of the EXAMPLE 5 embodiment gap-mode waveguide constant-width 2:1 impedance taper. The gap-mode S21 magnitude trace 184A plotted in FIG. 17A shows gap-mode loss of less than 0.25 dB over the frequency range from 50 GHz to 1 THz. The gap-mode transmission group delay trace 184B plotted in FIG. 17B shows gap-mode group delay dispersion of less than 0.2 ps over the same frequency range. The frequency range of the plots does not represent limitations of the performance of the embodiment but rather limitations of accessible computational resources. Calculations indicate that this embodiment would support good-fidelity terahertz-bandwidth pulse transmission.

EXAMPLE 6

FIGS. 18-19B

Figure 18:
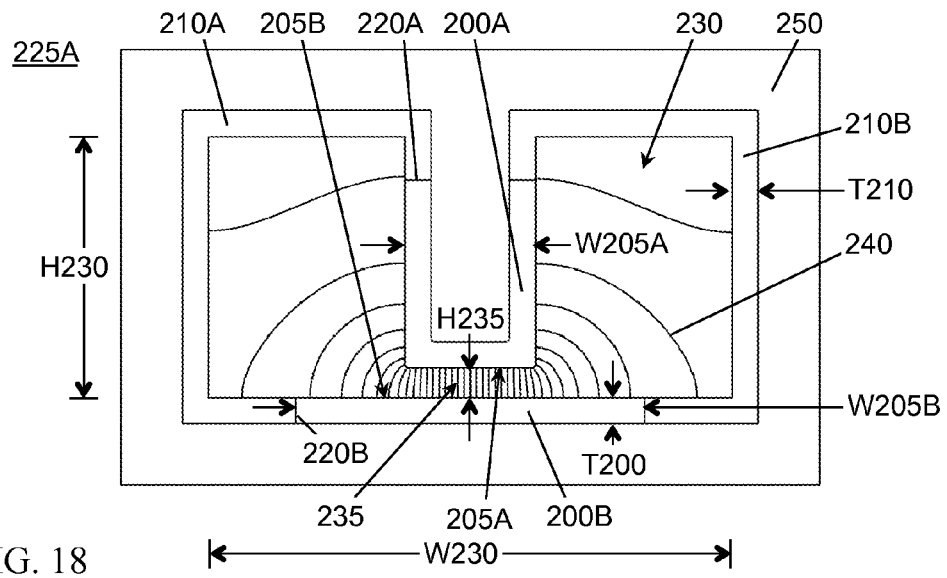
FIG. 18 is an end view of a gap-mode waveguide embodiment having a microstrip-like gap mode according to EXAMPLE 6, showing gap-mode electric-field lines in the interior region.

This example describes a gap-mode waveguide embodiment having a microstrip-like gap mode. The materials, construction, and operation described in EXAMPLE 1 may be applied to the present example. FIG. 18 shows an end view at a port 225A of a gap-mode waveguide embodiment according to the present example, including gap-mode electric field lines 240. Two conductor walls, 200A and 200B, and two absorber walls, 210A and 210B, form the sides of the tubular waveguide. An interior gap 235 in the interior region 230 is formed between conductor walls proximate interior surface portions, 205A and 205B. The conductor walls proximate interior surface portions, 205A and 205B, are generally parallel, and the upper conductor wall proximate interior surface portion 205A is narrower than the lower conductor wall proximate interior surface portion 205B. The corners of the conductor wall 200A that are convex in the interior region 230 have non-essential radii to reduce concentrations of the proximate electric field and power. The conductor walls thickness T200 and the absorber walls thickness T210 are preferably at least one skin depth at the multimode cutoff. An exterior mechanical support structure or structural frame 250 may provide additional mechanical support.

The materials of the EXAMPLE 6 gap-mode waveguide embodiment are the same as those of the baseline EXAMPLE 1 embodiment. The EXAMPLE 6 gap-mode waveguide embodiment structural frame 250 exterior dimensions are 5 mm high by 8 mm wide. The interior region width and height, W230 and H230, are 6 mm and 3 mm. The interior gap height H235 is 0.34 mm, and the interior gap 235 is centered horizontally within the interior region 230. The upper conductor wall gap-facing width W205A is 1.5 mm, including the two 0.05-mm corner radii, and the lower conductor wall gap-facing width W205B is 4.0 mm. The conductor walls thickness T200 and the absorber walls thickness T210 are each about 0.3 mm. The lower conductor wall proximate interior surface portion 205B is roughly coplanar with the lower interior surfaces of the absorber walls, 210A and 210B. The lower conductor-absorber wall junctures 220B are 1.0 mm inward from the rightmost and leftmost interior surfaces of the absorber walls, 210B and 210A. The upper conductor-absorber wall junctures 220A are 0.5 mm down from the upper interior surfaces of the absorber walls, 210A and 210B. The length of the waveguide in the propagation direction is 1 m. Port 225A and the port at the other end are substantially planar and orthogonal to the propagation direction.

Figure 19A:
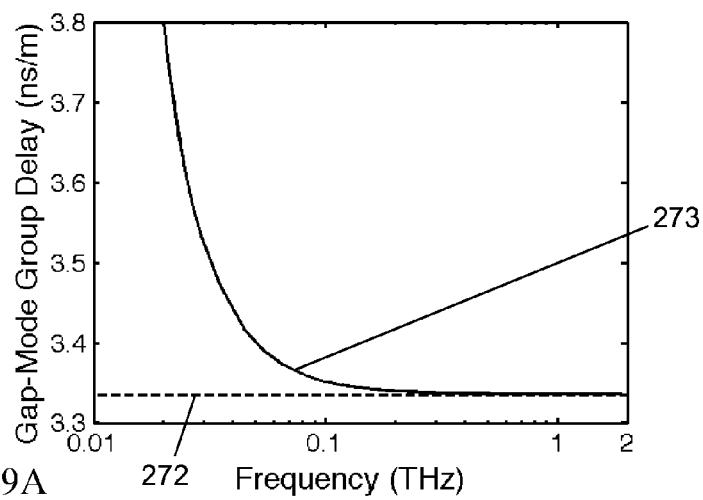
FIG. 19A is a plot of calculated gap-mode group delay versus frequency of a gap-mode waveguide embodiment according to EXAMPLE 6.

The EXAMPLE 6 gap-mode waveguide embodiment has a single-mode range of about 10 GHz to about 46 GHz, where only the gap mode propagates. The multimode cutoff is thus about 46 GHz. The gap-mode effective characteristic impedance is close to 50 ohms real impedance from 21 GHz to 2 THz. A calculated gap-mode group delay trace 273 plotted versus frequency along with a dashed speed of light limit trace 272 in FIG. 19A shows dispersion is sufficiently low to allow good-fidelity terahertz-bandwidth pulse transmission over meter-scale distances.

Figure 19B:
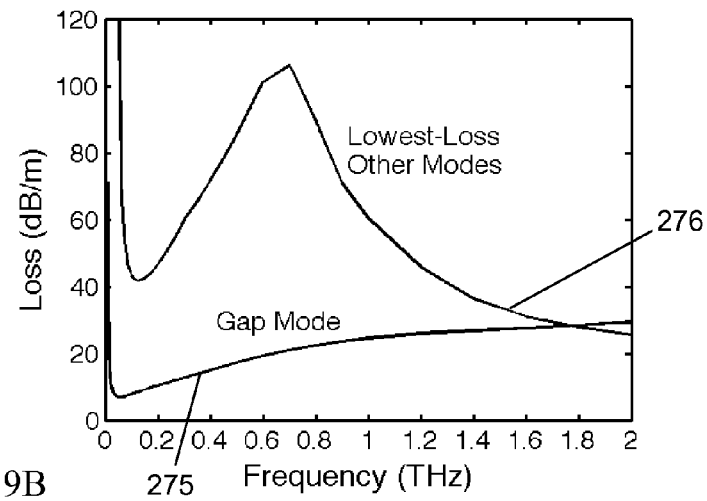
FIG. 19B is a plot of calculated gap-mode and lowest-loss other modes losses versus frequency of the gap-mode waveguide embodiment according to EXAMPLE 6.

A calculated gap-mode loss trace 275 and a calculated lowest-loss other modes (LLO modes) loss trace 276 of the EXAMPLE 6 gap-mode waveguide embodiment are plotted together versus frequency in FIG. 19B. The gap-mode loss is less than 30 dB/m over the frequency range from 12 GHz to 2 THz, which is acceptable for meter-scale transmission distances in many applications. The LLO-modes loss is greater than the gap-mode loss over a mode-selective frequency range from roughly 46 GHz to about 1.7 THz.

Gap-mode waveguide bends, twists, and tapers may be constructed as variations of the present example. Gap-mode waveguide straight, bend, twist, or taper sections, or variations or guided-wave circuit components derived therefrom may be connected in various ways to form myriad circuits.

EXAMPLE 7

FIGS. 20-21B

Figure 20:
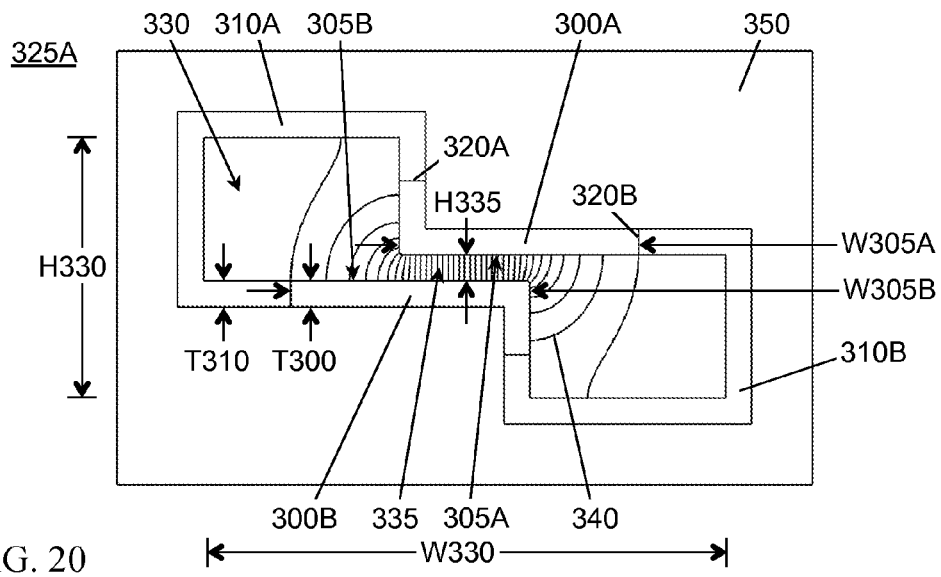
FIG. 20 is an end view of a gap-mode waveguide embodiment having an offset-plate-like gap mode according to EXAMPLE 7, showing gap-mode electric-field lines in the interior region.

This example describes a gap-mode waveguide embodiment having an offset-plate-like gap mode. The materials, construction, and operation described in EXAMPLE 1 may be applied to the present example. FIG. 20 shows an end view at a port 325A of a gap-mode waveguide embodiment according to the present example, including gap-mode electric field lines 340. Two conductor walls, 300A and 300B, and two absorber walls, 310A and 310B, form the sides of the tubular waveguide. An interior gap 335 in the interior region 330 is formed between conductor walls proximate interior surface portions, 305A and 305B. The conductor walls proximate interior surface portions, 305A and 305B, are generally parallel, and are offset in the width dimension. The corners of the conductor walls, 300A and 300B, that are convex in the interior region 330 have non-essential radii to reduce concentrations of the proximate electric field and power. The conductor walls thickness T300 and the absorber walls thickness T310 are preferably at least one skin depth at the multimode cutoff. An exterior mechanical support structure or structural frame 350 may provide additional mechanical support.

The materials of the EXAMPLE 7 gap-mode waveguide embodiment are the same as those of the baseline EXAMPLE 1 embodiment. The EXAMPLE 7 gap-mode waveguide embodiment structural frame 350 exterior dimensions are 5 mm high by 8 mm wide. The interior region width and height, W330 and H330, are 6 mm and 3 mm. The interior gap height H335 is 0.30 mm, and the interior gap 335 is centered horizontally and vertically within the interior region 330. The conductor walls proximate interior surface portions, 305A and 305B, are each 2.75 mm wide, including the 0.05-mm corner radius, and they are horizontally offset such that they are directly facing over a width of 1.5 mm. The conductor walls thickness T300 and the absorber walls thickness T310 are each about 0.3 mm. The vertical conductor-absorber wall junctures 320A are 0.5 mm inward from the upper and lower interior surfaces of the absorber walls, 310A and 310B. The horizontal conductor-absorber wall junctures 320B are 0.5 mm inward from the rightmost and leftmost interior surfaces of the absorber walls, 310B and 310A. The length of the waveguide in the propagation direction is 1 m. Port 325A and the port at the other end are substantially planar and orthogonal to the propagation direction.

Figure 21A:
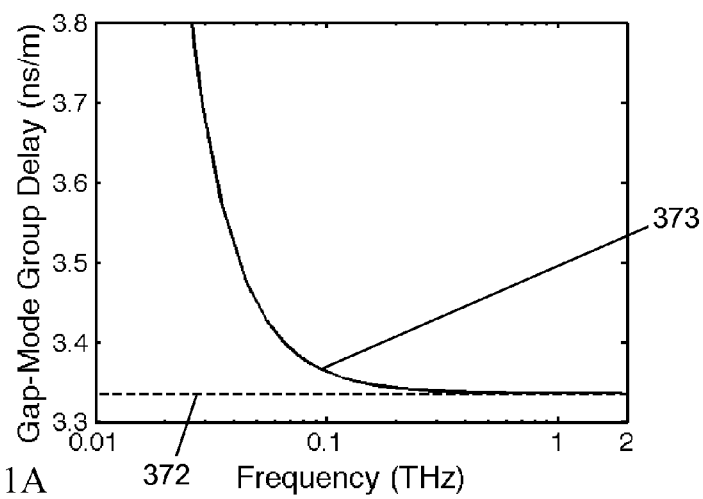
FIG. 21A is a plot of calculated gap-mode group delay versus frequency of a gap-mode waveguide embodiment according to EXAMPLE 7.

The EXAMPLE 7 gap-mode waveguide embodiment has a single-mode range of about 13 GHz to about 57 GHz, where only the gap mode propagates. The multimode cutoff is thus about 57 GHz. The gap-mode effective characteristic impedance is close to 50 ohms real impedance from 30 GHz to 2 THz. A gap-mode group delay trace 373 plotted versus frequency along with a dashed speed of light limit trace 372 in FIG. 21A shows dispersion is sufficiently low to allow good-fidelity terahertz-bandwidth pulse transmission over meter-scale distances.

Figure 21B:
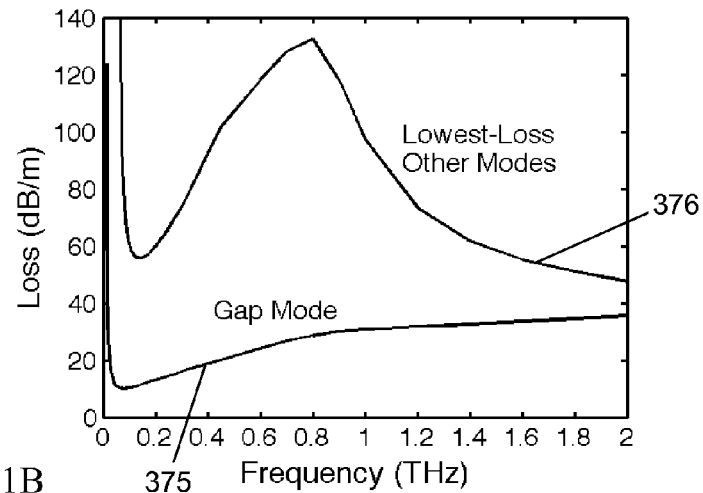
FIG. 21B is a plot of calculated gap-mode and lowest-loss other modes losses versus frequency of the gap-mode waveguide embodiment according to EXAMPLE 7.

A calculated gap-mode loss trace 375 and a lowest-loss other modes (LLO modes) loss trace 376 of the EXAMPLE 7 gap-mode waveguide embodiment are plotted together versus frequency in FIG. 21B. The gap-mode loss is less than 36 dB/m over the frequency range from 18 GHz to 2 THz, which is acceptable for meter-scale transmission distances in many applications. The LLO-modes loss is greater than the gap-mode loss over a mode-selective frequency range from roughly 57 GHz to greater than 2.0 THz.

Gap-mode waveguide bends, twists, and tapers may be constructed as variations of the present example. Gap-mode waveguide straight, bend, twist, or taper sections, or variations or guided-wave circuit components derived therefrom may be connected in various ways to form myriad circuits.

EXAMPLE 8

FIGS. 22-23B

Figure 22:
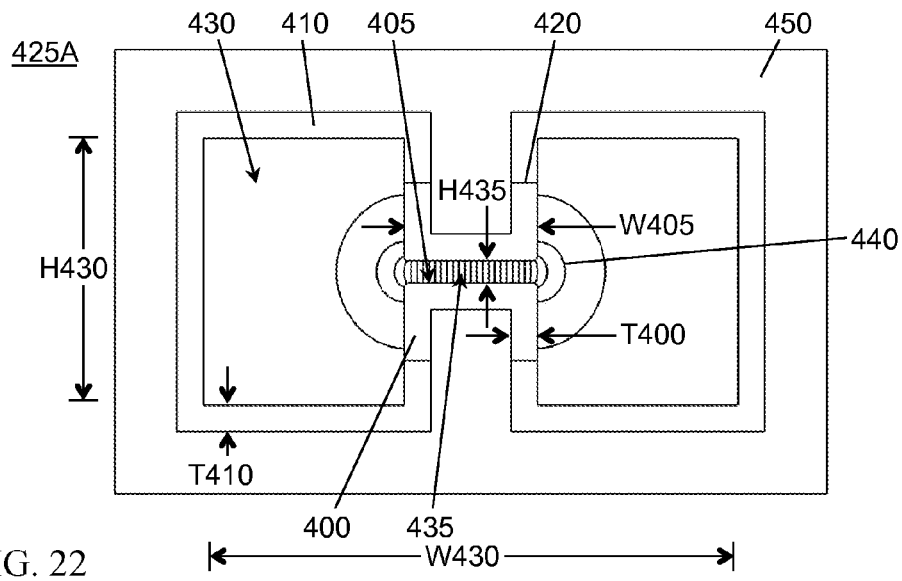
FIG. 22 is an end view of a gap-mode waveguide embodiment having a parallel-plate-like gap mode according to EXAMPLE 8, showing gap-mode electric-field lines in the interior region.

This example describes a gap-mode waveguide embodiment having a parallel-plate-like gap mode. The materials, construction, and operation described in EXAMPLE 1 may be applied to the present example. FIG. 22 shows an end view at a port 425A of a gap-mode waveguide embodiment according to the present example, including gap-mode electric field lines 440. Two conductor walls 400 and two absorber walls 410 form the sides of the tubular waveguide. An interior gap 435 in the interior region 430 is formed between conductor walls proximate interior surface portions 405. The conductor walls proximate interior surface portions 405 are generally parallel, equal in width, and aligned. The corners of the conductor walls 400 that are convex in the interior region 430 have non-essential radii to reduce concentrations of the proximate electric field and power. The conductor walls thickness T400 and the absorber walls thickness T410 are preferably at least one skin depth at the multimode cutoff. An exterior mechanical support structure or structural frame 450 may provide additional mechanical support.

The materials of the EXAMPLE 8 gap-mode waveguide embodiment are the same as those of the baseline EXAMPLE 1 embodiment. The EXAMPLE 8 gap-mode waveguide embodiment structural frame 450 exterior dimensions are 5 mm high by 8 mm wide. The interior region width and height, W430 and H430, are 6 mm and 3 mm. The interior gap height H435 is 0.25 mm, and the interior gap 435 is centered horizontally and vertically within the interior region 430. The conductor walls gap-facing width W405 is 1.5 mm, including the 0.05-mm corner radii. The conductor walls thickness T400 and the absorber walls thickness T410 are each about 0.3 mm. The conductor-absorber wall junctures 420 are 0.5 mm inward from the upper and lower interior surfaces of the absorber walls 410. The length of the waveguide in the propagation direction is 1 m. Port 425A and the port at the other end are substantially planar and orthogonal to the propagation direction.

Figure 23A:
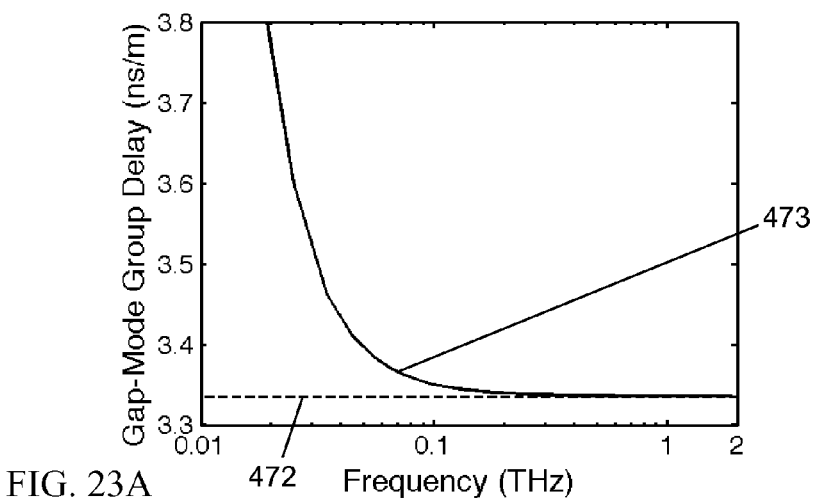
FIG. 23A is a plot of calculated gap-mode group delay versus frequency of a gap-mode waveguide embodiment according to EXAMPLE 8.

The EXAMPLE 8 gap-mode waveguide embodiment has a single-mode range of about 10 GHz to about 47 GHz, where only the gap mode propagates. The multimode cutoff is thus about 47 GHz. The gap-mode effective characteristic impedance is close to 50 ohms real impedance from 20 GHz to 2 THz. A gap-mode group delay trace 473 plotted versus frequency along with a dashed speed of light limit trace 472 in FIG. 23A shows dispersion is sufficiently low to allow good-fidelity terahertz-bandwidth pulse transmission over meter-scale distances.

Figure 23B:
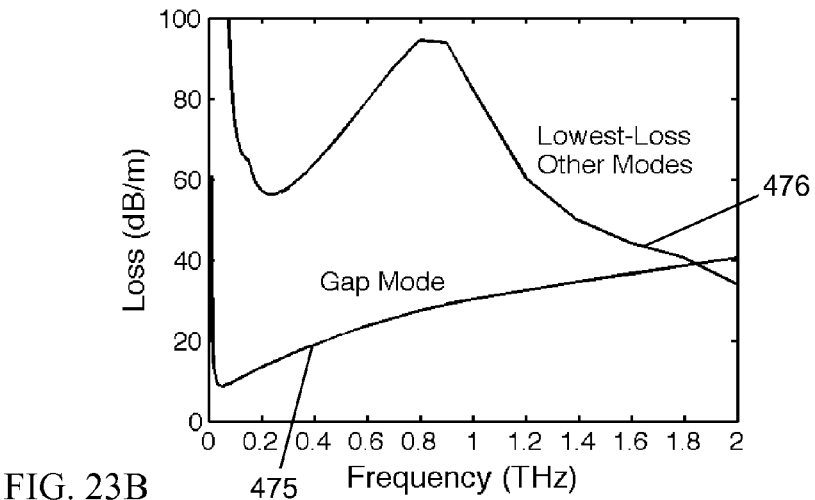
FIG. 23B is a plot of calculated gap-mode and lowest-loss other modes losses versus frequency of the gap-mode waveguide embodiment according to EXAMPLE 8.

A calculated gap-mode loss trace 475 and a lowest-loss other modes (LLO modes) loss trace 476 of the EXAMPLE 8 gap-mode waveguide embodiment are plotted together versus frequency in FIG. 23B. The gap-mode loss is less than 41 dB/m over the frequency range from 11 GHz to 2 THz, which is acceptable for meter-scale transmission distances in many applications. The LLO-modes loss is greater than the gap-mode loss over a mode-selective frequency range from roughly 47 GHz to about 1.8 THz.

Gap-mode waveguide bends, twists, and tapers may be constructed as variations of the present example. Gap-mode waveguide straight, bend, twist, or taper sections, or variations or guided-wave circuit components derived therefrom may be connected in various ways to form myriad circuits.

EXAMPLE 9

FIGS. 24-25B

Figure 24:
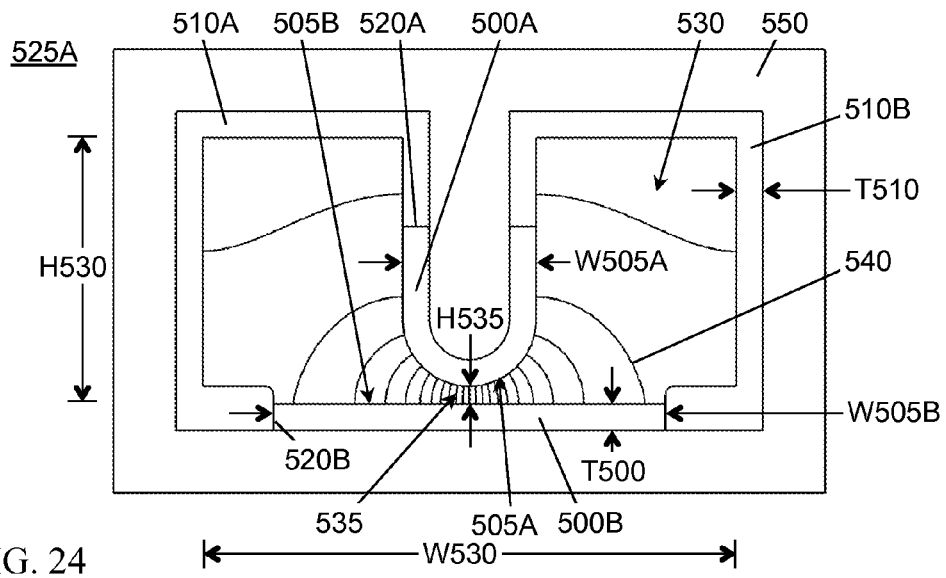
FIG. 24 is an end view of a gap-mode waveguide embodiment having an intensifying-field gap mode according to EXAMPLE 9, showing gap-mode electric-field lines in the interior region.

This example describes a gap-mode waveguide embodiment having an intensifying-field pattern gap mode. The materials, construction, and operation described in EXAMPLE 1 may be applied to the present example. FIG. 24 shows an end view at a port 525A of a gap-mode waveguide embodiment according to the present example, including gap-mode electric field lines 540. Two conductor walls, 500A and 500B, and two absorber walls, 510A and 510B, form the sides of the tubular waveguide. An interior gap 535 in the interior region 530 is formed between conductor walls proximate interior surface portions, 505A and 505B.

The upper conductor wall proximate interior surface portion 505A includes a curve in the vicinity of the interior gap 535 that is convex in the interior region 530. The upper conductor wall proximate interior surface portion 505A may include any curve that provides the prescribed field, including but not limited to circular or parabolic paths. The lower conductor wall proximate interior surface portion 505B is approximately planar. The corners of the absorber walls, 510A and 510B, that are convex in the interior region 530 have non-essential radii to reduce concentrations of the proximate electric field and power. The conductor walls thickness T500 and the absorber walls thickness T510 are preferably at least one skin depth at the multimode cutoff. An exterior mechanical support structure or structural frame 550 may provide additional mechanical support.

The gap mode of the EXAMPLE 9 gap-mode waveguide embodiment has a field pattern that intensifies due to the upper conductor wall proximate interior surface portion 505A curve, so it is termed an intensifying-field gap mode. Similar effects may occur when a conductor wall comes to an apex or sharp edge, as opposed to a convex curve, in the vicinity of the interior gap, or when both conductor walls are curved or sharp in the vicinity of the interior gap. Conversely, a field-expanding gap mode or gap-mode portion may occur when a conductor wall curve is concave in the vicinity of the gap. A radial pattern in a region may be produced by conductor walls having concentric curve interior surfaces in the vicinity of the gap, one convex and the other concave as in a sector of a coaxial transmission line cross-section.

The materials of the EXAMPLE 9 gap-mode waveguide embodiment are the same as those of the baseline EXAMPLE 1 embodiment. The EXAMPLE 9 gap-mode waveguide embodiment structural frame 550 exterior dimensions are 5 mm high by 8 mm wide. The interior region width and height, W530 and H530, are 6 mm and 3 mm. The conductor walls thickness T500 and the absorber walls thickness T510 are each about 0.3 mm, except for the lower horizontal portions of the absorber walls, 510B and 510A, where the absorber walls thickness T510 is 0.5 mm. The upper conductor wall proximate interior surface portion 505A includes a semicircular curve, having a radius of 0.75 mm. The upper conductor wall gap-facing width W505A is twice the radius, 1.5 mm. The interior gap height H535 is 0.20 mm at the center of the interior gap 535, which is centered horizontally within the interior region 530. Lower interior surface portions of the absorber walls, 510B and 510A, are substantially coplanar and 0.20 mm above the plane of the lower conductor wall proximate interior surface portion 505B. The upper conductor-absorber wall junctures 520A are 1.0 mm down from the upper interior surfaces of the absorber walls, 510A and 510B. The lower conductor-absorber wall junctures 520B are 0.8 mm inward from the rightmost and leftmost interior surfaces of the absorber walls, 510B and 510A. The length of the waveguide in the propagation direction is 1 m. Port 525A and the port at the other end are substantially planar and orthogonal to the propagation direction.

Figure 25A:
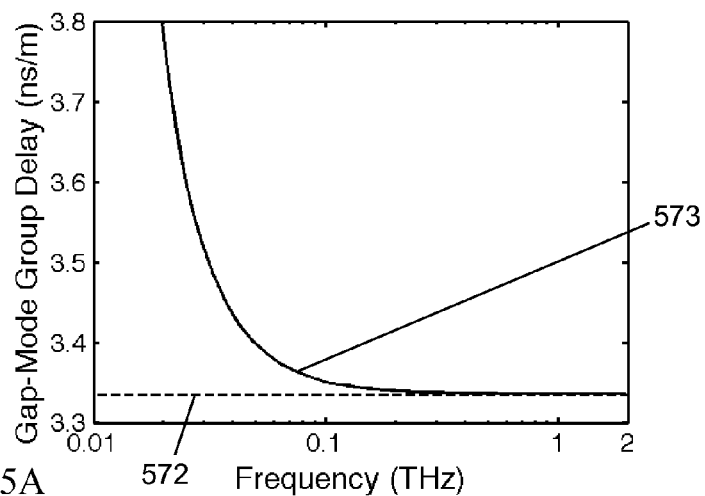
FIG. 25A is a plot of calculated gap-mode group delay versus frequency of a gap-mode waveguide embodiment according to EXAMPLE 9.

The EXAMPLE 9 gap-mode waveguide embodiment has a single-mode range of about 10 GHz to about 47 GHz, where only the gap mode propagates. The multimode cutoff is thus about 47 GHz. The gap-mode effective characteristic impedance is close to 50 ohms real impedance from 20 GHz to 2 THz. A gap-mode group delay trace 573 plotted versus frequency along with a dashed speed of light limit trace 572 in FIG. 25A shows dispersion is sufficiently low to allow good-fidelity terahertz-bandwidth pulse transmission over meter-scale distances.

Figure 25B:
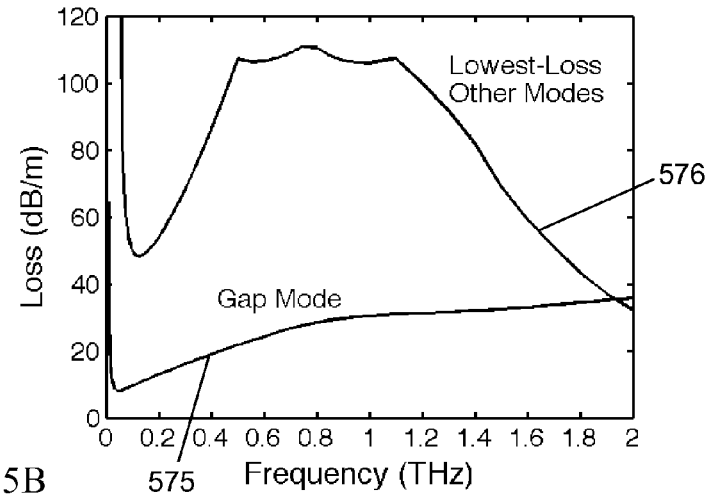
FIG. 25B is a plot of calculated gap-mode and lowest-loss other modes losses versus frequency of the gap-mode waveguide embodiment according to EXAMPLE 9.

A calculated gap-mode loss trace 575 and a lowest-loss other modes (LLO modes) loss trace 576 of the EXAMPLE 9 gap-mode waveguide embodiment are plotted together versus frequency in FIG. 25B. The gap-mode loss is less than 36 dB/m over the frequency range from 12 GHz to 2 THz, which is acceptable for meter-scale transmission distances in many applications. The LLO-modes loss is greater than the gap-mode loss over a mode-selective frequency range from roughly 47 GHz to about 1.9 THz.

Gap-mode waveguide bends, twists, and tapers may be constructed as variations of the present example. Gap-mode waveguide straight, bend, twist, or taper sections, or variations or guided-wave circuit components derived therefrom may be connected in various ways to form myriad circuits.

EXAMPLE 10

FIGS. 26-27B

Figure 26:
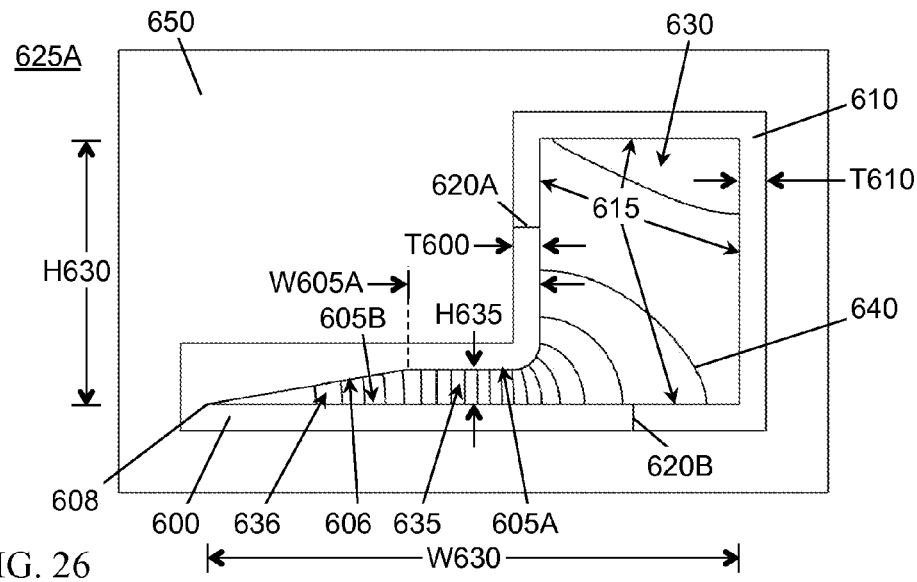
FIG. 26 is an end view of a gap-mode waveguide embodiment having a single conductor and single absorber according to EXAMPLE 10, showing gap-mode electric-field lines in the interior region.

This example describes a gap-mode waveguide embodiment having a single conductor and single absorber. The materials, construction, and operation described in EXAMPLE 1 may be applied to the present example except as described differently below. FIG. 26 shows an end view at a port 625A of a gap-mode waveguide embodiment according to the present example, including gap-mode electric field lines 640. A conductor wall 600 and an absorber wall 610 form the sides of the tubular waveguide. An interior gap 635 in the interior region 630 is formed between conductor wall proximate parallel interior surface portions, 605A and 605B.

A transverse termination is implemented by a wedge-shape side taper 636 in the interior region 630 adjacent to the interior gap 635. A conductor wall proximate slanted interior surface portion 606 and the lower conductor wall proximate parallel interior surface portion 605B form an acute angle and meet at a conductor wall acute corner 608, demarcating boundaries of the side taper 636. The current magnitude in the conductor wall 600 goes to zero approximately at the conductor wall acute corner 608. A portion of the side taper 636 also condenses the gap mode similarly to the interior gap 635, and may be considered to be an extension of the interior gap 635.

The transverse termination may be understood by analyzing the waveguide transversely, in cross-section, as is done in the transverse resonance method, for example. The side taper 636 allows essentially a truncated waveguide cross-section, reducing interior region 630 area and obviating the need for a second absorber. The side taper 636 inhibits certain low-loss higher order modes having electric field portions in the interior gap 635 parallel to the conductor wall proximate parallel interior surface portions, 605A and 605B, as compared to an abrupt or non-tapered transverse short, increasing the mode-selective frequency range.

The corners of the conductor wall 600 that are convex in the interior region 630 have non-essential radii to reduce concentrations of the proximate electric field and power. The conductor wall thickness T600 and the absorber wall thickness T610 are preferably at least one skin depth at the multimode cutoff. An exterior mechanical support structure or structural frame 650 may provide additional mechanical support.

The materials of the EXAMPLE 10 gap-mode waveguide embodiment are the same as those of the baseline EXAMPLE 1 embodiment. The EXAMPLE 10 gap-mode waveguide embodiment structural frame 650 exterior dimensions are 5 mm high by 8 mm wide. The interior region width and height, W630 and H630, are 6 mm and 3 mm. The interior gap height H635 is 0.39 mm. The upper conductor wall parallel gap-facing width W605A is about 1.5 mm, including a 0.30 mm radius. The upper conductor wall proximate parallel interior surface portion 605A is centered horizontally in the interior region 630. The conductor wall proximate slanted interior surface portion 606 slopes linearly from the upper conductor wall proximate parallel interior surface portion 605A to the lower conductor wall proximate parallel interior surface portion 605B over a horizontal distance of 2.25 mm. The conductor wall thickness T600 and the absorber wall thickness T610 are each about 0.3 mm except in the vicinity of the side taper 636, where a portion of the conductor wall 600 is thicker. The upper conductor-absorber wall juncture 620A is 1.0 mm down from the upper leftmost interior surface of the absorber wall 610. The lower conductor-absorber wall juncture 620B is 1.2 mm inward from the lower rightmost interior surface of the absorber wall 610. The length of the waveguide in the propagation direction is 1 m. Port 625A and the port at the other end are substantially planar and orthogonal to the propagation direction.

Figure 27A:
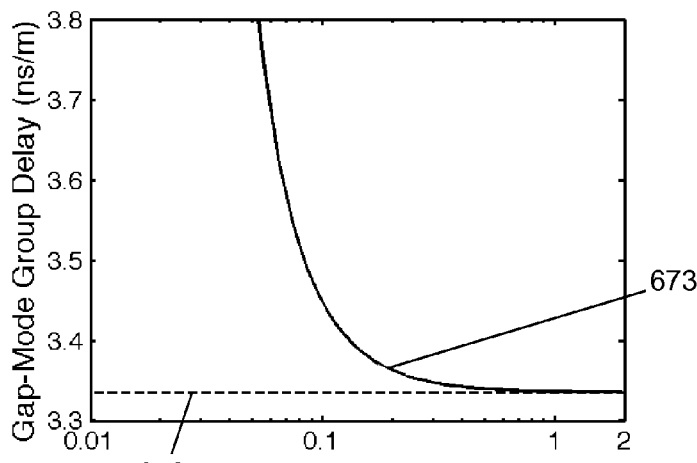
FIG. 27A is a plot of calculated gap-mode group delay versus frequency of a gap-mode waveguide embodiment according to EXAMPLE 10.

The EXAMPLE 10 gap-mode waveguide embodiment has a single-mode range of about 26 GHz to about 49 GHz, where only the gap mode propagates. The multimode cutoff is thus about 49 GHz. In the present example, the gap-mode effective characteristic impedance is defined as the line integral of the electric field across the interior gap 635, approximately at the center of the upper conductor wall proximate parallel interior surface portion 605A, divided by the current in the propagation direction in the upper portion of the conductor wall 600 starting at the conductor wall acute corner 608. The gap-mode effective characteristic impedance is close to 50 ohms real impedance from 60 GHz to 2 THz. A calculated gap-mode group delay trace 673 plotted versus frequency along with a dashed speed of light limit trace 672 in FIG. 27A shows dispersion is sufficiently low to allow good-fidelity terahertz-bandwidth pulse transmission over tens of centimeters.

Figure 27B:
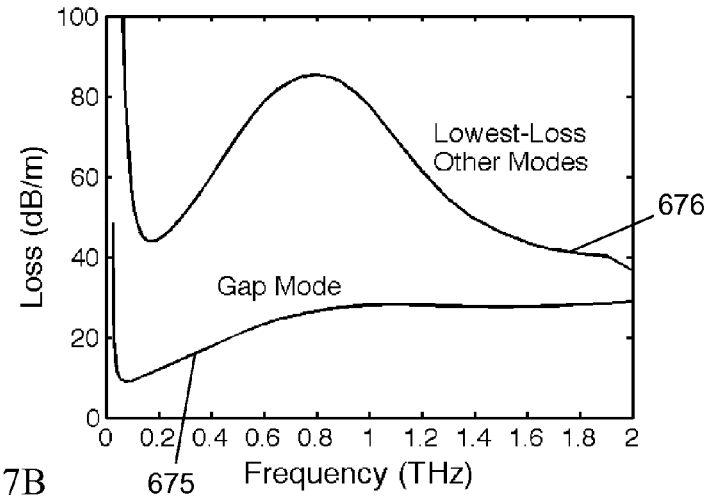
FIG. 27B is a plot of calculated gap-mode and lowest-loss other modes losses versus frequency of the gap-mode waveguide embodiment according to EXAMPLE 10.

A calculated gap-mode loss trace 675 and a lowest-loss other modes (LLO modes) loss trace 676 of the EXAMPLE 10 gap-mode waveguide embodiment are plotted together versus frequency in FIG. 27B. The gap-mode loss is less than 29 dB/m over the frequency range from 28 GHz to 2 THz, which is acceptable for meter-scale transmission distances in many applications. The LLO-modes loss is greater than the gap-mode loss over a mode-selective frequency range from roughly 49 GHz to greater than 2.0 THz.

Accordingly, from the above description and with reference to FIGS. 26 and 27B, it is evident that the gap mode may be propagated in a multimode range in a conductive tubular electromagnetic waveguide with lesser attenuation than all other propagating modes by condensing the gap mode by the interior gap 635, where the interior gap 635 is between the conductor wall proximate interior surface portions, 605A, 605B, and 606; and by absorbing electromagnetic energy in the absorber wall 610, which includes an absorber wall interior surface 615 that is adjacent the interior region 630.

Gap-mode waveguide bends, twists, and tapers may be constructed as variations of the present example. Gap-mode waveguide straight, bend, twist, or taper sections, or variations or guided-wave circuit components derived therefrom may be connected in various ways to form myriad circuits.

EXAMPLE 11

FIGS. 28-29B

This example describes a gap-mode waveguide embodiment having discrete absorbers. One or more discrete absorbers may be used in lieu of absorber walls, similarly dissipating electromagnetic energy in the interior region away from the gap mode. The materials, construction, and operation described in EXAMPLE 1 may be applied to the present example except as described differently below.

Figure 28:
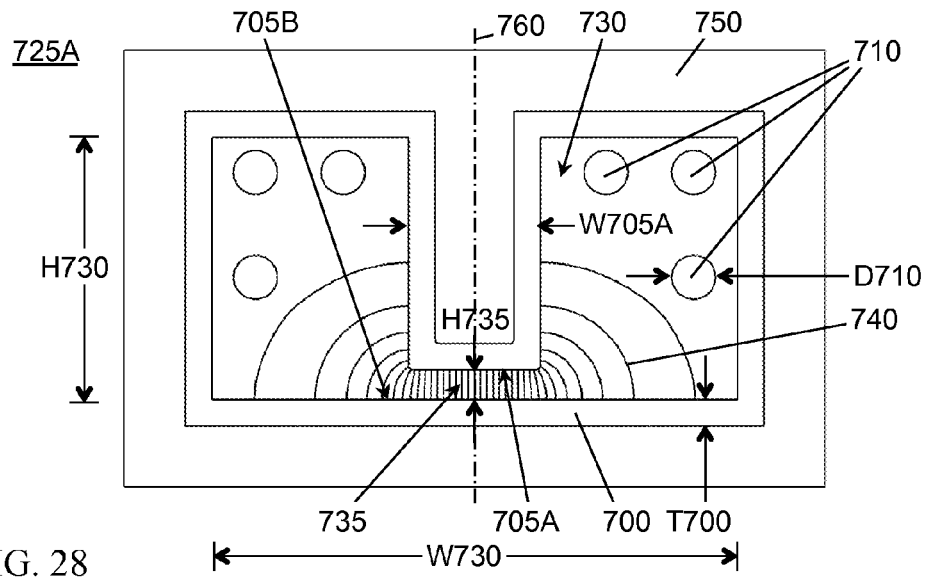
FIG. 28 is an end view of a gap-mode waveguide embodiment having discrete absorbers according to EXAMPLE 11, showing gap-mode electric-field lines in the interior region.

FIG. 28 shows an end view at a port 725A of a gap-mode waveguide embodiment according to the present example, including gap-mode electric field lines 740. A conductor wall 700 forms the sides of the tubular waveguide. The conductor wall thickness T700 is preferably at least one skin depth at the multimode cutoff. An interior gap 735 in the interior region 730 is formed between conductor wall proximate interior surface portions, 705A and 705B. The conductor wall proximate interior surface portions, 705A and 705B, are generally parallel, and the upper conductor wall proximate interior surface portion 705A is narrower than the lower conductor wall proximate interior surface portion 705B. The corners of the conductor wall 700 that are convex in the interior region 730 have non-essential radii to reduce concentrations of the proximate electric field and power. An exterior mechanical support structure or structural frame 750 may provide additional mechanical support.

Discrete absorbers 710 serve as the absorber and may be of any material that dissipates electromagnetic energy over the bandwidth of interest. Discrete absorbers 710 are placed within the interior region 730 such that they attenuate other modes while having only minor effect on the gap mode. Each element of the discrete absorbers 710 may be of materials and construction previously described for absorber walls, 110A and 110B, in EXAMPLE 1. An element of the discrete absorbers 710 may include a structural material, in which case an absorber material may cover the structural material surface. While the discrete absorbers 710 are of constant cross-section with propagation distance in the present example embodiment, they may have varying cross-section with propagation distance, including discontinuities. The discrete absorbers diameter D710, or an equivalent thickness, is preferably at least one skin depth at the multimode cutoff.

The discrete absorbers 710 are supported at prescribed locations along the waveguide by structural support elements or brackets. The brackets may be of any material having appropriate mechanical properties compatible with the overall waveguide construction. TEM "discrete absorber modes" are associated with the gaps between the discrete absorbers 710 and the conductor wall 700. The discrete absorber modes, in addition to the gap mode, are also considered dominant modes. The discrete absorber modes generally have high loss relative to the gap mode and furthermore may be shorted by conductive support brackets.

The relationship between the gap-mode electric field and the configuration of the discrete absorbers 710 affords insight into the interactions of the waveguide modes with the waveguide, and informs design of the modal propagation characteristics. The interior gap 735 principally condenses the gap mode, which is represented by the gap-mode electric field lines 740. Most of the energy of the gap mode is in or near the interior gap 735, and the conductor wall 700 largely guides the gap mode with relatively low loss. Other propagating modes may not be as effectively condensed by the interior gap 735 as is the gap mode. In a gap-mode waveguide embodiment at some frequency, greater fractions of the energies of all other propagating modes may not be in or near the interior gap 735 as compared to the gap mode. All other propagating modes may have greater intersection with the discrete absorbers 710, and suffer greater loss than does the gap mode.

The configuration of the discrete absorbers 710 largely determines the attenuations of the modes. When the discrete absorbers 710 are configured in such a way that the gap mode propagates with lesser attenuation than do all other propagating modes substantially above the multimode cutoff, a gap-mode waveguide embodiment is realized. The configuration of the discrete absorbers 710 may be described by the materials, quantity, sizes, shapes, and locations of the discrete absorbers 710 relative to the interior gap 735. Arranging the discrete absorbers 710 far from the interior gap 735 and in regions of relatively low gap-mode electric field may result in a higher mode-discrimination ratio compared to the same waveguide absent the discrete absorbers 710. Arranging the discrete absorbers 710 in the interior gap 735 may result in high loss for the gap mode and a mode-discrimination ratio of less than one. The gap-mode waveguide may be optimized for mode-discrimination ratio in between these extremes, and in such case, usually, the discrete absorbers 710 are relatively far from the gap 735, as depicted in FIG. 28. This and other optimizations may be accomplished as part of design calculations as described in EXAMPLE 1.

Thus, according to the above description, the gap mode may be propagated in a multimode range in a conductive tubular electromagnetic waveguide with lesser attenuation than all other propagating modes by condensing the gap mode by the interior gap 735, where the interior gap 735 is between the conductor wall proximate interior surface portions, 705A and 705B; and by dissipating electromagnetic energy in the discrete absorbers 710 away from the gap mode, as may be characterized by the gap-mode electric field lines 740.

The materials of the EXAMPLE 11 gap-mode waveguide embodiment are the same as those of the baseline EXAMPLE 1 embodiment with the discrete absorbers 710 materials being the same as those of the absorber walls, 110A and 110B. The EXAMPLE 11 gap-mode waveguide embodiment structural frame 750 exterior dimensions are 5 mm high by 8 mm wide. The interior region width and height, W730 and H730, are 6 mm and 3 mm. The interior gap height H735 is 0.34 mm, and the interior gap 735 is centered horizontally within the interior region 730. The upper conductor wall gap-facing width W705A is 1.5 mm, including the two 0.05-mm corner radii. The conductor wall thickness T700 is about 0.3 mm.

The discrete absorbers 710 are six cylinders of circular cross-section having diameters of 0.5 mm and principal axes generally parallel to the propagation direction. The centers of the discrete absorbers 710 are located relative to the upper left interior corner at (0.5, −0.4), (1.5, −0.4), and (0.5, −1.6), (mm) on left side, and reflected across the waveguide cross-section vertical line of symmetry 760 on the right side. The length of the waveguide in the propagation direction is 1 m. Port 725A and the port at the other end are substantially planar and orthogonal to the propagation direction.

Figure 29A:
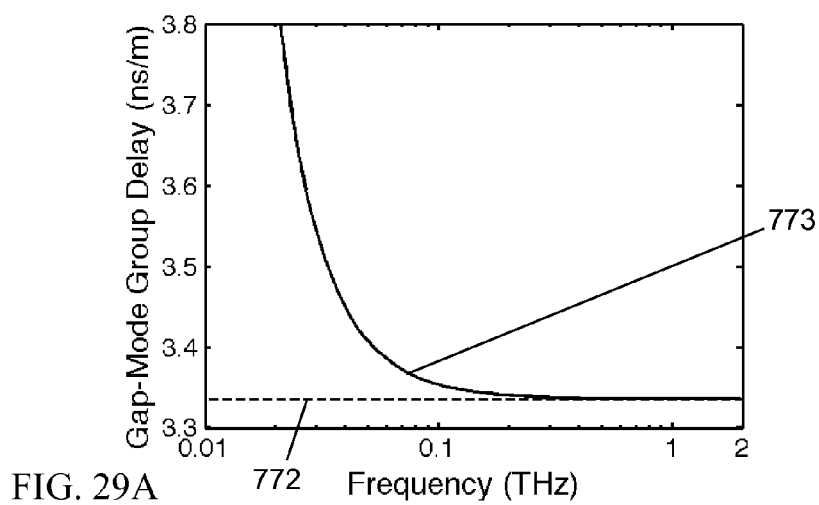
FIG. 29A is a plot of calculated gap-mode group delay versus frequency of a gap-mode waveguide embodiment according to EXAMPLE 11.

The EXAMPLE 11 gap-mode waveguide embodiment has a gap-mode cutoff frequency of about 11 GHz. The multimode cutoff is about 46 GHz. The gap-mode effective characteristic impedance is close to 50 ohms real impedance from 24 GHz to 2 THz. A gap-mode group delay trace 773 plotted versus frequency along with a dashed speed of light limit trace 772 in FIG. 29A shows dispersion is sufficiently low to allow good-fidelity terahertz-bandwidth pulse transmission over meter-scale distances.

Figure 29B:
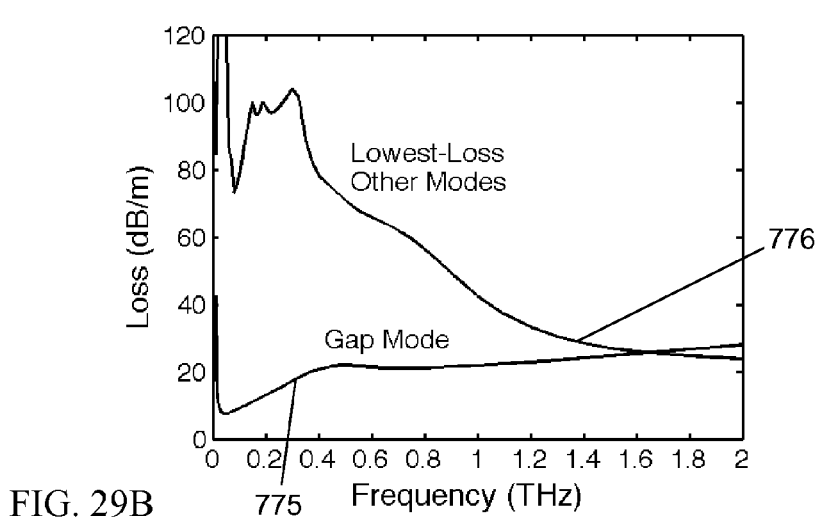
FIG. 29B is a plot of calculated gap-mode and lowest-loss other modes losses versus frequency of the gap-mode waveguide embodiment according to EXAMPLE 11.

A calculated gap-mode loss trace 775 and a lowest-loss other modes (LLO modes) loss trace 776 of the EXAMPLE 11 gap-mode waveguide embodiment are plotted together versus frequency in FIG. 29B. All of the discrete absorber modes propagate with greater attenuation than do the lowest-loss other modes substantially above the multimode cutoff. The gap-mode loss is less than 28 dB/m over the frequency range from 13 GHz to 2 THz, which is acceptable for meter-scale transmission distances in many applications. The LLO-modes loss is greater than the gap-mode loss over a mode-selective frequency range from roughly 46 GHz to about 1.6 THz.

Gap-mode waveguide bends, twists, and tapers may be constructed as variations of the present example. Gap-mode waveguide straight, bend, twist, or taper sections, or variations or guided-wave circuit components derived therefrom may be connected in various ways to form myriad circuits.

A discrete absorber or absorbers may be employed in various gap-mode waveguide geometries, including the gap-mode waveguides having microstrip-like, offset-plate-like, parallel-plate-like, and intensifying-field pattern gap modes presented thus far, and in the examples to follow. A discrete absorber or absorbers may be used in place of or in addition to absorber walls.

EXAMPLE 12

FIGS. 30-31B

Figure 30:
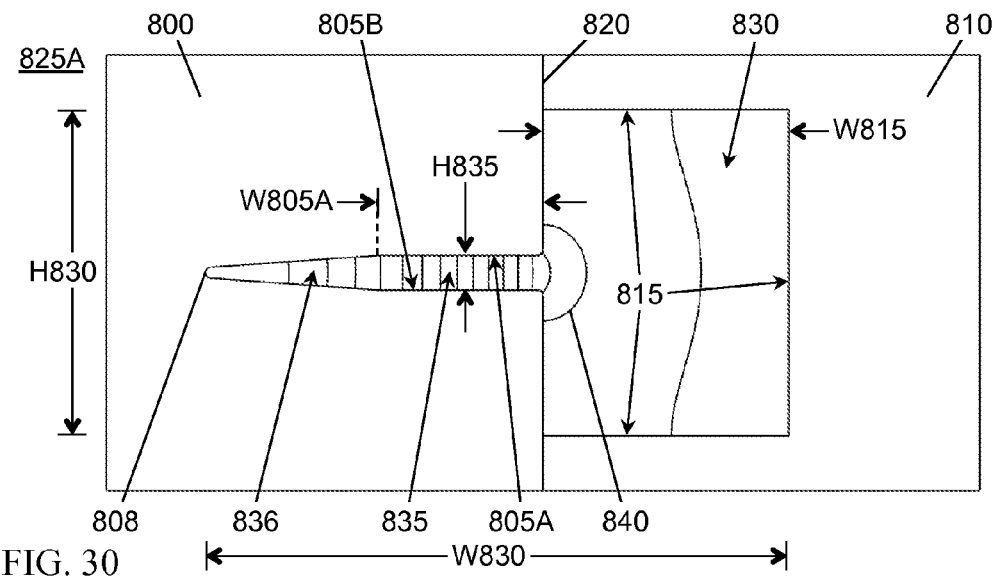
FIG. 30 is an end view of a small gap-mode waveguide embodiment having a single conductor and single absorber according to EXAMPLE 12, showing gap-mode electric-field lines in the interior region.

This example describes a gap-mode waveguide embodiment having a single conductor wall, single absorber wall, and a planar conductor-absorber wall interface. The materials, construction, and operation described in EXAMPLE 1 may be applied to the present example except as described differently below. FIG. 30 shows an end view at a port 825A of a gap-mode waveguide embodiment according to the present example, including gap-mode electric field lines 840. A conductor wall 800 and an absorber wall 810 form the sides of the tubular waveguide. An interior gap 835 in the interior region 830 is formed between conductor wall proximate parallel interior surface portions, 805A and 805B. A portion of a side taper 836 also condenses the gap mode similarly to the interior gap 835, and may be considered to be an extension of the interior gap 835. The corners of the conductor wall 800 that are convex in the interior region 830 have non-essential radii to reduce concentrations of the proximate electric field and power. A radius of the conductor wall acute corner 808 at the end of the side taper 836 disperses mechanical stress and eases fabrication as compared to a sharp corner.

This embodiment has features that facilitate microfabrication and assembly. Features also support integrated waveguide circuits or systems that may also include guided-wave circuit components and auxiliary circuits. A planar conductor-absorber wall interface 820, facilitates fabrication of separate conductor wall 800 and absorber wall 810 pieces in planar processes. The transverse alignment of the conductor wall 800 and absorber wall 810 may not be not critical, facilitating low-cost assembly. The principle electric field polarization is parallel to the conductor-absorber wall interface 820 plane, providing for low-loss E-plane bends.

The conductor wall 800 and the absorber wall 810 are fabricated from wafers. Alternatively, any piece of appropriate material having a substantially planar surface may be used. The interior gap 835 and side taper 836 are formed by etching in a planar surface of an aluminum wafer. Similarly, absorber wall interior surfaces 815 are formed by etching in a planar surface of a doped silicon wafer having conductivity of about $10^4$ S/m. Alternatively, other suitable materials and methods known in the arts of metal fabrication, microfabrication, or semiconductor processing or as previously described may be used to form the respective portions of the interior region 830. The conductor wall 800 and the absorber wall 810 may alternatively be coated onto structural frame pieces formed and later assembled as described.

The conductor wall 800 and absorber wall 810 are assembled to form a waveguide by aligning and fixing by diffusion bonding. Alternatively, other methods of attachment or bonding may be used as previously described. Multiple waveguides may be formed and interconnected in an assembly to produce integrated waveguide circuits or systems. The assembly may accommodate guided-wave circuit components coupled to the waveguides and that operate with the modes in the waveguides. The wafers may also accommodate auxiliary circuits that interface with and support the waveguide circuits.

The EXAMPLE 12 gap-mode waveguide embodiment exterior width of 0.8 mm is determined by the thicknesses of the wafers, 0.4 mm each, in the present example. The exterior height is 0.4 mm, and may be as large as the wafer extents. The interior region width and height, W830 and H830, are about 0.535 mm and 0.3 mm. The interior gap height H835 is 32 μm. The upper conductor wall parallel gap-facing width W805A is about 0.15 mm, including a 5 μm radius. The absorber wall interior surfaces width W815 is 0.225 mm. The radius of the conductor wall acute corner 808 is about 5 μm. The length of the waveguide in the propagation direction is 10 mm. Port 825A and the port at the other end are substantially planar and orthogonal to the propagation direction.

Figure 31A:
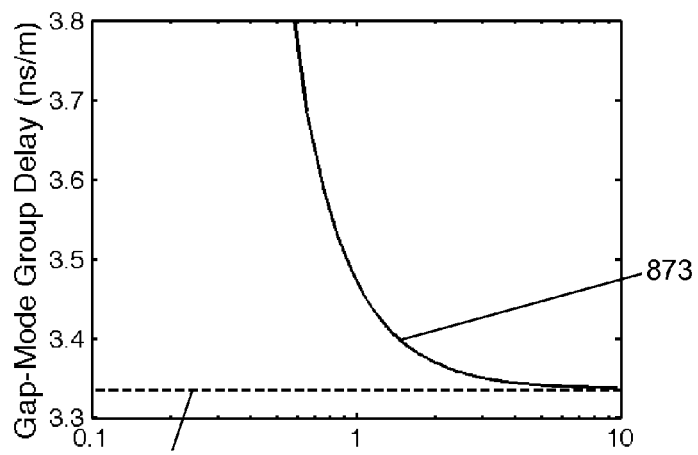
FIG. 31A is a plot of calculated gap-mode group delay versus frequency of a gap-mode waveguide embodiment according to EXAMPLE 12.

The EXAMPLE 12 gap-mode waveguide embodiment has a single-mode range of about 275 GHz to about 485 GHz, where only the gap mode propagates. The multimode cutoff is thus about 485 GHz. The gap-mode effective characteristic impedance in the present example is defined similarly as in EXAMPLE 10. The gap-mode effective characteristic impedance is close to 50 ohms real impedance from 0.67 THz to 10 THz. A calculated gap-mode group delay trace 873 plotted versus frequency along with a dashed speed of light limit trace 872 in FIG. 31A shows dispersion is sufficiently low to allow good-fidelity terahertz-bandwidth pulse transmission over distances of centimeters.

Figure 31B:
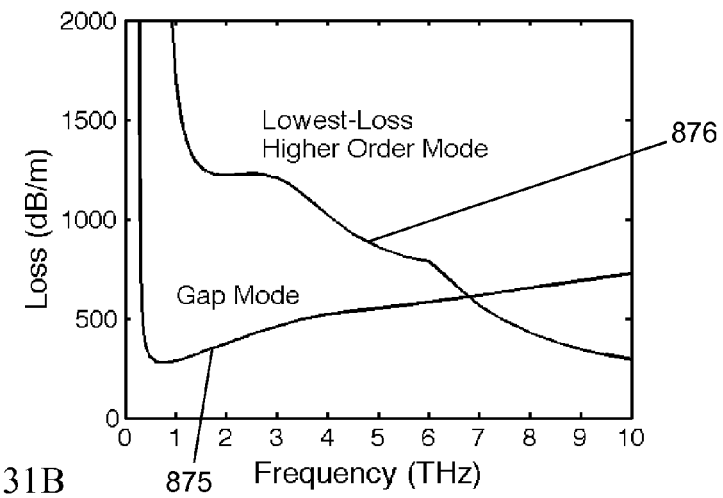
FIG. 31B is a plot of calculated gap-mode and lowest-loss other modes losses versus frequency of the gap-mode waveguide embodiment according to EXAMPLE 12.

A calculated gap-mode loss trace 875 and a lowest-loss other modes (LLO modes) loss trace 876 of the EXAMPLE 12 gap-mode waveguide embodiment are plotted together versus frequency in FIG. 31B. The gap-mode loss is less than 7 dB/cm over the frequency range from 0.3 THz to 9 THz, which is acceptable for several-centimeter transmission distances in many applications. The LLO-modes loss is greater than the gap-mode loss over a mode-selective frequency range from roughly 485 GHz to about 6.7 THz.

Gap-mode waveguide bends, twists, and tapers may be constructed as variations of the present example. Gap-mode waveguide straight, bend, twist, or taper sections, or variations or guided-wave circuit components derived therefrom may be connected in various ways to form myriad circuits.

EXAMPLE 13

FIGS. 32A-33C

This example describes a gap-mode waveguide embodiment having two substantially parallel interior gaps and supporting two gap modes. The materials, construction, and operation described in EXAMPLE 1 may be applied to the present example.

Figure 32A:
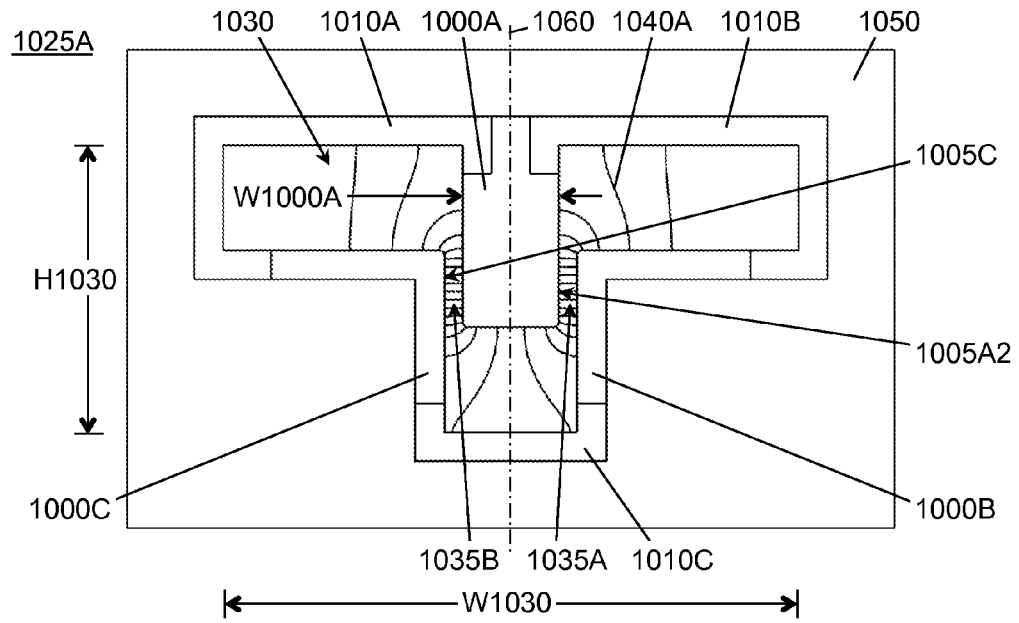
FIG. 32A is an end view of a gap-mode waveguide embodiment having two substantially parallel interior gaps and supporting two gap modes according to EXAMPLE 13, showing the even gap-mode electric-field lines in the interior region.
Figure 32B:
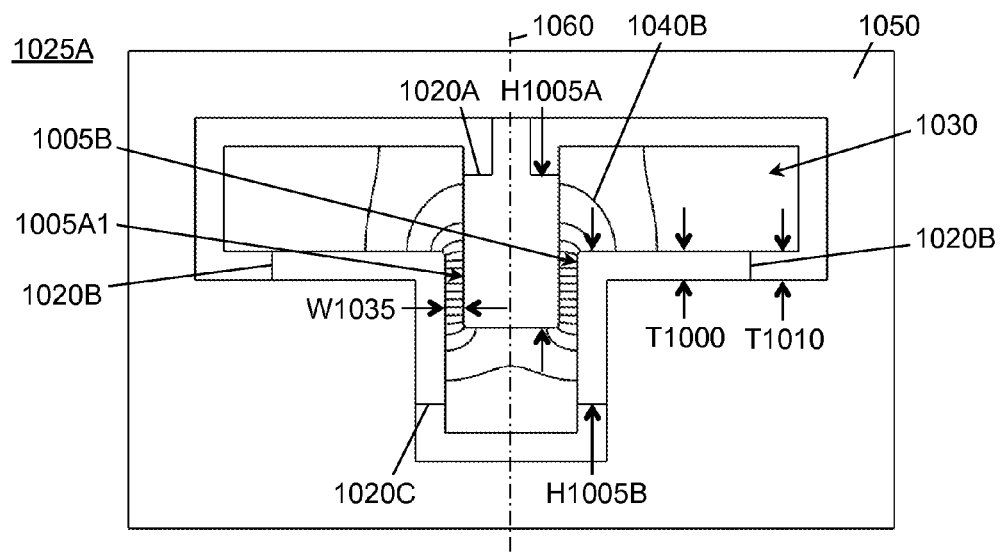
FIG. 32B is an end view of a gap-mode waveguide embodiment having two substantially parallel interior gaps and supporting two gap modes according to EXAMPLE 13, showing the odd gap-mode electric-field lines in the interior region.

FIGS. 32A and 32B show end views at a port 1025A of a gap-mode waveguide embodiment according to the present example. Three conductor walls, 1000A, 1000B, and 1000C, and three absorber walls, 1010A, 1010B, and 1010C, form the sides of the tubular waveguide. An interior gap 1035A in the interior region 1030 is formed between conductor walls proximate interior surface portions, 1005A2 and 1005B. An interior gap 1035B in the interior region 1030 is formed between conductor walls proximate interior surface portions, 1005A1 and 1005C. The conductor walls proximate interior surface portions, 1005A1, 1005A2, 1005B, and 1005C, are generally parallel. The corners of the conductor walls, 1000A, 1000B, and 1000C, that are convex in the interior region 1030 have non-essential radii to reduce concentrations of the proximate electric field and power. The conductor walls thickness T1000 and the absorber walls thickness T1010 are preferably at least one skin depth at the multimode cutoff. An exterior mechanical support structure or structural frame 1050 may provide additional mechanical support.

The two gap modes have the two lowest cutoff frequencies and may be identified as an even or common mode and an odd or differential mode. The even gap-mode electric field lines 1040A are plotted in FIG. 32A. The even gap-mode electric field is symmetric about the waveguide cross-section vertical line of symmetry 1060. The odd gap-mode electric field lines 1040B are plotted in FIG. 32B. The odd gap-mode electric field is anti-symmetric about the waveguide cross-section vertical line of symmetry 1060.

The materials of the EXAMPLE 13 gap-mode waveguide embodiment are the same as those of the baseline EXAMPLE 1 embodiment. The EXAMPLE 13 gap-mode waveguide embodiment structural frame 1050 exterior dimensions are 5 mm high by 8 mm wide. The interior region width and height, W1030 and H1030, are 6 mm and 3 mm. The interior gaps width W1035 is 0.19 mm. The interior gaps, 1035A and 1035B, are centered vertically within the interior region 1030. The center conductor wall width W1000A is 1.0 mm, including the 0.05-mm corner radii. The center conductor wall 1000A is centered horizontally within the interior region 1030. The conductor wall gap-facing heights, H1005A and H1005B, are 1.6 mm, including the 0.05-mm corner radii. The conductor walls proximate interior surface portions, 1005A2 and 1005B, are offset such they are directly facing over a vertical overlap distance of 0.8 mm, as are 1005A1 and 1005C. Except for the center conductor wall 1000A, the conductor walls thickness T1000 and the absorber walls thickness T1010 are about 0.3 mm.

The conductor-absorber wall junctures 1020A are 0.3 mm down from the upper interior surfaces of the absorber walls, 1010A and 1010B. The conductor-absorber wall junctures 1020B are 0.5 mm in from the outermost vertical interior surfaces of the absorber walls, 1010B and 1010A. The conductor-absorber wall junctures 1020C are 0.3 mm up from the lower interior surface of the absorber wall 1010C. The length of the waveguide in the propagation direction is 1 m. Port 1025A and the port at the other end are substantially planar and orthogonal to the propagation direction.

Figure 33A:
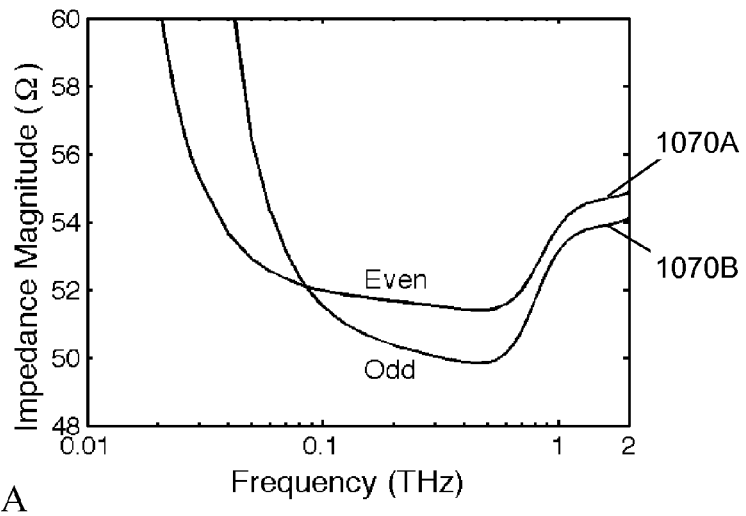
FIG. 33A is a plot of calculated even and odd gap-mode effective characteristic impedances versus frequency of the gap-mode waveguide embodiment according to EXAMPLE 13.

The even gap-mode cutoff frequency of the EXAMPLE 13 gap-mode waveguide embodiment is about 11 GHz, and the odd gap-mode cutoff frequency is about 23 GHz. The multimode cutoff is about 60 GHz. The calculated even and odd gap-mode effective characteristic impedances of the EXAMPLE 13 gap-mode waveguide embodiment are plotted versus frequency in FIG. 33A. An even gap-mode effective characteristic impedance magnitude trace 1070A is close to 50 ohms real impedance from 28 GHz to 2 THz, having a corresponding reflection coefficient of less than −25 dB. An odd gap-mode effective characteristic impedance magnitude trace 1070B is close to 50 ohms real impedance from 52 GHz to 2 THz, having a corresponding reflection coefficient of less than −25 dB.

Figure 33B:
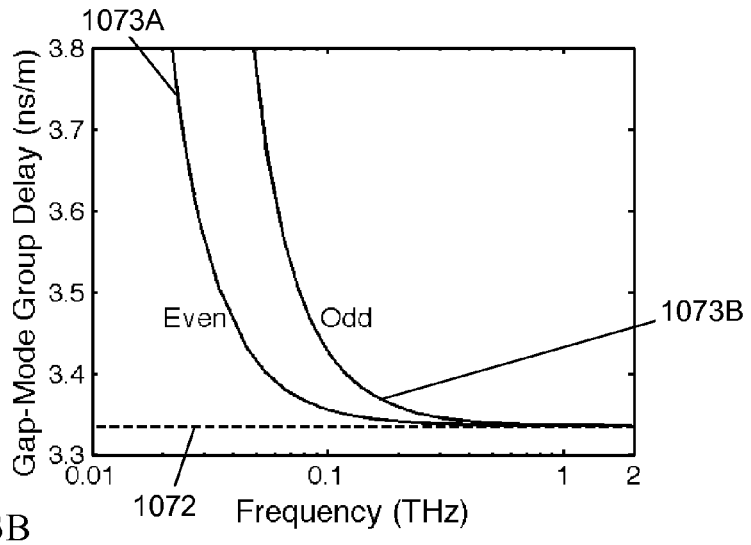
FIG. 33B is a plot of calculated even and odd gap-mode group delay versus frequency of the gap-mode waveguide embodiment according to EXAMPLE 13.

A calculated even gap-mode group delay trace 1073A and an odd gap-mode group delay trace 1073B of the EXAMPLE 13 gap-mode waveguide embodiment are plotted versus frequency in FIG. 33B along with a dashed line speed of light limit trace 1072. The group delay dispersions of both even and odd gap modes are less than 25 ps/m over the range from 200 GHz to 2 THz and are sufficiently low to allow good-fidelity terahertz-bandwidth pulse transmission over tens of centimeters.

Figure 33C:
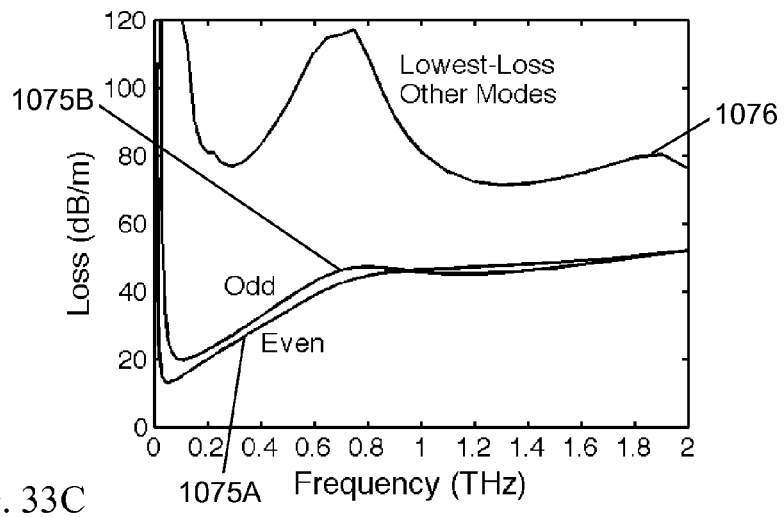
FIG. 33C is a plot of calculated even and odd gap-mode and lowest-loss other modes losses versus frequency of the gap-mode waveguide embodiment according to EXAMPLE 13.

A calculated even gap-mode loss trace 1075A, an odd gap-mode loss trace 1075B, and a lowest-loss other modes (LLO modes) loss trace 1076 for the EXAMPLE 13 embodiment are plotted together versus frequency in FIG. 33C. The losses of both even and odd gap modes are less than 52 dB/m over the frequency range from 31 GHz to 2 THz, which is acceptable for transmission over tens of centimeters in many applications. The LLO-modes loss is greater than both even and odd gap-mode losses over a mode-selective frequency range from about 60 GHz to greater than 2 THz.

The EXAMPLE 13 two-gap waveguide or variations thereof may be constructed to have even and odd gap-modes similar to the two dominant modes of coplanar waveguide and may be useful for coupling to coplanar waveguide. Gap-mode waveguide bends, twists, and tapers may be constructed as variations of the present example. The interior gaps, 1035A and 1035B, may bend, twist, or taper together or independently. The substantially parallel principal electric-field polarizations of the even and odd gap modes facilitates low-loss bends. Gap-mode waveguide straight, bend, twist, or taper sections, or variations or guided-wave circuit components derived therefrom may be connected in various ways to form myriad circuits.

EXAMPLE 14

FIGS. 34A-35C

This example describes a gap-mode waveguide embodiment having three substantially parallel interior gaps and supporting two gap modes. The materials, construction, and operation described in EXAMPLE 1 may be applied to the present example.

Figure 34A:
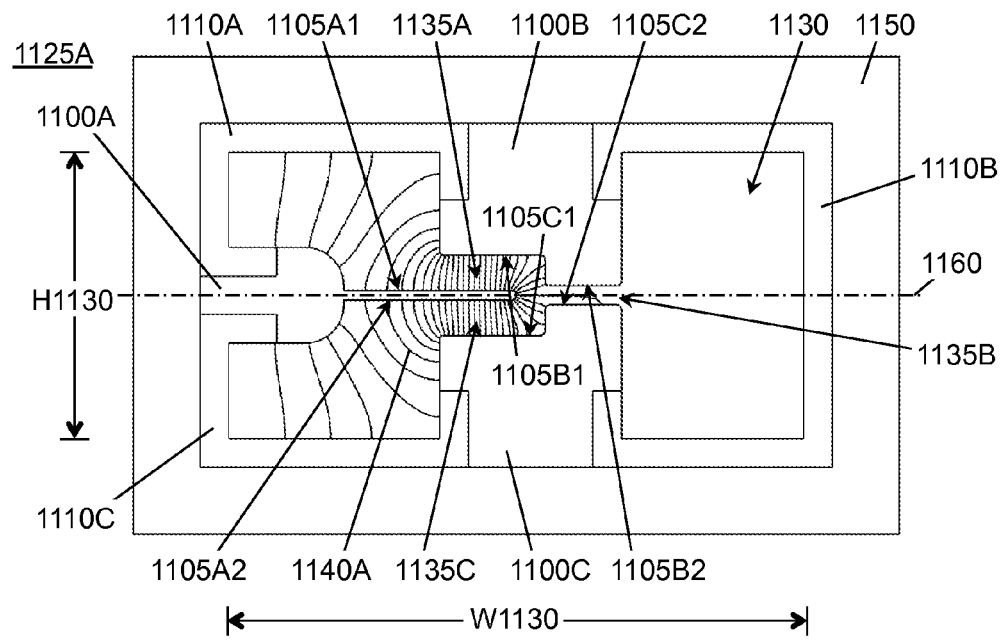
FIG. 34A is an end view of a gap-mode waveguide embodiment having three substantially parallel interior gaps and supporting two gap modes according to EXAMPLE 14, showing the even gap-mode electric-field lines in the interior region.
Figure 34B:
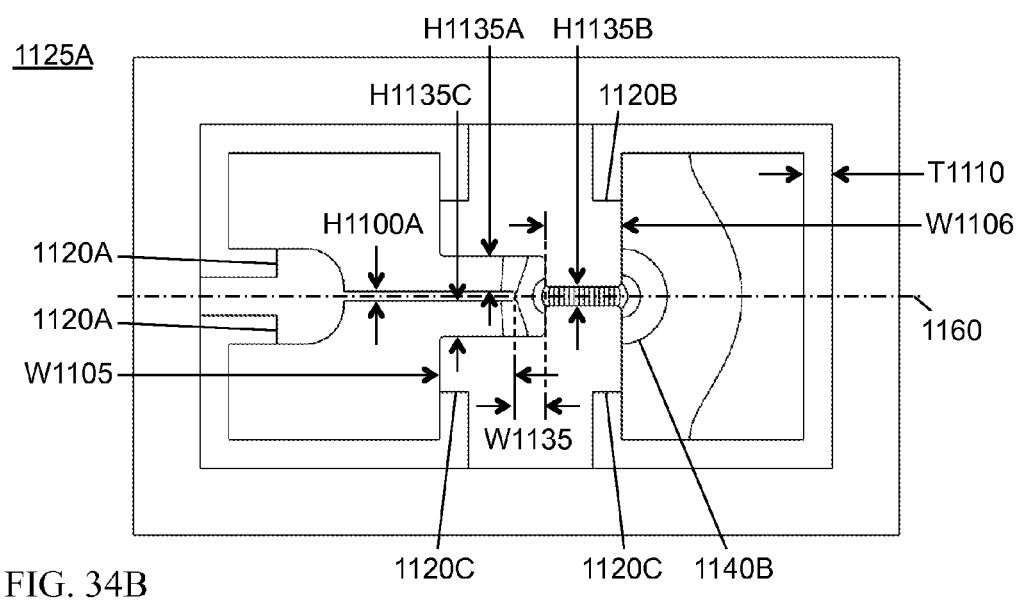
FIG. 34B is an end view of a gap-mode waveguide embodiment having three substantially parallel interior gaps and supporting two gap modes according to EXAMPLE 14, showing the odd gap-mode electric-field lines in the interior region.

FIGS. 34A and 34B show end views at a port 1125A of a gap-mode waveguide embodiment according to the present example. Three conductor walls, 1100A, 1100B, and 1100C, and three absorber walls, 1110A, 1110B, and 1110C, form the sides of the tubular waveguide. An interior gap 1135A in the interior region 1130 is formed between conductor walls proximate interior surface portions, 1105A1 and 1105B1. An interior gap 1135B in the interior region 1130 is formed between conductor walls proximate interior surface portions, 1105B2 and 1105C2. An interior gap 1135C in the interior region 1130 is formed between conductor walls proximate interior surface portions, 1105A2 and 1105C1. The conductor walls proximate interior surface portions, 1105A1, 1105A2, 1105B1, 1105B2, 1105C1, and 1105C2, are generally parallel. The corners of the conductor walls, 1100A, 1100B, and 1100C, that are convex in the interior region 1130 have non-essential radii to reduce concentrations of the proximate electric field and power. The thicknesses of the conductor walls, 1100A, 1100B, and 1100C, and absorber walls thickness T1110 are preferably at least one skin depth at the multimode cutoff. An exterior mechanical support structure or structural frame 1150 may provide additional mechanical support.

The two gap modes have the two lowest cutoff frequencies and may be identified as an even or common mode and an odd or differential mode. The even gap-mode electric field lines 1140A are plotted in FIG. 34A. The even gap-mode electric field is symmetric about the waveguide cross-section horizontal line of symmetry 1160. The odd gap-mode electric field lines 1140B are plotted in FIG. 34B. The odd gap-mode electric field is anti-symmetric about the waveguide cross-section horizontal line of symmetry 1160.

The materials of the EXAMPLE 14 gap-mode waveguide embodiment are the same as those of the baseline EXAMPLE 1 embodiment. The EXAMPLE 14 gap-mode waveguide embodiment structural frame 1150 exterior dimensions are 5 mm high by 8 mm wide. The interior region width and height, W1130 and H1130 are 6 mm and 3 mm. The interior gap heights, H1135A and H1135C, are each 0.37 mm, and the interior gap height H1135B is 0.20 mm. The center conductor wall gap vicinity height H1100A is 0.1 mm, and the portion of conductor wall 1100A of that height extends 1.8 mm from a 1.0 mm high portion having 0.4 mm radii to the center of the interior region 1130. All other corners of the conductor walls, 1100A, 1100B, and 1100C, that are convex in the interior region 1130 have 0.05-mm radii. The conductor wall gap-facing widths, W1105 and W1106, are 0.8 mm. The interior gap separation width W1135 is 0.3 mm. The absorber walls thickness T1110 is about 0.3 mm.

The conductor-absorber wall junctures 1120A are 0.5 mm in from the leftmost interior surfaces of the absorber walls, 1110C and 1110A. The conductor-absorber wall junctures 1120B are 0.5 mm down from the upper interior surfaces of the absorber walls, 1110A and 1110B. The conductor-absorber wall junctures 1120C are 0.5 mm up from the lower interior surfaces of the absorber walls, 1110B and 1110C. The length of the waveguide in the propagation direction is 1 m. Port 1125A and the port at the other end are substantially planar and orthogonal to the propagation direction, and may serve as input and output ports.

Figure 35A:
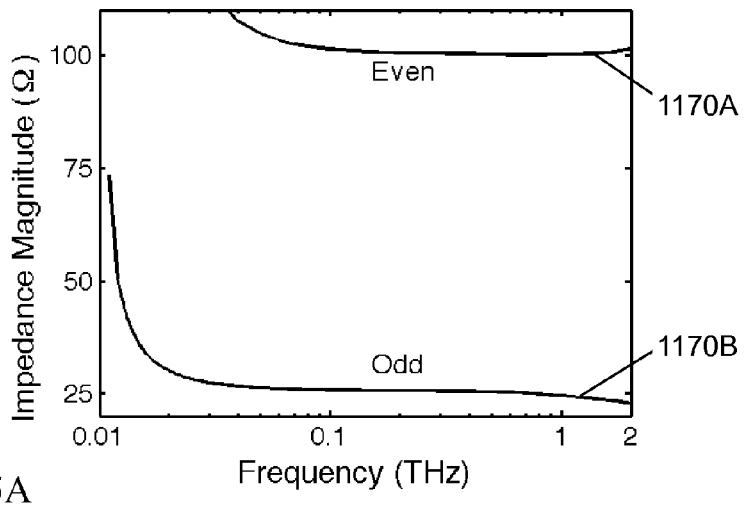
FIG. 35A is a plot of calculated even and odd gap-mode effective characteristic impedances versus frequency of the gap-mode waveguide embodiment according to EXAMPLE 14.

The even gap-mode cutoff frequency of the EXAMPLE 14 gap-mode waveguide embodiment is about 14 GHz, and the odd gap-mode cutoff frequency is about 10 GHz. The multimode cutoff frequency is about 49 GHz. The calculated even and odd gap-mode effective characteristic impedances of the EXAMPLE 14 gap-mode waveguide embodiment are plotted versus frequency in FIG. 35A. An even gap-mode effective characteristic impedance magnitude trace 1170A is close to 100 ohms real impedance from 33 GHz to 2 THz, having a corresponding reflection coefficient of less than −25 dB. An odd gap-mode effective characteristic impedance magnitude trace 1170B is close to 25 ohms real impedance from 28 GHz to 1.8 THz, having a corresponding reflection coefficient of less than −25 dB.

Figure 35B:
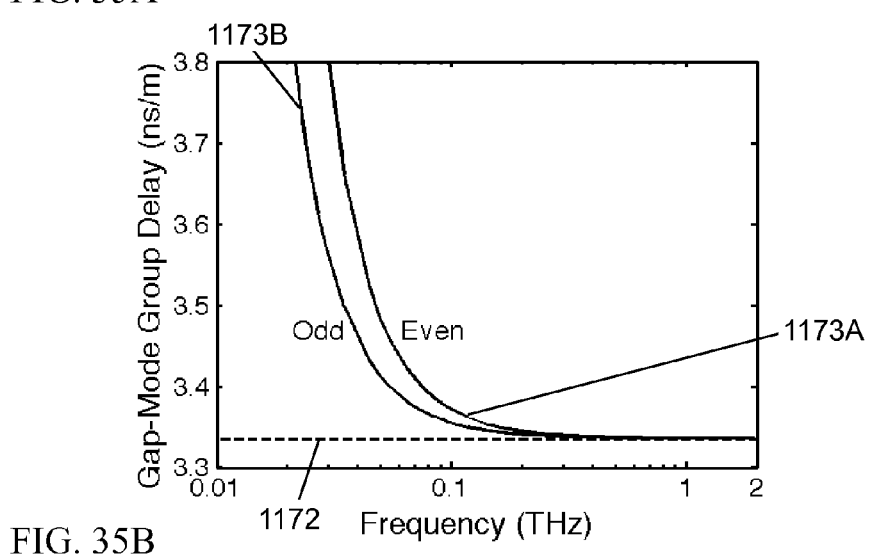
FIG. 35B is a plot of calculated even and odd gap-mode group delay versus frequency of the gap-mode waveguide embodiment according to EXAMPLE 14.

A calculated even gap-mode group delay trace 1173A and an odd gap-mode group delay trace 1173B of the EXAMPLE 14 gap-mode waveguide embodiment are plotted versus frequency in FIG. 35B along with a dashed line speed of light limit trace 1172. The group delay dispersions of both even and odd gap modes are less than 10 ps/m over the range from 200 GHz to 2 THz and are sufficiently low to allow good-fidelity terahertz-bandwidth pulse transmission over meter-scale distances.

Figure 35C:
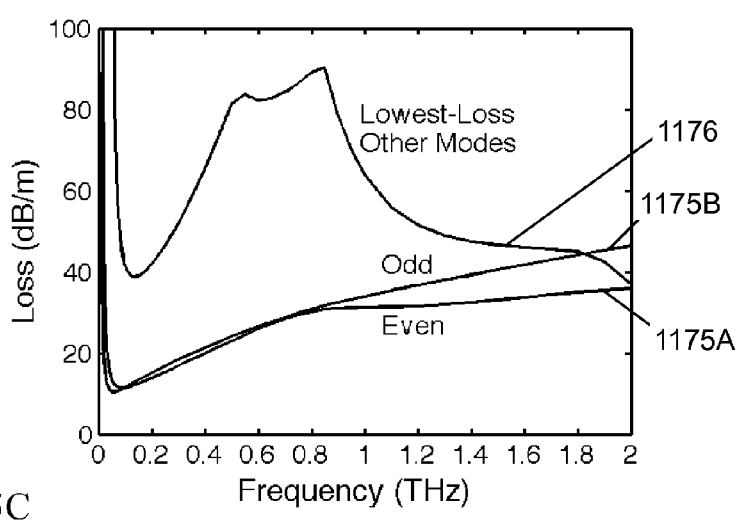
FIG. 35C is a plot of calculated even and odd gap-mode and lowest-loss other modes losses versus frequency of the gap-mode waveguide embodiment according to EXAMPLE 14.

A calculated even gap-mode loss trace 1175A, an odd gap-mode loss trace 1175B, and a lowest-loss other modes (LLO modes) loss trace 1176 for the EXAMPLE 14 embodiment are plotted together versus frequency in FIG. 35C. The losses of both even and odd gap modes are less than 47 dB/m over the frequency range from 19 GHz to 2 THz, which is acceptable for transmission over meter-scale distances in many applications. The LLO-modes loss is greater than both even and odd gap-mode losses over a mode-selective frequency range from about 49 GHz to about 1.8 THz.

The modes of the EXAMPLE 14 three-gap waveguide or variations thereof may be useful for broadband couplers. Connecting interior gaps to ports of a four-port coupler may be accomplished more easily by bending one or more interior gaps in the E-plane and employing tapers to match modes of connected gap-mode waveguides. Gap-mode waveguide bends, twists, and tapers may be constructed as variations of the present example. The interior gaps, 1135A, 1135B, and 1135C, may bend, twist, or taper together or independently. The substantially parallel principal electric-field polarizations of the even and odd gap modes facilitates low-loss bends. Gap-mode waveguide straight, bend, twist, or taper sections, or variations or guided-wave circuit components derived therefrom may be connected in various ways to form myriad circuits.

EXAMPLE 15

FIGS. 36A-37C

This example describes a multi-channel gap-mode waveguide embodiment having edge-coupled microstrip-like gap modes. The materials, construction, and operation described in EXAMPLE 1 may be applied to the present example.

Figure 36A:
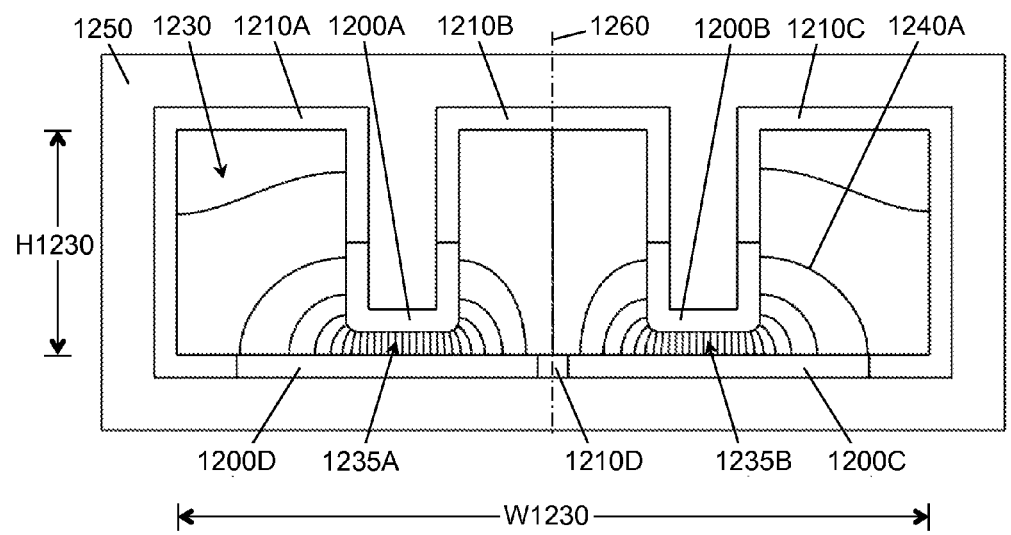
FIG. 36A is an end view of a multi-channel gap-mode waveguide embodiment according to EXAMPLE 15, showing the even gap-mode electric-field lines in the interior region.
Figure 36B:
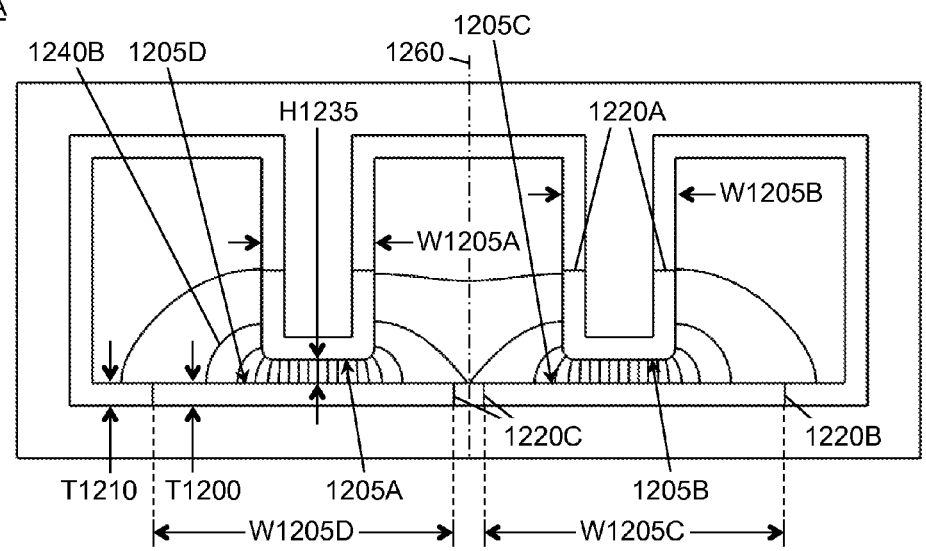
FIG. 36B is an end view of a multi-channel gap-mode waveguide embodiment according to EXAMPLE 15, showing the odd gap-mode electric-field lines in the interior region.

FIGS. 36A and 36B show end views at a port 1225A of a gap-mode waveguide embodiment according to the present example having two interior gaps, 1235A and 1235B, and supporting two gap modes. Four conductor walls, 1200A, 1200B, 1200C, and 1200D, and four absorber walls, 1210A, 1210B, 1210C, and 1210D, form the sides of the tubular waveguide. The interior gap 1235A in the interior region 1230 is formed between conductor walls proximate interior surface portions, 1205A and 1205D. The interior gap 1235B in the interior region 1230 is formed between conductor walls proximate interior surface portions, 1205B and 1205C. The conductor walls proximate interior surface portions, 1205A, 1205B, 1205C, and 1205D, are generally parallel. The corners of the conductor walls, 1200A, 1200B, 1200C, and 1200D, that are convex in the interior region 1230 have non-essential radii to reduce concentrations of the proximate electric field and power. The conductor walls thickness T1200 and the absorber walls thickness T1210 are preferably at least one skin depth at the multimode cutoff. An exterior mechanical support structure or structural frame 1250 may provide additional mechanical support.

The two gap modes have the two lowest cutoff frequencies and may be identified as an even or common mode and an odd or differential mode. The even gap-mode electric field lines 1240A are plotted in FIG. 36A. The even gap-mode electric field is symmetric about the waveguide cross-section vertical line of symmetry 1260. The odd gap-mode electric field lines 1240B are plotted in FIG. 36B. The odd gap-mode electric field is anti-symmetric about the waveguide cross-section vertical line of symmetry 1260. The gap modes roughly resemble the dominant modes of edge-coupled microstrip, so they are termed edge-coupled microstrip-like gap modes.

The materials of the EXAMPLE 15 gap-mode waveguide embodiment are the same as those of the baseline EXAMPLE 1 embodiment. The EXAMPLE 15 gap-mode waveguide embodiment structural frame 1250 exterior dimensions are 5 mm high by 12 mm wide. The interior region width and height, W1230 and H1230 are 10 mm and 3 mm. The interior gaps height H1235 is 0.31 mm. The horizontal centers of the conductor walls proximate interior surface portions, 1205A and 1205B, are 3 mm in from the left and right sidewalls. The conductor wall gap-facing widths, W1205A and W1205B, are each 1.5 mm, including 0.16 mm corner radii. The conductor wall gap-facing widths, W1205C and W1205D, are each 4 mm. The conductor walls thickness T1200 and the absorber walls thickness T1210 are about 0.3 mm.

The conductor-absorber wall junctures 1220A are 1.5 mm down from the upper interior surfaces of the absorber walls, 1210A, 1210B, and 1210C. The conductor-absorber wall junctures 1220B are 0.8 mm in from the leftmost and rightmost sidewall interior surfaces. The conductor-absorber wall junctures 1220C are 0.2 mm left and right from the waveguide cross-section vertical line of symmetry 1260. The length of the waveguide in the propagation direction is 1 m. Port 1225A and the port at the other end are substantially planar and orthogonal to the propagation direction.

Figure 37A:
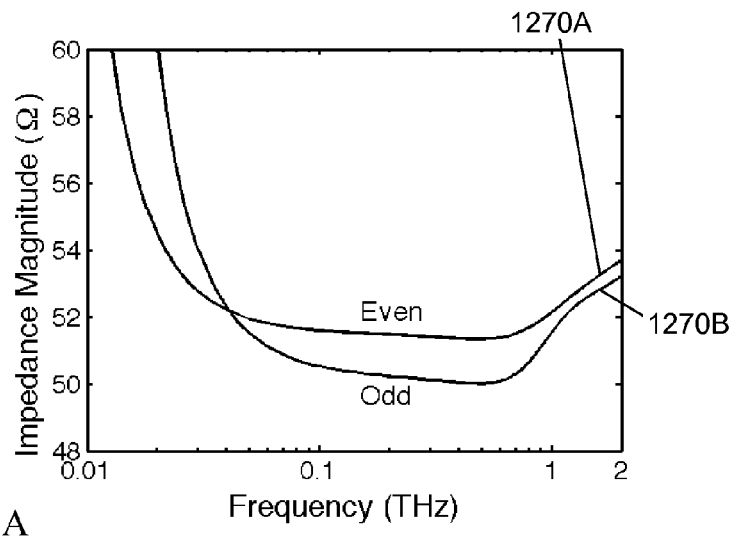
FIG. 37A is a plot of calculated even and odd gap-mode effective characteristic impedances versus frequency of the gap-mode waveguide embodiment according to EXAMPLE 15.

The even gap-mode cutoff frequency of the EXAMPLE 15 gap-mode waveguide embodiment is about 6 GHz, and the odd gap-mode cutoff frequency is about 11 GHz. The multimode cutoff frequency is about 47 GHz. The calculated even and odd gap-mode effective characteristic impedances of the EXAMPLE 15 gap-mode waveguide embodiment are plotted versus frequency in FIG. 37A. An even gap-mode effective characteristic impedance magnitude trace 1270A is close to 50 ohms real impedance from 18 GHz to 2 THz, having a corresponding reflection coefficient of less than −25 dB. An odd gap-mode effective characteristic impedance magnitude trace 1270B is close to 50 ohms real impedance from 26 GHz to 2 THz, having a corresponding reflection coefficient of less than −25 dB.

Figure 37B:
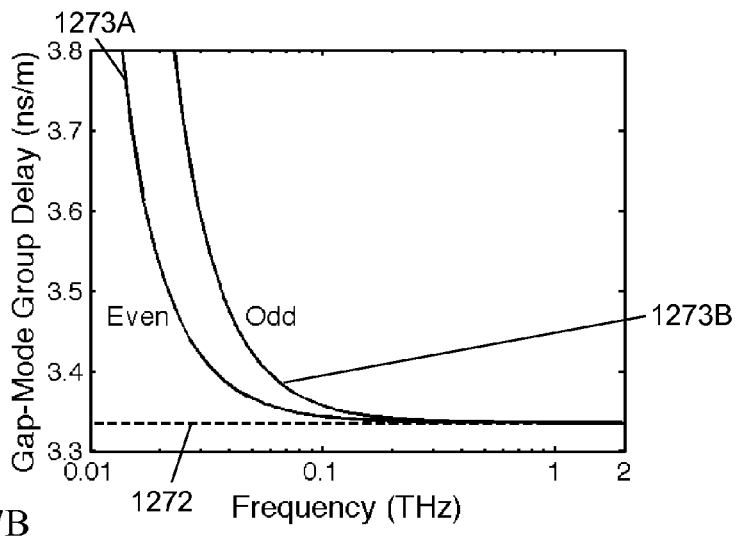
FIG. 37B is a plot of calculated even and odd gap-mode group delay versus frequency of the gap-mode waveguide embodiment according to EXAMPLE 15.

A calculated even gap-mode group delay trace 1273A and an odd gap-mode group delay trace 1273B of the EXAMPLE 15 gap-mode waveguide embodiment are plotted versus frequency in FIG. 37B along with a dashed line speed of light limit trace 1272. The group delay dispersions of both even and odd gap modes are less than 10 ps/m over the range from 200 GHz to 2 THz and are sufficiently low to allow good-fidelity terahertz-bandwidth pulse transmission over meter-scale distances.

Figure 37C:
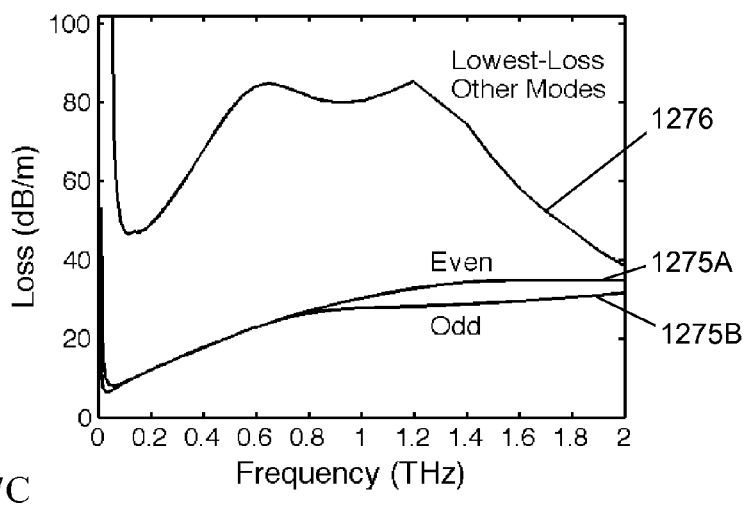
FIG. 37C is a plot of calculated even and odd gap-mode and lowest-loss other modes losses versus frequency of the gap-mode waveguide embodiment according to EXAMPLE 15.

A calculated even gap-mode loss trace 1275A, an odd gap-mode loss trace 1275B, and a lowest-loss other modes (LLO modes) loss trace 1276 for the EXAMPLE 15 embodiment are plotted together versus frequency in FIG. 37C. The losses of both even and odd gap modes are less than 35 dB/m over the frequency range from 14 GHz to 2 THz, which is acceptable for transmission over meter-scale distances in many applications. The LLO-modes loss is greater than both even and odd gap-mode losses over a mode-selective frequency range from about 47 GHz to greater than 2 THz.

Modal channels may be associated with the gap modes or superpositions thereof. While the EXAMPLE 15 gap-mode waveguide embodiment supports two channels, more channels may be supported by adding more gaps. The absorber wall 1210D may be replaced by a conductor wall joining conductor walls, 1200C and 1200D, resulting in a compromise of lesser mode discrimination and lesser attenuation. Gap-mode waveguide bends, twists, and tapers may be constructed as variations of the present example. The interior gaps, 1235A and 1235B, may bend, twist, or taper together or independently. The substantially parallel principal electric-field polarizations of the even and odd gap modes facilitates low-loss bends. Gap-mode waveguide straight, bend, twist, or taper sections, or variations or guided-wave circuit components derived therefrom may be connected in various ways to form myriad circuits.

EXAMPLE 16

FIGS. 38A-39C

This example describes a two-channel gap-mode waveguide embodiment having a single conductor and single absorber. The materials, construction, and operation described in EXAMPLE 10 may be applied to the present example except as described differently below.

Figure 38A:
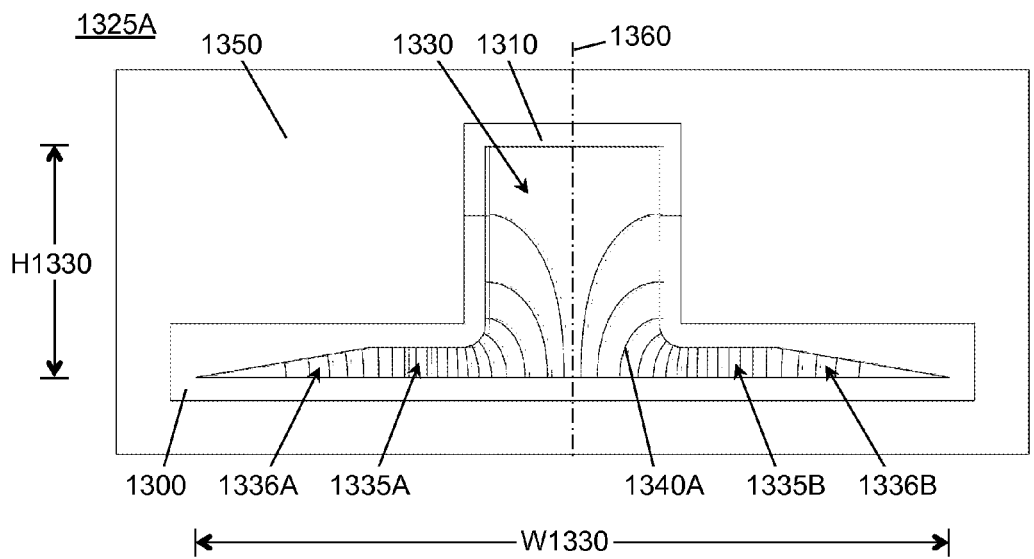
FIG. 38A is an end view of a two-channel gap-mode waveguide embodiment having a single conductor and single absorber according to EXAMPLE 16, showing the even gap-mode electric-field lines in the interior region.
Figure 38B:
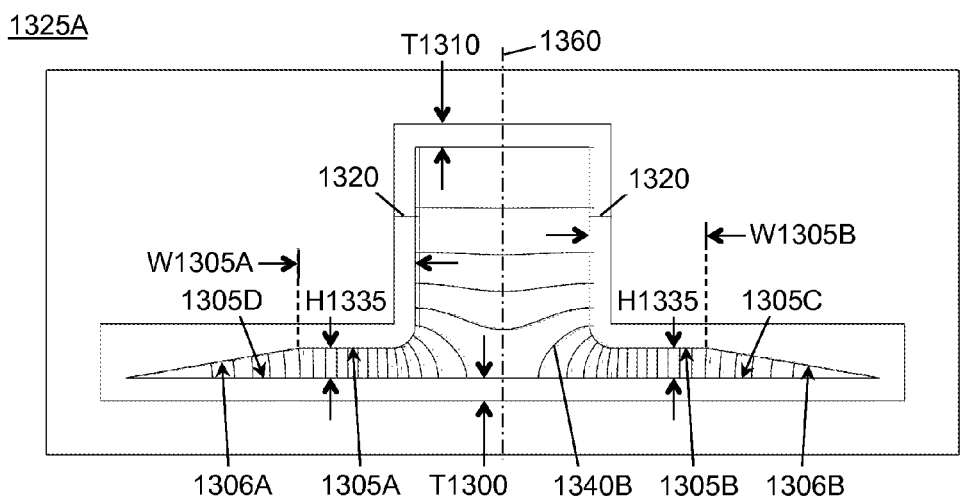
FIG. 38B is an end view of a two-channel gap-mode waveguide embodiment having a single conductor and single absorber according to EXAMPLE 16, showing the odd gap-mode electric-field lines in the interior region.

FIGS. 38A and 38B show end views at a port 1325A of a gap-mode waveguide embodiment according to the present example having two interior gaps, 1335A and 1335B, and supporting two gap modes. A conductor wall 1300 and an absorber wall 1310 form the sides of the tubular waveguide. An interior gap 1335A in the interior region 1330 is formed between conductor wall proximate parallel interior surface portions, 1305A and 1305D. An interior gap 1335B in the interior region 1330 is formed between conductor wall proximate parallel interior surface portions, 1305B and 1305C. The conductor wall proximate interior surface portions, 1305A, 1305B, 1305C, and 1305D, are generally parallel. Wedge-shape side tapers, 1336A and 1336B, are adjacent the interior gaps, 1335A and 1335B. The corners of the conductor wall 1300 that are convex in the interior region 1330 have non-essential radii to reduce concentrations of the proximate electric field and power. The conductor walls thickness T1300 and the absorber walls thickness T1310 are preferably at least one skin depth at the multimode cutoff. An exterior mechanical support structure or structural frame 1350 may provide additional mechanical support.

The two gap modes have the two lowest cutoff frequencies and may be identified as an even or common mode and an odd or differential mode. The even gap-mode electric field lines 1340A are plotted in FIG. 38A. The even gap-mode electric field is symmetric about the waveguide cross-section vertical line of symmetry 1360. The odd gap-mode electric field lines 1340B are plotted in FIG. 38B. The odd gap-mode electric field is anti-symmetric about the waveguide cross-section vertical line of symmetry 1360.

The materials of the EXAMPLE 16 gap-mode waveguide embodiment are the same as those of the baseline EXAMPLE 1 embodiment. The EXAMPLE 16 gap-mode waveguide embodiment structural frame 1350 exterior dimensions are 5 mm high by 11.8 mm wide. The interior region 1330 spans height and width of 3 mm and 9.75 mm. The interior gaps height H1335 is 0.39 mm. The upper conductor wall parallel gap-facing widths, W1305A and W1305B, are each about 1.5 mm, including 0.30 mm corner radii. Conductor wall proximate slanted interior surface portions, 1306A and 1306B, slope linearly from the upper conductor wall proximate interior surface portions, 1305A and 1305B, to the lower conductor wall proximate interior surface portions, 1305C and 1305D, over horizontal distances of 2.25 mm, forming the side tapers, 1336A and 1336B. The conductor walls thickness T1300 and the absorber walls thickness T1310 are about 0.3 mm except in the vicinities of the side tapers, 1336A and 1336B, where portions of the conductor wall 1300 are thicker.

The conductor-absorber wall junctures 1320 are 0.9 mm down from the upper interior surface of the absorber wall 1310. The length of the waveguide in the propagation direction is 1 m. Port 1325A and the port at the other end are substantially planar and orthogonal to the propagation direction.

Figure 39A:
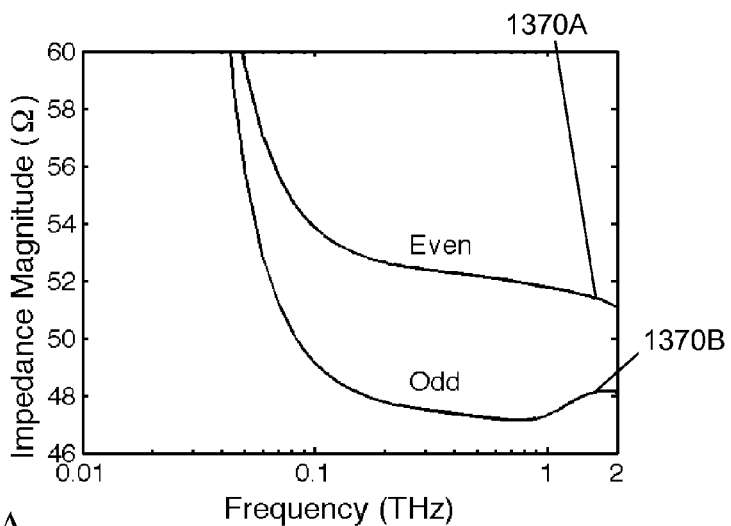
FIG. 39A is a plot of calculated even and odd gap-mode effective characteristic impedances versus frequency of the gap-mode waveguide embodiment according to EXAMPLE 16.

The even gap-mode cutoff frequency of the EXAMPLE 16 gap-mode waveguide embodiment is about 24 GHz, and the odd gap-mode cutoff frequency is about 27 GHz. The multimode cutoff frequency is about 50 GHz. The calculated even and odd gap-mode effective characteristic impedances of the EXAMPLE 16 gap-mode waveguide embodiment are plotted versus frequency in FIG. 39A. The gap-mode effective characteristic impedances are defined similarly as in EXAMPLE 10. An even gap-mode effective characteristic impedance magnitude trace 1370A is close to 50 ohms real impedance from 70 GHz to 2 THz, having a corresponding reflection coefficient of less than −25 dB. An odd gap-mode effective characteristic impedance magnitude trace 1370B is close to 50 ohms real impedance from 50 GHz to 2 THz, having a corresponding reflection coefficient of less than −25 dB.

Figure 39B:
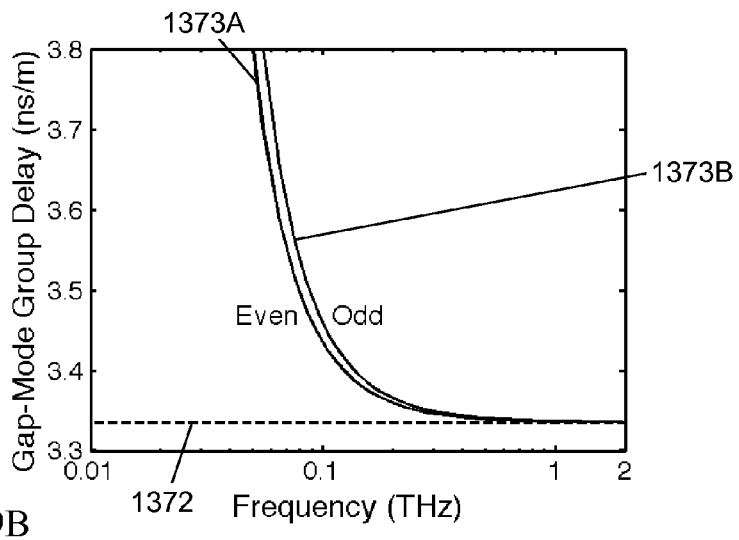
FIG. 39B is a plot of calculated even and odd gap-mode group delay versus frequency of the gap-mode waveguide embodiment according to EXAMPLE 16.

A calculated even gap-mode group delay trace 1373A and an odd gap-mode group delay trace 1373B of the EXAMPLE 16 gap-mode waveguide embodiment are plotted versus frequency in FIG. 39B along with a dashed line speed of light limit trace 1372. The group delay dispersions of both even and odd gap modes are less than 30 ps/m over the range from 200 GHz to 2 THz and are sufficiently low to allow good-fidelity terahertz-bandwidth pulse transmission over tens of centimeters.

Figure 39C:
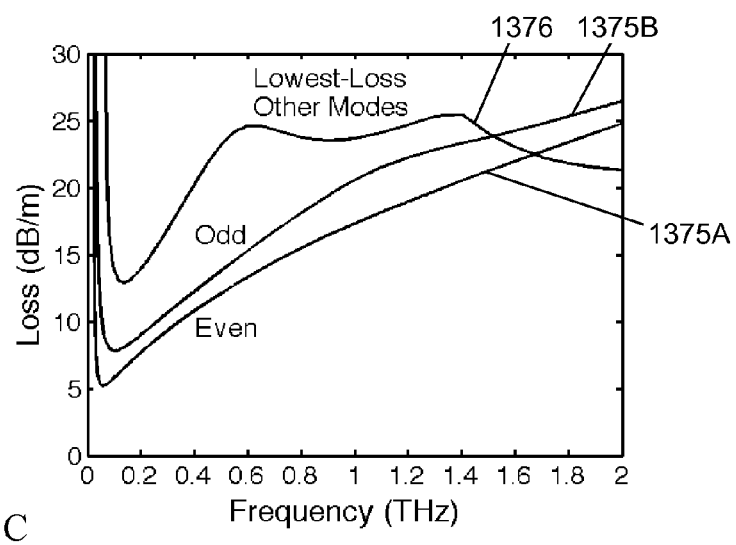
FIG. 39C is a plot of calculated even and odd gap-mode and lowest-loss other modes losses versus frequency of the gap-mode waveguide embodiment according to EXAMPLE 16.

A calculated even gap-mode loss trace 1375A, an odd gap-mode loss trace 1375B, and a lowest-loss other modes (LLO modes) loss trace 1376 for the EXAMPLE 16 embodiment are plotted together versus frequency in FIG. 39C. The losses of both even and odd gap modes are less than 24 dB/m over the frequency range from 35 GHz to 1.5 THz, which is acceptable for transmission over meter-scale distances in many applications. The LLO-modes loss is greater than both even and odd gap-mode losses over a mode-selective frequency range from about 50 GHz to about 1.5 THz.

Modal channels may be associated with the gap modes or superpositions thereof. Gap-mode waveguide bends, twists, and tapers may be constructed as variations of the present example. The interior gaps, 1335A and 1335B, may bend, twist, or taper together or independently. The substantially parallel principal electric-field polarizations of the even and odd gap modes facilitates low-loss bends. Gap-mode waveguide straight, bend, twist, or taper sections, or variations or guided-wave circuit components derived therefrom may be connected in various ways to form myriad circuits.

EXAMPLE 17

FIG. 40

This example describes a gap-mode waveguide embodiment having an aperture through a waveguide wall and an optional partition. An aperture connects the waveguide interior region with the exterior, providing access by which materials (including solids, liquids, gases, and plasmas), components, or energy may be inserted or extracted. An aperture may be an opening or hole, or alternatively it may be a window that selectively passes a material, component, or energy. An aperture may simply provide for evacuation of the waveguide interior or for filling an interior region with a material. An aperture may provide for material transport between an external sample material source and an interior sample measurement chamber, perhaps through a conduit coupled to the aperture.

The interior sample measurement chamber may be bounded by partitions spanning transversely across the waveguide interior region. Two or more partitions in combination with one or more apertures may form one or more sample chambers where specified samples of materials, components, or energies may be introduced, exposed to a guided electromagnetic wave, and extracted. The sample chambers may be part of a measurement system or a circuit. Materials may be transported by a pump, conveyor belt, translocation of a container, or another suitable material transport method known in the art. A partition may serve circuit functions, incorporating structures that interact with the guided electromagnetic waves and communicate with other circuits. The partition may provide for an auxiliary circuit or a confinement structure.

An aperture may provide for insertion of waveguide or circuit elements that alter or probe the propagation of electromagnetic waves in the gap-mode waveguide. Waveguide coupling or filtering effects may be accomplished through an aperture. Energy, such as electromagnetic waves, radiation, vibrations, pressure, or heat, may be transmitted through an aperture to provide a source of electromagnetic waves or to alter or probe the characteristics of a material or component. As used herein, electromagnetic waves include the entire spectrum from radio to gamma waves, and radiation includes all forms from natural or man-made particle sources.

Figure 40:
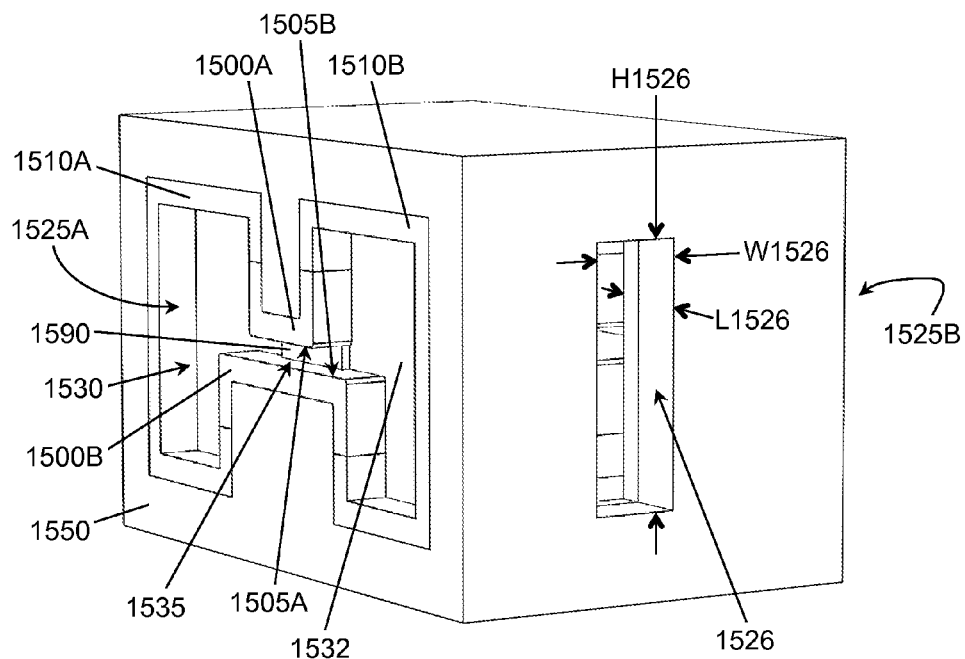
FIG. 40 is a perspective view of a gap-mode waveguide embodiment having an aperture and a partition according to EXAMPLE 17.

The structure, materials, construction, and operation described in EXAMPLE 1 may be applied to the present example of a gap-mode waveguide with an aperture. Referring to FIG. 40, two conductor walls, 1500A and 1500B, and two absorber walls, 1510A and 1510B, form the sides of the tubular waveguide. Ports, 1525A and 1525B, bound the ends of the waveguide. An interior gap 1535 in the interior region 1530 is formed between conductor walls proximate interior surface portions, 1505A and 1505B. An exterior mechanical support structure or structural frame 1550 may provide additional mechanical support. An aperture 1526 extends through a side of the gap-mode waveguide.

The surfaces of a partition 1532 are approximately planar and approximately perpendicular to the propagation direction. The partition 1532 is coupled to the conductor walls, 1500A and 1500B, and absorber walls, 1510A and 1510B, in a manner so as to act as a barrier to passage of the materials, components, or energy of interest. The partition 1532 may also provide for measurement or communication functions and support by including an auxiliary circuit. The partition 1532 may be fabricated in a planar technology such as monolithic integrated circuit, hybrid circuit, or printed circuit in order to incorporate the auxiliary circuit.

A guided-wave circuit component 1590 that interacts with the guided electromagnetic waves, including gap-mode waveguide transmitter or source devices, receiver or detector devices, or other circuit components as mentioned above in EXAMPLE 1, may be coupled to the partition 1532. The guided-wave circuit component 1590 may communicate with the auxiliary circuit in the partition 1532. Communication with a circuit external to the waveguide may include a path through the aperture 1526. For example the guided-wave circuit component 1590 may be a diode that downconverts gap-mode waves and communicates an intermediate frequency signal through the aperture 1526. In another example, the guided-wave circuit component 1590 may be a photodiode that generates gap-mode waves when the photodiode is illuminated by modulated light delivered through the aperture 1526 directly to the photodiode.

Considerations for material characteristics of the aperture 1526 and the partition 1532 include electrical conductivity, dielectric and magnetic constants, transparency to frequencies in the electromagnetic spectrum, reactivity with materials that may be in contact, resistance to abrasion or wear, strength, elasticity, toughness, thermal expansion, corrosion resistance, radiation resistance, stability in plasmas, moisture absorption, electric field breakdown, melting temperature, machinability, formability, and thermal conductivity. Parameters such as temperature affect these material characteristics. Availability and cost are also considerations.

Considerations for the size, shape, and placement of the aperture 1526 may be understood with reference to the relationship between the gap-mode electric field lines 140 and the configuration of the absorber walls, 110A and 110B, versus the conductor walls, 100A and 100B, described in EXAMPLE 1. The interior gap 1535 principally condenses the gap mode so that most of the energy of the gap mode is in or near the interior gap 1535, and the conductor walls, 1500A and 1500B, largely guide the gap mode with relatively low loss. The aperture 1526 may be placed so that it does not intrude upon the interior gap 1535. The aperture 1526 may be placed within where absorber walls, 1510A and 1510B, may be placed with acceptable gap-mode attenuation. Given such placement, the aperture 1526 may be of any passive material, vacuum, conductor, resistor, dielectric, magnetic, or other.

The transverse dimensions and materials of the EXAMPLE 17 embodiment gap-mode waveguide are the same as those of the baseline EXAMPLE 1 embodiment except where interrupted by the aperture 1526. The aperture 1526 extends through the structural frame 1550 and the absorber wall 1510B, describing an aperture length L1526 of 1 mm. The aperture height H1526 of 3 mm spans from the lower interior surface of the absorber wall 1510B to the upper interior surface of the absorber wall 1510B. The aperture width W1526 is 1 mm along the propagation direction.

The effect of the aperture 1526 on gap-mode propagation is evaluated over a large range of material electromagnetic properties in gap-mode S-parameter calculations of a three-dimensional model of the EXAMPLE 17 embodiment gap-mode waveguide without the partition 1532. The EXAMPLE 17 embodiment gap-mode S-parameters are calculated from 50 GHz to 1 THz with and without the aperture 1526. S-parameters are calculated with aperture 1526 conductivities of 0 and $10^8$ S/m, relative permittivities of 1 and 100, and relative permeabilities of 1 and 100. The worst-case excess loss of all cases is less than 0.03 dB, and the aperture 1526 effect on group delay is insignificant.

The limited perturbation of the gap-mode by the aperture 1526 in the EXAMPLE 17 embodiment gap-mode waveguide is due to the low concentration of gap-mode energy near the aperture 1526. The aperture width W1526 is limited in the present example not due to acceptable performance, but rather due to limitations of accessible computational resources required for a full three-dimensional model confirmation. According to a two-dimensional model, unlimited aperture width W1526 is possible without introducing unacceptable gap-mode perturbation or attenuation for many applications. Multiple apertures, including on multiple sides of the waveguide, should similarly cause little perturbation of the gap-mode propagation as long as they are away from the gap mode.

Higher order modes may be more perturbed by the presence of an aperture, a characteristic that may form the basis for a modal filter based on apertures or aperture-like structures. Any of the other previously described gap-mode waveguide embodiments may also include an aperture similar to that described, here, with similar results expected. Gap-mode waveguide straight, bend, twist, or taper sections, or variations or guided-wave circuit components derived therefrom may be connected in various ways to form myriad circuits.

Other variations in the waveguide cross-section besides apertures, such as structural or material changes, appropriately designed in regions where the gap-mode intensity is low may similarly cause only small perturbation of the gap mode. Structural changes include geometrical deviation from an essentially constant waveguide cross-section where the gap-mode intensity is low. Material changes include any compositional deviation from an essentially constant waveguide cross-section where the gap-mode intensity is low. Applications include modal filtering effects and incorporation of actuators, transducers, energy sources, transmitter or source devices, receiver or detector devices, matter or chemical sources or sensors, circuitry, or other functional hardware within the waveguide.

One or more partitions similar to the partition 1532 may be placed in the interior region 1530 to confine materials, components, or energy that may be introduced through the aperture 1526 or through the ports, 1525A or 1525B. The partition 1532 may be specified to withstand pressure differences while avoiding undue reflection, absorption, dispersion, or other perturbation of the gap mode. If more than one partition 1532 is in a waveguide, their thicknesses and the intervening waveguide length or lengths may be individually specified to avoid resonance reinforcement.

The partition 1532 is preferably composed of a material having low loss for electromagnetic wave propagation, such as PTFE, and of sufficient thickness for the specified mechanical properties. Other suitable materials for the partition 1532 include other polymers, such as polyethylene, glasses, ceramics, such as sapphire and silica, and semiconductors, such as silicon, zinc sulfide, zinc selenide, indium phosphide, gallium arsenide, gallium nitride, and indium oxide. A seal between the partition 1532 and the conductor walls, 1500A and 1500B, and absorber walls, 1510A and 1510B, provides for confinement of fluids. Such a seal may be accomplished with adhesives, welding. brazing, melting, ultrasonic bonding, compression, or another suitable known sealing method.

EXAMPLE 18

FIG. 41

This example describes a gap-mode waveguide embodiment and a method of fabrication. The EXAMPLE 18 gap-mode waveguide embodiment has a microstrip-like gap mode similar to that of the EXAMPLE 1 embodiment. The operation described in EXAMPLE 1 may be applied to the present example.

Figure 41:
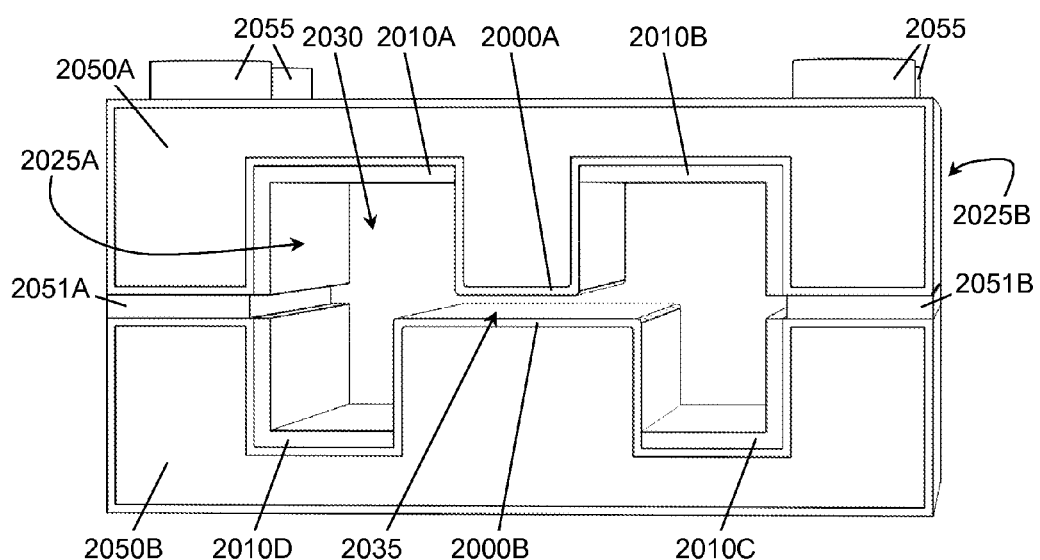
FIG. 41 is a perspective view of a gap-mode waveguide embodiment assembly having a microstrip-like gap mode according to EXAMPLE 18.

Referring to FIG. 41, forming and processing of the surfaces bordering the interior region 2030 are facilitated by configuring the waveguide as an assembly. The structural frame parts, 2050A and 2050B, are formed independently as two pieces, to which conductor walls, 2000A and 2000B, and absorber walls, 2010A, 2010B, 2010C, and 2010D, are applied prior to assembly. Shims, 2051A and 2051B, determine the height of the interior gap 2035, in the assembly, which is fixed with fasteners 2055.

The exterior dimensions of the EXAMPLE 18 embodiment gap-mode waveguide are 5 mm high, excluding fasteners 2055, by 10 mm wide, by 1 m long, in the propagation direction. The transverse dimensions of the interior region 2030, including the interior gap 2035, are essentially the same as those of the EXAMPLE 2 embodiment, except for the differences due to the two-part assembly in the vicinity of the interior facing surfaces of the shims, 2051A and 2051B. Two conductor walls, 2000A and 2000B, four absorber walls, 2010A, 2010B, 2010C, and 2010D, and the shims, 2051A and 2051B, form the sides of the tubular waveguide. Ports, 2025A and 2025B, bound the ends of the waveguide and are substantially planar and orthogonal to the propagation direction. Portions of the conductor walls, 2000A and 2000B, come near each other to form an interior gap 2035 in the interior region 2030. The conductor walls, 2000A and 2000B, have generally parallel interior surfaces bordering the interior gap 2035, and the surface of the upper conductor wall 2000A bordering the interior gap 2035 is narrower than the facing surface of the lower conductor wall 2000B. The corners of the conductor walls, 2000A and 2000B, that are convex in the interior region 2030 have non-essential radii to reduce concentrations of the proximate electric field and power.

The upper structural frame part 2050A supports the conductor wall 2000A and the absorber walls, 2010A and 2010B. The lower structural frame part 2050B supports the conductor wall 2000B and the absorber walls, 2010C and 2010D. The shims, 2051A and 2051B, are interposed between distal portions of the conductor walls, 2000A and 2000B. The surfaces of the upper conductor wall 2000A bordering the shims, 2051A and 2051B, are substantially coplanar with the surface of the upper conductor wall 2000A bordering the interior gap 2035. The surfaces of the lower conductor wall 2000B bordering the shims, 2051A and 2051B, are substantially coplanar with the surface of the lower conductor wall 2000B bordering the interior gap 2035.

The EXAMPLE 18 embodiment gap-mode waveguide structural frame parts, 2050A and 2050B, are composed of aluminum or aluminum alloy such as aluminum 7075. Alternatively, any material with the prescribed mechanical characteristics may be used for the structural frame parts, 2050A and 2050B. For example, the waveguide may be made flexible or formable by using a low-yield material, such as a formable metal alloy like brass or a beryllium alloy, or a plastic to form the structural frame parts, 2050A and 2050B. Another example is to form the structural frame parts, 2050A and 2050B, in printed circuit board material, facilitating integration of an auxiliary circuit including electronics, for example, microwave, low-frequency, or converter electronics.

The conductor walls, 2000A and 2000B, are 1-μm-thick films of silver. Alternatively, the silver films may be omitted, in which case the conductor walls, 2000A and 2000B, are composed of the aluminum of the structural frame parts, 2050A and 2050B. Thin native oxides of silver or aluminum should not have unacceptable effects on waveguide mode propagation characteristics. The absorber walls, 2010A, 2010B, 2010C, and 2010D, are 0.05-mm-thick resistor coatings of polymer matrix composite containing carbon and silver particles in concentrations to make a conductivity of about $10^4$ S/m. The shims, 2051A and 2051B, are composed of aluminum. Alternatively, the shims, 2051A and 2051B, may be composed of any material that provides suitable mechanical and environmental properties. The interior region 2030, which includes the interior gap 2035, is nominally filled with nitrogen gas, but portions of or the entire interior region 2030 may be filled with other materials or devices.

The structural frame parts, 2050A and 2050B, are initially formed by extrusion, and then machined to specified tolerances, as necessary. The surfaces of the structural frame parts, 2050A and 2050B, bordering the interior gap 2035 are polished so that the root-mean-square surface roughness is 0.02 μm or less, which is less than the skin depth of silver or aluminum at 2 THz. The conductor walls, 2000A and 2000B, are electroplated onto the structural frame parts, 2050A and 2050B. Other possible methods for depositing the conductor walls, 2000A and 2000B, would be readily apparent to one of ordinary skill in the art, including evaporation, sputtering, and melt-zone coating.

The absorber walls, 2010A, 2010B, 2010C, and 2010D, are then printed as an ink or paint in specified regions over the conductor walls, 2000A and 2000B, and then cured. Other possible methods for applying the absorber walls, 2010A, 2010B, 2010C, and 2010D, would be readily apparent to one of ordinary skill in the art, including brushing, rolling, spraying, powder coating, electrostatic deposition, and those possible for applying the conductor walls, 2000A and 2000B.

The upper subassembly, comprising the upper structural frame part 2050A with upper conductor wall 2000A and upper absorber walls, 2010A and 2010B, and the lower subassembly, comprising the lower structural frame part 2050B with lower conductor wall 2000B and lower absorber walls, 2010C and 2010D, are then assembled with the shims, 2051A and 2051B. The shims, 2051A and 2051B, are sized and positioned so that they abut the conductor walls, 2000A and 2000B, and provide sufficient dimensional tolerance for the absorber walls, 2010A, 2010B, 2010C, and 2010D.

After alignment, the assembly is fixed by machine screw fasteners 2055, which pass through clearance holes in the upper structural frame part 2050A, upper conductor wall 2000A, and shims, 2051A and 2051B, and screw into threaded holes in the lower conductor wall 2000B and lower structural frame part 2050B. Other possible methods for fixing the assembly would be readily apparent to one of ordinary skill in the art, including rivetting, clamping, gluing, brazing, welding, thermal bonding, ultrasonic bonding, thermosonic bonding, diffusion bonding, or any fixing method or combination thereof known in the art that is suitable for the materials employed.

After assembly, the ends of the waveguide may be machined as prescribed, removing material so that the ports, 2025A and 2025B, are substantially planar and orthogonal to the propagation direction so as to fit closely when mated or joined. Gap-mode waveguide may be mated or joined by any method that provides for sufficiently precise alignment and suitable mechanical properties to form combined paths defining circuits or portions thereof. Flanges, including ring-centered flanges, and alignment dowel pins and holes, the use of which in joining circular, rectangular, and metallic ridge waveguide is well-known in the art, may be used to mate or join gap-mode waveguide. Flanges having alignment dowel pins and holes are aligned at the ports, 2025A and 2025B, to features having the greatest impact on gap-mode coupling efficiency and reflections. The flanges may be attached to the waveguide by the use of fastening, clamping, gluing, brazing, welding, thermal bonding, ultrasonic bonding, thermosonic bonding, diffusion bonding, or any fixing method or combination thereof known in the art that is suitable for the materials employed.

The boundaries of the interior region 2030 determine the waveguide electromagnetic wave propagation characteristics. The EXAMPLE 18 embodiment gap-mode waveguide left absorber walls, 2010A and 2010D, together perform essentially the same function and thus correspond to the single continuous left absorber wall 110A of the EXAMPLE 1 embodiment, for example. Similarly, the right absorber walls, 2010B and 2010C, correspond to the single continuous right absorber wall 110B. The discontinuity between the left absorber walls, 2010A and 2010D, in the vicinity of the left shim 2051A, exposes the interior-facing surface of the left shim 2051A and portions of the conductor walls, 2000A and 2000B, to the waveguide interior region 2030. The discontinuity between the right absorber walls, 2010B and 2010C, in the vicinity of the right shim 2051B, exposes the interior-facing surface of the right shim 2051B and portions of the conductor walls, 2000A and 2000B, to the waveguide interior region 2030. Despite the altered boundary conditions due to the discontinuities and the exposed materials, the calculated waveguide wave propagation characteristics are not significantly altered by the two discontinuous left absorber walls, 2010A and 2010D, and the two discontinuous right absorber walls, 2010B and 2010C, as compared to single continuous left and right absorber walls.

The individual fabrication and process steps and equipment needed to enable the present example are well-known in the art. Persons of ordinary skill in the art would be able to produce satisfactory results from the descriptions given here without undue experimentation. Any of the previous gap-mode waveguide embodiments, including bend, twist, taper, and aperture may be constructed as variations of the present example. It would be readily apparent to one of ordinary skill in the art that certain fabrication processes and methods may be better suited to certain structures. For example, it may be easier to form a bend, twist, or taper of a gap-mode waveguide structural frame by machining or additive manufacturing than by extrusion. Gap-mode waveguide straight, bend, twist, or taper sections, or variations or guided-wave circuit components derived therefrom may be connected in various ways to form myriad circuits.

EXAMPLE 19

FIGS. 42-43B

Figure 42:
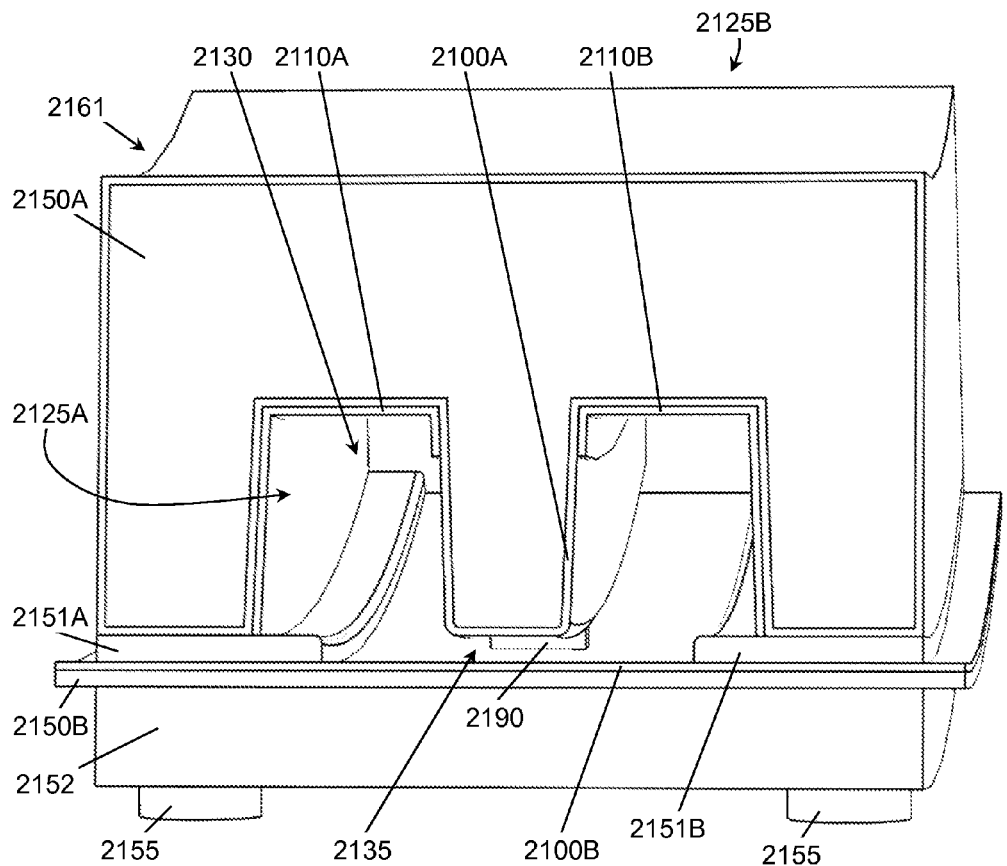
FIG. 42 is a perspective view of a gap-mode waveguide embodiment assembly having a microstrip-like gap mode and an electric-field-plane bend according to EXAMPLE 19.

This example describes a gap-mode waveguide embodiment and a method of fabrication. The EXAMPLE 19 gap-mode waveguide embodiment, illustrated in FIG. 42, is configured as an assembly and has a microstrip-like gap mode similar to that described in EXAMPLE 6. The operation described in EXAMPLE 1 may be applied to the present example. This EXAMPLE 19 gap-mode waveguide embodiment optionally incorporates an E-plane bend and integrates an auxiliary circuit in a printed circuit board lower structural frame part 2150B. A circuit substrate having a nominally planar surface, such as that of a semiconductor integrated circuit or a ceramic hybrid, could alternatively be used. Functions supported by the lower structural frame part 2150B auxiliary circuit may include those described for the partition 1532 auxiliary circuit in EXAMPLE 17 or the structural frame parts, 2050A and 2050B, in EXAMPLE 18. The present example also includes a guided-wave circuit component 2190, which may communicate with the lower structural frame part 2150B. Functions of the guided-wave circuit component 2190 may include those described for the guided-wave circuit component 1590 in EXAMPLE 17. A flange is mounted to a gap-mode waveguide embodiment to facilitate mating or joining of waveguide and other components having flange interfaces to form circuits.

Referring to FIG. 42, structural frame parts, 2150A and 2150B, are formed independently as two pieces. Conductor walls, 2100A and 2100B, absorber walls, 2110A and 2110B, and the guided-wave circuit component 2190 are applied to the structural frame parts, 2150A and 2150B, prior to assembly. Shims, 2151A and 2151B, determine the height of an interior gap 2135, in the assembly, which is fixed with a pressure plate 2152 and fasteners 2155.

The transverse exterior dimensions of the EXAMPLE 19 embodiment gap-mode waveguide are 7.4 mm high, excluding fasteners 2155, and 10 mm wide, excluding the lower conductor wall 2100B and the lower structural frame part 2150B. The lower conductor wall 2100B and the lower structural frame part 2150B may be of any width sufficient such that an interior region 2130 is essentially enclosed. An E-plane bend 2161 has a 20 mm radius of curvature at the center of the interior gap 2135 and an angle of 30 degrees.

The EXAMPLE 19 embodiment transverse dimensions of the interior region 2130, including the interior gap 2135, are approximately the same as those of the EXAMPLE 6 embodiment, except for the differences due to the two-part assembly in the vicinities of the interior facing surfaces of the shims, 2151A and 2151B; tapers of the vertical interior surfaces of the upper structural frame part 2150A; the deviations due to the thicknesses of the absorber walls, 2110A and 2110B; and the space occupied by the guided-wave circuit component 2190. The two conductor walls, 2100A and 2100B, the two absorber walls, 2110A and 2110B, and the shims, 2151A and 2151B, form the sides of the tubular waveguide, with the shims also acting as absorber walls. Ports, 2125A and 2125B, bound the ends of the waveguide and are substantially planar and orthogonal to the propagation direction. The interior gap 2135 in the interior region 2130 is formed between proximate, generally parallel, interior surface portions of the conductor walls, 2100A and 2100B. The corners of the upper conductor wall 2100A that are convex in the interior region 2130 have non-essential radii to reduce concentrations of the proximate electric field and power.

The upper structural frame part 2150A supports the upper conductor wall 2100A and the upper absorber walls, 2110A and 2110B. The lower structural frame part 2150B supports the lower conductor wall 2100B and the guided-wave circuit component 2190. The shims, 2151A and 2151B, are interposed between distal portions of the conductor walls, 2100A and 2100B. In a plane perpendicular to the propagation direction, the surfaces of the upper conductor wall 2100A bordering the shims, 2151A and 2151B, are substantially colinear with the surface of the upper conductor wall 2100A bordering the interior gap 2135, and the surfaces of the lower conductor wall 2100B bordering the shims, 2151A and 2151B, are substantially colinear with the surface of the lower conductor wall 2100B bordering the interior gap 2135.

The EXAMPLE 19 embodiment gap-mode waveguide lower structural frame part 2150B is composed of a copper-clad flexible printed-circuit board. Printed circuit board substrates are often made to have in-plane coefficient of thermal expansion matched to copper, which is commonly used as a printed circuit conductor. The EXAMPLE 19 embodiment gap-mode waveguide upper structural frame part 2150A and pressure plate 2152 are composed of copper or copper alloy.

Alternatively, any material with the prescribed mechanical characteristics, including coefficient of thermal expansion suitably matched to the lower structural frame part 2150B, may be used for the upper structural frame part 2150A and pressure plate 2152. For example, if the lower structural frame part 2150B includes a gallium arsenide or indium phosphide substrate, the upper structural frame part 2150A may be composed of an iron-nickel-cobalt alloy having a matched coefficient of thermal expansion. If the lower structural frame part 2150B includes a glass or silicon substrate, the upper structural frame part 2150A may be composed of a nickel-chromium-iron glass-sealing alloy.

The conductor walls, 2100A and 2100B, are 1-μm-thick films of gold. Alternatively, the gold films may be omitted, in which case the conductor walls, 2100A and 2100B, are composed of the copper of the structural frame parts, 2150A and 2150B. Thin native oxides of copper should not have unacceptable effects on waveguide wave propagation characteristics for some applications.

The absorber walls, 2110A and 2110B, are 0.05-mm-thick resistor coatings of polymer matrix composite containing carbon and silver particles in concentrations to make a conductivity of about $10^4$ S/m. The shims, 2151A and 2151B, are similarly composed of a polymer matrix composite containing carbon and silver particles in concentrations to make a conductivity of about $10^4$ S/m and having suitable mechanical properties such as flexibility and compressive strength. Alternatively, the absorber walls, 2110A and 2110B, and the shims, 2151A and 2151B, may be composed of any material that provides suitable mechanical and environmental properties.

The pressure plate 2152 is sufficiently thick to apply shaping force without undue flexure or distortion, as necessary to conform the structural frame part 2150B, the conductor wall 2100B, and the shims, 2151A and 2151B to the contours of the conductor wall 2100A. The interior region 2130, which includes the interior gap 2135, is nominally filled with dry air, but portions of or the entire interior region 2130 may be filled with other materials or devices.

The upper structural frame part 2150A and pressure plate 2152 are initially formed by rolling, and then machined to specified tolerances, as necessary. The tapers of the vertical interior surfaces of the upper structural frame part 2150A provide draft or clearance for the rolling operation. The shims, 2151A and 2151B, are molded. Alternatively, the shims, 2151A and 2151B, may be extruded.

The lower structural frame part 2150B is initially formed in a printed-circuit board fabrication process. The lower structural frame part 2150B includes a suitable region of copper cladding on at least one surface, on which the lower conductor wall 2100B may be deposited in a later step. The surfaces of the structural frame parts, 2150A and 2150B, bordering the interior gap 2135 are polished so that the root-mean-square surface roughness is 0.02 μm or less, which is less than the skin depth of gold at 2 THz. The conductor walls, 2100A and 2100B, are electroplated onto the structural frame parts, 2150A and 2150B. The absorber walls, 2110A and 2110B, are applied as dry films in specified regions over the conductor walls, 2100A and 2100B, and then cured. The guided-wave circuit component 2190 is connected to the auxiliary circuit in the lower structural frame part 2150B by a conductive epoxy attach process. Alternatively, soldering, thermosonic bonding, brazing, welding, or other process known in the art to make circuit connection may be used.

The upper subassembly, comprising the upper structural frame part 2150A with upper conductor wall 2100A and upper absorber walls, 2110A and 2110B, and the lower subassembly, comprising the lower structural frame part 2150B with lower conductor wall 2100B, are then assembled with the shims, 2151A and 2151B, and pressure plate 2152. The shims, 2151A and 2151B, are sized and positioned so that they are interposed between and abut distal portions of the conductor walls, 2100A and 2100B, and extend about 0.75 mm into the interior region 2130. The lower subassembly, 2100B and 2150B, and the shims, 2151A and 2151B, may each be substantially flat prior to assembly and then bend to conform to the curves of the upper conductor wall 2100A and pressure plate 2152 upon assembly. Uncured conductive epoxy is applied to the top contact of the guided-wave circuit component 2190 prior to assembly in order to make a connection to the upper conductor wall 2100A. Other methods of making contact are possible, such as spring pressure contact, sliding contact, or socket contact.

After alignment, the assembly is fixed by machine screw fasteners 2155, which pass through clearance holes in the pressure plate 2152, lower structural frame part 2150B, lower conductor wall 2100B, and shims, 2151A and 2151B, and screw into threaded holes in the upper conductor wall 2100A and upper structural frame part 2150A. Other possible methods for fixing the assembly would be readily apparent to one of ordinary skill in the art, including rivetting, clamping, gluing, brazing, welding, thermal bonding, ultrasonic bonding, thermosonic bonding, diffusion bonding, or any fixing method or combination thereof known in the art that is suitable for the materials employed. After assembly, the conductive epoxy is cured.

Figure 43A:
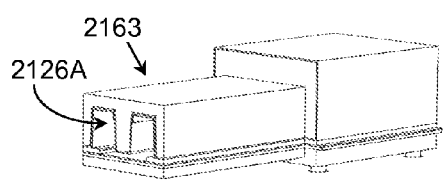
FIG. 43A is a perspective view of a straight gap-mode waveguide assembly embodiment prepared for mounting of a flange according to EXAMPLE 19.
Figure 43B:
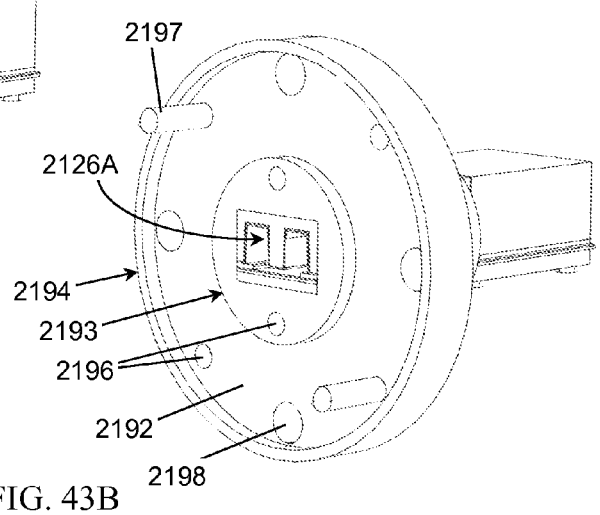
FIG. 43B is a perspective view of a flange mounted to a straight gap-mode waveguide assembly embodiment according to EXAMPLE 19.

Referring to FIG. 43A, a section near a port 2126A of a straight gap-mode waveguide assembly embodiment is prepared for through-mounting of a flange by incorporating a flange-fit section 2163. Reference surfaces of the flange-fit section 2163 facilitate a precision alignment and fit in a waveguide flange 2192. Epoxy adhesive is applied to the flange-fit section 2163. The flange-fit section 2163 is then inserted into the waveguide flange 2192 as shown in FIG.

43B, and the epoxy is cured. Other methods of attaching the waveguide flange 2192 to the flange-fit section 2163 may alternatively be employed, such as fastening, clamping, gluing, brazing, welding, thermal bonding, ultrasonic bonding, thermosonic bonding, diffusion bonding, or any fixing method or combination thereof known in the art that is suitable for the materials employed.

After assembly, the port 2126A, a flange face 2193, and a flange rim 2194 are machined substantially coplanar and orthogonal to the propagation direction. Alignment pins 2197 are then press-fit into one or more of six alignment pin holes 2196.

The mounted flange-waveguide or connectorized waveguide may be mated, joined, or connected to another similar flange by aligning and engaging the alignment pins 2197 and the alignment pin holes 2196 with the complementary features of the similar mounted flange-waveguide. Generally, two alignment pins mating with holes provide for alignment of a joint as the tolerances allow. The flanges are secured to each other by fastening them together through at least two of the four fastener holes 2198. In this manner, discrete sections of gap-mode waveguide and other components having flange interfaces may be mated, joined, or connected to form combined paths defining circuits or portions thereof.

The individual fabrication and process steps and equipment needed to enable the present example are well-known in the art. Persons of ordinary skill in the art would be able to produce satisfactory results from the descriptions given here without undue experimentation. Any of the previous gap-mode waveguide embodiments, including straight, twist, taper, and aperture may be constructed as variations of the present example. It would be readily apparent to one of ordinary skill in the art that certain fabrication processes and methods may be better suited to certain structures. For example, it may be easier to form a taper of a gap-mode waveguide structural frame by machining or additive manufacturing than by rolling. Gap-mode waveguide straight, bend, twist, or taper sections, or variations or guided-wave circuit components derived therefrom may be connected in various ways to form myriad circuits.

EXAMPLE 20

FIGS. 44A-45

This example describes gap-mode waveguide circuit embodiments for communications and measurements. Communications components, including transmitters/sources, receivers/detectors, directional discriminators, filters, switches, attenuators, transmission lines, amplifiers, oscillators, modulators, mixers, frequency converters, or optical-electrical converters may be connected using gap-mode waveguides to form communications or measurement circuits or systems.

Figure 44A:
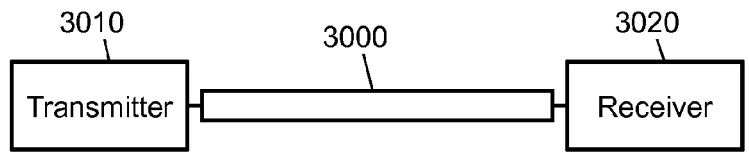
FIG. 44A is a block diagram of a communication link embodiment according to EXAMPLE 20.

In the block diagram of FIG. 44A, a source or transmitter 3010 is connected to a detector or receiver 3020 by a gap-mode waveguide 3000, forming a communication link embodiment. The a transmitter 3010 is capable of connecting with the gap-mode waveguide 3000 and launching power into a gap mode. Similarly, the receiver is capable of connecting with the gap-mode waveguide 3000 and receiving power from a gap mode. In operation, a signal from the transmitter 3010 is launched into a gap-mode wave of the gap-mode waveguide 3000. The gap-mode wave propagates through the gap-mode waveguide 3000 to the receiver 3020, which receives the gap-mode wave.

Figure 44B:
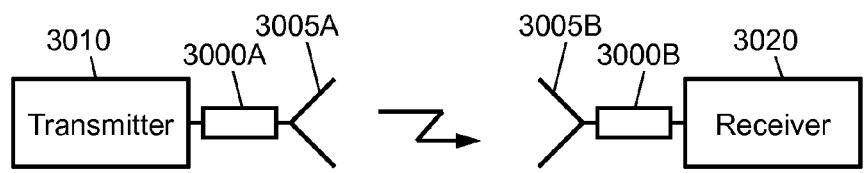
FIG. 44B is a block diagram of a communication link embodiment including antennas according to EXAMPLE 20.

FIG. 44B shows a block diagram of a variation of the communication link embodiment where the path between the transmitter 3010 and the receiver 3020 includes a portion mediated by antennas. A transmitter antenna 3005A is capable of connecting with a gap-mode waveguide 3000A and transforming from a gap mode to a free-space mode. A receiver antenna 3005B is capable of connecting with a gap-mode waveguide 3000B and transforming from a free-space mode to a gap mode. The transmitter antenna 3005A is connected to the transmitter 3010 through a gap-mode waveguide 3000A. The receiver antenna 3005B is connected to the receiver 3020 through a gap-mode waveguide 3000B. In operation, the transmitter antenna 3005A and the receiver antenna 3005B are arranged so that the receiver antenna 3005B receives a signal transmitted by the transmitter antenna 3005A. Thus, a signal from the transmitter 3010 propagates through the path to the receiver 3020.

Figure 45:
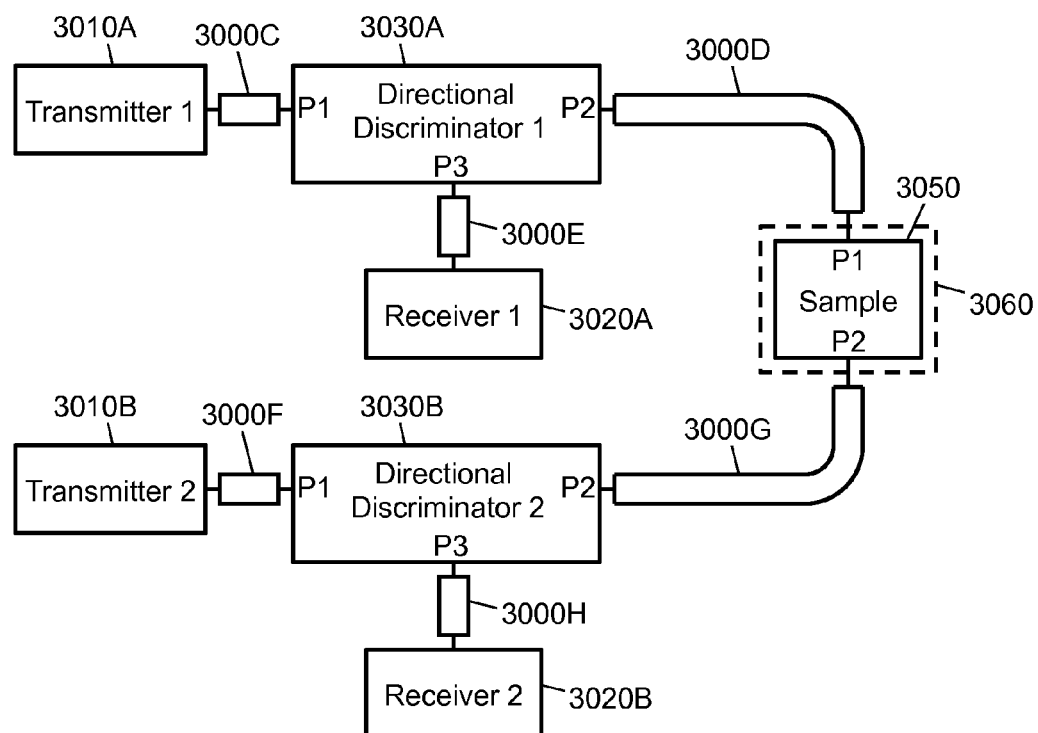
FIG. 45 is a block diagram of a sample measurement system embodiment according to EXAMPLE 20.

FIG. 45 is a block diagram of a measurement circuit embodiment for characterizing transmission and reflection properties of a sample. The measurement circuit or portions thereof may be used to perform functions of a network analyzer or vector network analyzer. A transmitter 1 3010A is connected to a port 1 of a directional discriminator 1 3030A through a gap-mode waveguide 3000C. A receiver 1 3020A is connected to a port 3 of the directional discriminator 1 3030A through a gap-mode waveguide 3000E.

An optional sample holder 3060 positions a sample 3050 for exposure to a port 1 stimulus signal coming from the transmitter 1 3010A, through the directional discriminator 1 3030A, through a gap-mode waveguide 3000D, and incident at port 1 of the sample 3050. A port 1 reflected response signal and a port 2 transmitted response signal generally result from interaction of the port 1 stimulus signal with the sample 3050. (Port numbers refer to those of the sample 3050 unless explicitly stated otherwise.) The optional sample holder 3060 also positions the sample 3050 so that the port 1 reflected response signal propagates toward the receiver 1 3020A through the gap-mode waveguide 3000D, the directional discriminator 1 3030A, and the gap-mode waveguide 3000E. The optional sample holder 3060 further positions the sample 3050 so that the port 2 transmitted response signal propagates toward a receiver 2 3020B through a gap-mode waveguide 3000G, a directional discriminator 2 3030B, and a gap-mode waveguide 3000H.

The purposes of the directional discriminator 1 3030A and the directional discriminator 2 3030B are to separate the stimulus and response signals, direct the stimulus signals toward the sample 3050, and direct the response signals toward the receiver 1 3020A and the receiver 2 3020B, as described. The directional discriminator 1 3030A and the directional discriminator 2 3030B support port 1 and port 2 reflection measurements and full two-port function. A directional coupler, a bridge, a Wilkinson divider, a circulator, an angled partial reflector, or any device or circuit that discriminates signals according to their propagation direction may serve as the directional discriminator 1 3030A or the directional discriminator 2 3030B. An interior sample measurement chamber, similar to that described in EXAMPLE 17, may serve as the optional sample holder 3060. The sample 3050 may be an unknown material or device or it may be a known material or device serving as a reference or in calibrating measurements.

A transmitter 2 3010B is connected to a port 1 of the directional discriminator 2 3030B through a gap-mode waveguide 3000F. The receiver 2 3020B is connected to a port 3 of the directional discriminator 2 3030B through the gap-mode waveguide 3000H. The measurement circuit embodiment is symmetrical in function so that full two-port transmission and reflection measurements may be executed in a single configuration of the measurement circuit and sample 3050.

The measurement circuit embodiment illustrated in FIG. 45 may be scaled down for one-port measurements or up for multi-port measurements by removing or adding branches connecting to ports of the sample 3050, where a branch is comprised of a transmitter or source, a receiver, and a directional discriminator. Reference receivers or other functions facilitating calibration and accurate characterization may added. The path between the directional discriminator 1 3030A and the sample 3050 or between another directional discriminator and the sample 3050 may include a portion mediated by antennas, similar to the communication link embodiment path illustrated in FIG. 44B and described above, so that the sample 3050, held by an appropriate optional sample holder 3060, may be measured by a free-space mode.

The measurement circuit embodiment variations discussed here may be effectively employed as communication circuits having transceivers and where the sample 3050 is part of the path. The block components in this example, including: the antennas, 3005A and 3005B; transmitters, 3010, 3010A, and 3010B; receivers, 3020, 3020A, and 3020B; directional discriminators, 3030A and 3030B; sample 3050; and optional sample holder 3060; may be adapted to mate or join with a gap-mode waveguide flange, such as flange 2192, so that they may be readily assembled in various ways and disassembled. A kit including one or more of such components and at least one gap-mode waveguide 3000 may provide for assembly of communications and measurements gap-mode waveguide circuit embodiments or portions thereof.

INDUSTRIAL APPLICABILITY

The above disclosure and embodiments describe a type of waveguide, gap-mode waveguide, that provides previously unrealized characteristics for terahertz waveguides and circuits. Various other gap-mode waveguide geometries may be conceived using the insight and guidance revealed herein. For example, gap-mode waveguides may be derived from multi-conductor transmission line embodiments, with the gap modes resembling the TEM modes, including gap-mode waveguide embodiments having multiple gap modes and various gap-mode principal electric-field polarizations.

Gap-mode waveguide embodiments, including waveguide straight sections, bends, twists, tapers, apertures provide solutions for building practical broadband terahertz guided-wave circuits. Gap-mode waveguides may also interface with other types of waveguides. For example, a gap mode waveguide may directly connect to a waveguide of the same cross-sectional geometry but lacking an absorber, or a gap-mode waveguide may connect to a waveguide of different cross-sectional geometry through a transition.

A gap-mode waveguide may form an antenna by an appropriate taper to an open port. Such an antenna may include a lens. The antenna may have radiation pattern ranging from broad, as may be used for a broadcast function, to focussed as may be used in a scanning or near-field scanning function. The antenna may be used for transmitting, receiving, or both as part of a communications, measurement, or warfare circuit or system.

Terahertz circuits incorporating gap-mode waveguide embodiments may be used in measurement, communications, or processing systems, among others, exploiting physical phenomena in the terahertz range. Physical phenomena, including molecular rotational transitions, vibrational modes of organic molecules, phonons in solids, semiconductor intraband transitions, and superconductor interband transitions, may have responses to electromagnetic stimulus in the terahertz frequency range. Such responses may be unique to a particular material or device, and they may be designed or manipulated as a property of a material or device. Physical responses to other stimuli may be obtained in combination with terahertz responses by incorporating transmitters/sources and receivers/detectors for other forms of energy, such as infrared, visible, or ultraviolet light, x-rays, or radiation, having a path through a gap-mode waveguide.

Terahertz measurement circuits or systems using gap-mode waveguide circuits may quantify a linear or nonlinear temporal or complex spectral response of a material or device in the terahertz frequency range, for example as in terahertz oscilloscopes, spectrum analyzers, and network analyzers. Applications of gap-mode waveguide include circuits for identification or characterization of materials or devices in chemical, materials, medical, biotechnology, agriculture, food, electronics, computing, communications, radio astronomy, physics, reconnaissance, security, radar, and defense industries. Gap-mode waveguide embodiments may be used to build transmitter and receiver circuits in guided or unguided terahertz communications systems in addition to providing the channel in guided systems. Gap-mode waveguide circuits may also be used in terahertz-modulated lightwave-carrier systems. Terahertz waves may alter or process materials by exciting specific modes or transitions to cause changes in molecular structure or some types of bonds. A gap-mode waveguide circuit may provide needed wave intensity and control for such processing.

Gap-mode waveguide embodiments, in general, may be used for new applications and in extending the frequency range of applications currently deployed in the microwave, millimeter-wave, and far infrared regions of the spectrum. Gap-mode waveguide may enable better performing, transducers, transmitters/sources, receivers/detectors, and nonlinear transmission line circuits. Gap-mode waveguide embodiments may connect with microwave and millimeter-wave waveguides and devices or with optoelectronic devices or other transducers through appropriate tapers and transitions between the gap-mode and the microwave or millimeter-wave waveguide mode. Similarly, gap-mode waveguide embodiments may be connected to interfacial devices, such as connectors, probes, or antennas.

The above disclosure is sufficient to enable one of ordinary skill in the art to practice the invention, and provides the best mode of practicing the invention presently contemplated by the inventor. Various modifications, alternative constructions, changes, and equivalents will readily occur to those skilled in the art and may be employed, as suitable, without departing from the spirit and scope of the invention. Such changes might involve alternative materials, components, structural configurations, sizes, shapes, forms, symmetries, asymmetries, functions, or operational features, for example. Accordingly, the scope of protection is not limited by the description set out above, but is limited only by the claims which follow, that scope including all equivalents of the claims. Any element in a claim that does not explicitly state "means for" performing a specified function, or "step for" performing a specific function, is not to be interpreted as a "means" or "step" clause as specified in 35 USC §112, ¶6.

I claim:

1. A conductive tubular electromagnetic waveguide comprising:
    an interior gap, and
    an absorber configured in such a way that a gap mode propagates with lesser attenuation than do all other propagating modes at a frequency greater than one-and-one-half times the multimode cutoff frequency.

2. A conductive tubular electromagnetic waveguide comprising:
    a conductor wall;
    an interior gap between proximate interior surface portions of said conductor wall; and
    an absorber configured in such a way that a gap mode propagates with lesser attenuation than do all other propagating modes at a frequency greater than two times the multimode cutoff frequency.

3. The waveguide of claim 2, wherein said gap mode propagates with lesser attenuation than do all other propagating modes at each frequency in a multimode frequency range greater than one octave.

4. The waveguide of claim 2, wherein the conductivity of said conductor wall is greater than $10^6$ Siemens/meter.

5. The waveguide of claim 2, wherein said conductor wall includes a portion transparent to light in a subrange of the range including infrared, visible, and ultraviolet light.

6. The waveguide of claim 2, wherein the conductivity of said absorber is in the range of $10^2$ to $10^5$ Siemens/meter.

7. The waveguide of claim 2, wherein the conductivity of said absorber is less than $10^{-2}$ times the conductivity of said conductor wall.

8. The waveguide of claim 2, wherein said absorber comprises an absorber wall.

9. The waveguide of claim 8, wherein the conductivity of said absorber wall is anisotropic.

10. The waveguide of claim 8, wherein said absorber wall includes a portion transparent to light in a subrange of the range including infrared, visible, and ultraviolet light.

11. The waveguide of claim 8, wherein said absorber wall comprises a semiconductor material.

12. The waveguide of claim 8, further comprising an aperture placed in said absorber wall.

13. The waveguide of claim 2, wherein said absorber comprises a discrete absorber.

14. The waveguide of claim 2, further comprising a guided-wave circuit component coupled to said waveguide.

15. The waveguide of claim 2, wherein:
    said conductor wall comprises two conductor walls, and
    said absorber comprises two absorber walls.

16. The waveguide of claim 2, wherein said gap mode comprises two gap modes.

17. The waveguide of claim 2, further comprising a structural frame.

18. The waveguide of claim 17, wherein said structural frame includes an auxiliary circuit.

19. The waveguide of claim 17, further comprising a guided-wave circuit component connected to said structural frame.

20. The waveguide of claim 2, further comprising a bend.

21. The waveguide of claim 2, further comprising a twist.

22. The waveguide of claim 2, further comprising a taper.

23. The waveguide of claim 2, further comprising a side taper adjacent to said interior gap.

24. The waveguide of claim 2, further comprising an aperture.

25. The waveguide of claim 2, further comprising a partition.

26. The waveguide of claim 25, wherein said partition includes an auxiliary circuit.

27. The waveguide of claim 25, further comprising a guided-wave circuit component coupled to said partition.

28. An integrated system comprising:
    the waveguide of claim 2, and
    a guided-wave circuit component coupled to said waveguide.

29. The waveguide of claim 2, further comprising:
    a port, and
    a flange mounted at said port.

30. A kit comprising:
    the waveguide of claim 29, and
    at least one of:
        an antenna adapted to mate with said flange,
        a transmitter adapted to mate with said flange,
        a receiver adapted to mate with said flange,
        a directional discriminator adapted to mate with said flange,
        a sample adapted to mate with said flange, and
        a sample holder adapted to mate with said flange.

31. A ridge waveguide comprising an absorber configured in such a way that a dominant mode propagates with lesser attenuation than do all other propagating modes at a frequency greater than two times the multimode cutoff frequency.

32. A method for propagating a dominant mode in a conductive tubular electromagnetic waveguide, the method comprising:
    condensing a gap mode, and
    absorbing electromagnetic energy away from said gap mode in such a way that said gap mode propagates with lesser attenuation than do all other propagating modes at a frequency greater than two times the multimode cutoff frequency.

33. The method of claim 32, wherein said gap mode propagates with lesser attenuation than do all other propagating modes at each frequency in a multimode frequency range greater than one octave.

34. A method for propagating a dominant mode in a ridge waveguide, the method comprising absorbing electromagnetic energy away from said dominant mode in such a way that said dominant mode propagates with lesser attenuation than do all other propagating modes at a frequency greater than two times the multimode cutoff frequency.

35. A method for propagating a dominant mode in a lossy conductive tubular electromagnetic waveguide, the method comprising:
    condensing a gap mode in such a way that said gap mode propagates with lesser attenuation than do all other propagating modes at a frequency greater than two times the multimode cutoff frequency.

* * * * *